(12) United States Patent
Jang

(10) Patent No.: US 9,159,449 B2
(45) Date of Patent: Oct. 13, 2015

(54) SHIFT REGISTER

(71) Applicant: LG DISPLAY CO., LTD., Seoul (KR)

(72) Inventor: Yong-Ho Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/135,369

(22) Filed: Dec. 19, 2013

(65) Prior Publication Data

US 2014/0185737 A1   Jul. 3, 2014

(30) Foreign Application Priority Data

Dec. 28, 2012   (KR) .................. 10-2012-0155684

(51) Int. Cl.
  *G11C 19/28*   (2006.01)
(52) U.S. Cl.
  CPC ...................................... *G11C 19/28* (2013.01)
(58) Field of Classification Search
  CPC ................................ G11C 19/00; G11C 19/28
  USPC .................................. 377/64, 77, 78; 345/100
  See application file for complete search history.

(56) References Cited

U.S. PATENT DOCUMENTS

| | | | | |
|---|---|---|---|---|
| 8,724,771 B2* | 5/2014 | Jang | .................. | 377/64 |
| 8,817,943 B2* | 8/2014 | Jang | .................. | 377/64 |
| 8,842,803 B2* | 9/2014 | Jang | .................. | 377/64 |
| 2007/0008268 A1 | 1/2007 | Park et al. | | |
| 2010/0156858 A1 | 6/2010 | Moon et al. | | |
| 2011/0002438 A1 | 1/2011 | Kim | | |
| 2012/0212275 A1 | 8/2012 | Jang et al. | | |
| 2012/0212517 A1 | 8/2012 | Ahn | | |
| 2014/0241488 A1* | 8/2014 | Jang | .................. | 377/64 |

FOREIGN PATENT DOCUMENTS

| | | |
|---|---|---|
| CN | 1885396 A | 12/2006 |
| CN | 102456330 A | 5/2012 |
| CN | 102646391 A | 8/2012 |
| GB | 2484781 A | 4/2012 |
| KR | 10-2012-0096390 A | 8/2012 |

* cited by examiner

*Primary Examiner* — Patrick O'Neill
(74) *Attorney, Agent, or Firm* — Birch, Stewart, Kolasch & Birch, LLP

(57) ABSTRACT

A shift register includes a plurality of stages each for outputting k composite pulses each including an A-scan pulse and a B-scan pulse. At least one stage includes k A-sub-stages each for controlling a voltage at an A-set node and a voltage at least one A-reset node in response to an external A-control signal and generating an A-carry pulse based on the voltage at the A-set node, the voltage at the at least one A-reset node and any one A-clock pulse, a B-sub-stage for controlling a voltage at a B-set node and a voltage at least one B-reset node in response to an external B-control signal and generating a B-carry pulse, and a scan output controller for generating k A-scan pulses and k B-scan pulses and outputting one of the A-scan pulses and one of the B-scan pulses corresponding to each other as one composite pulse.

57 Claims, 41 Drawing Sheets

FIG. 16
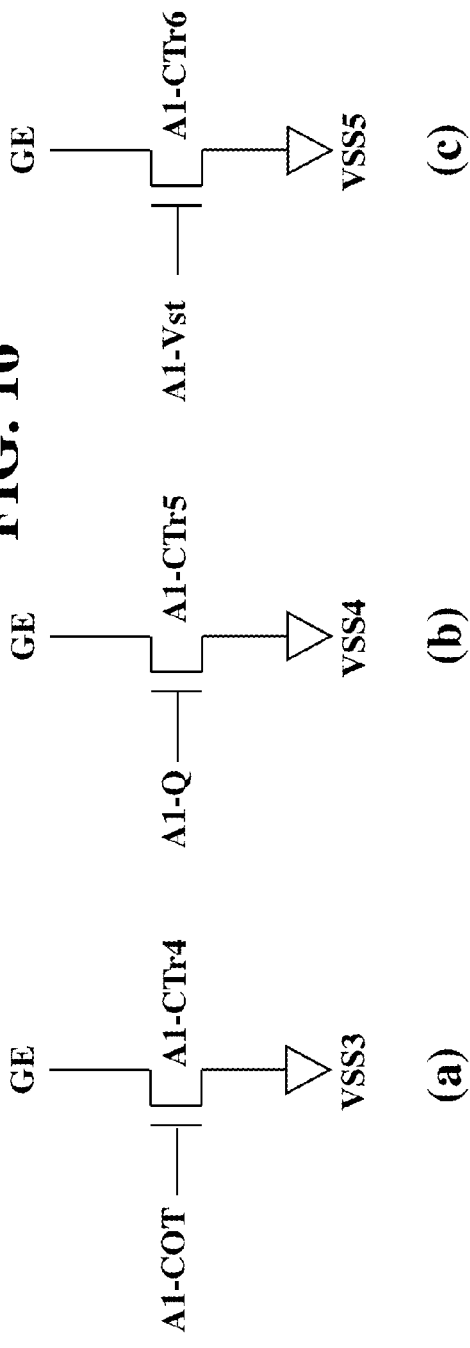
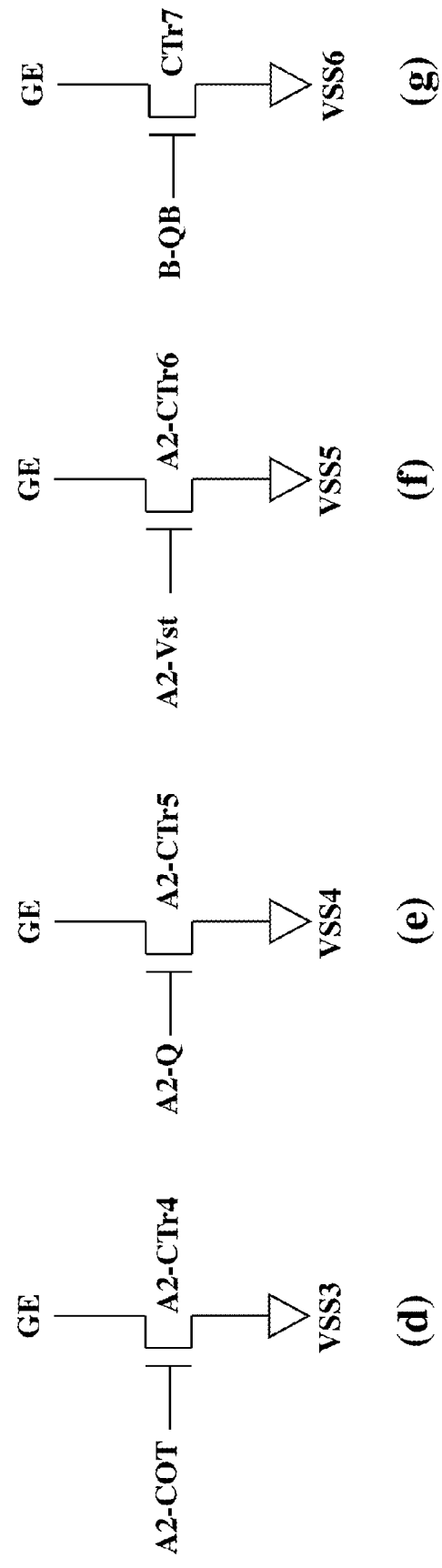

SHIFT REGISTER

This application claims the benefit of Korean Patent Application No. 10-2012-0155684 filed on Dec. 28, 2012, which is hereby incorporated by reference as if fully set forth herein.

BACKGROUND OF THE INVENTION

1. Field of the Invention

The present invention relates to a shift register, and more particularly, to a shift register which is capable of stably outputting a scan pulse of a composite waveform in an organic light emitting diode display device.

2. Discussion of the Related Art

In an organic light emitting diode display device, there may be deviations among driving currents applied to respective pixels, and a number of transistors are integrated inside of each pixel to prevent such deviations.

This display device includes a shift register for sequentially generating a number of control signals to drive the transistors.

Such a conventional shift register employs a multiplexer structure to output a scan pulse of a composite waveform which consists of two waveforms having different widths and timings.

This structure generates the scan pulse of the composite waveform by switching a fixed, constant voltage externally provided. In this regard, stably outputting the scan pulse may involve increasing the sizes of output transistors which switch the scan pulse, resulting in an increase in the size of the display device.

SUMMARY OF THE INVENTION

Accordingly, the present invention is directed to a shift register that substantially obviates one or more problems due to limitations and disadvantages of the related art.

An object of the present invention is to provide a shift register in which a set node is bootstrapped using clock pulses and a floating structure, so that scan pulses of a plurality of composite waveforms (each including an A-scan pulse and a B-scan pulse) can be stably output even if the clock pulses have relatively low voltages, thereby making it possible to make the sizes of scan output switching devices relatively small.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages, each of the stages outputting k composite pulses (where k is a natural number greater than 1), each of the composite pulses including an A-scan pulse and a B-scan pulse, wherein at least one of the stages includes k A-sub-stages, each of the A-sub-stages controlling a voltage at an A-set node and a voltage at at least one A-reset node in response to an external A-control signal and generating an A-carry pulse based on the voltage at the A-set node, the voltage at the at least one A-reset node and any one A-clock pulse, a B-sub-stage for controlling a voltage at a B-set node and a voltage at at least one B-reset node in response to an external B-control signal and generating a B-carry pulse based on the voltage at the B-set node, the voltage at the at least one B-reset node and any one B-clock pulse, and a scan output controller for generating k A-scan pulses based on the voltages at the respective A-set nodes of the A-sub-stages and the A-clock pulses supplied respectively to the A-sub-stages, generating k B-scan pulses based on the B-carry pulse and k BA-clock pulses, and outputting one of the A-scan pulses and one of the B-scan pulses corresponding to each other as a corresponding one of the composite pulses.

Here, k may be 2, the A-sub-stages may be divided into an A1-sub-stage and an A2-sub-stage, the A-set nodes may be divided into an A1-set node connected to the A1-sub-stage and an A2-set node connected to the A2-sub-stage, the A-reset nodes may be divided into at least one A1-reset node connected to the A1-sub-stage and at least one A2-reset node connected to the A2-sub-stage, the A-clock pulses may be divided into a plurality of A1-clock pulses having different phases and a plurality of A2-clock pulses having different phases, any one of the A1-clock pulses may be supplied to the A1-sub-stage and the scan output controller, any one of the A2-clock pulses may be supplied to the A2-sub-stage and the scan output controller, the BA-clock pulses may be divided into a BA1-clock pulse and a BA2-clock pulse, the A-scan pulses may be divided into an A1-scan pulse and an A2-scan pulse, the B-scan pulses may be divided into a B1-scan pulse and a B2-scan pulse, the A-carry pulses may be divided into an A1-carry pulse output through an A1-carry output terminal of the A1-sub-stage and an A2-carry pulse output through an A2-carry output terminal of the A2-sub-stage, the B-sub-stage may output the B-carry pulse through a B-carry output terminal, the scan output controller may generate the A1-scan pulse based on a voltage at the A1-set node and the A1-clock pulse, generate the B1-scan pulse based on the B-carry pulse and the BA1-clock pulse, output the A1-scan pulse and the B1-scan pulse as a first one of the composite pulses, generate the A2-scan pulse based on a voltage at the A2-set node and the A2-clock pulse, generate the B2-scan pulse based on the B-carry pulse and the BA2-clock pulse, and output the A2-scan pulse and the B2-scan pulse as a second one of the composite pulses, and the at least one stage may output the first composite pulse from the scan output controller through a first scan output terminal and output the second composite pulse from the scan output controller through a second scan output terminal.

The scan output controller may include an A1-scan output switching device controlled by the voltage at the A1-set node and connected between an A1-clock transfer line, the A1-clock transfer line transferring the A1-clock pulse, and the first scan output terminal, a B1-scan output switching device controlled by the B-carry pulse and connected between the first scan output terminal and a BA1-clock transfer line, the BA1-clock transfer line transferring the BA1-clock pulse, an A2-scan output switching device controlled by the voltage at the A2-set node and connected between an A2-clock transfer line, the A2-clock transfer line transferring the A2-clock pulse, and the second scan output terminal, and a B2-scan output switching device controlled by the B-carry pulse and connected between the second scan output terminal and a BA2-clock transfer line, the BA2-clock transfer line transferring the BA2-clock pulse.

The scan output controller may further include an A1-scan discharge switching device controlled by a voltage at the A1-reset node and connected between the first scan output terminal and a first discharging voltage line, the first discharging voltage line transferring a first discharging voltage, a first A1-control switching device controlled by the B-carry pulse and connected between the A1-reset node and a second discharging voltage line, the second discharging voltage line transferring a second discharging voltage, an A2-scan discharge switching device controlled by a voltage at the A2-reset node and connected between the second scan output terminal and the first discharging voltage line, and a first A2-control switching device controlled by the B-carry pulse and connected between the A2-reset node and the second discharging voltage line.

Alternatively, the scan output controller may further include an A1-scan discharge switching device controlled by a voltage at the A1-reset node and connected between the first scan output terminal and a first discharging voltage line, the first discharging voltage line transferring a first discharging voltage, a first A1-control switching device controlled by a voltage at the first scan output terminal and connected between the A1-reset node and a second discharging voltage line, the second discharging voltage line transferring a second discharging voltage, an A2-scan discharge switching device controlled by a voltage at the A2-reset node and connected between the second scan output terminal and the first discharging voltage line, and a first A2-control switching device controlled by a voltage at the second scan output terminal and connected between the A2-reset node and the second discharging voltage line.

The scan output controller may further include a second control switching device controlled by the B-carry pulse output through the B-carry output terminal and connected between the B-carry output terminal and a gate electrode of the B1-scan output switching device.

Alternatively, the scan output controller may further include a second A1-control switching device controlled by the B-carry pulse and connected between the B-carry output terminal and a gate electrode of the B1-scan output switching device, and a second A2-control switching device controlled by the B-carry pulse and connected between the B-carry output terminal and a gate electrode of the B2-scan output switching device.

The scan output controller may further include a third control switching device controlled by an external switching control signal and connected between the B-carry output terminal and a gate electrode of the B1-scan output switching device.

The switching control signal may be any one of a direct current (DC) voltage and an alternating current (AC) voltage.

The AC voltage may be output synchronously with the B-clock pulse and have a pulse width equal to or different from that of the B-clock pulse.

Alternatively, the scan output controller may further include a third A1-control switching device controlled by an external switching control signal and connected between the B-carry output terminal and a gate electrode of the B1-scan output switching device, and a third A2-control switching device controlled by the switching control signal and connected between the B-carry output terminal and a gate electrode of the B2-scan output switching device.

The scan output controller may further include at least one of a fourth A1-control switching device controlled by the A1-carry pulse from the A1-sub-stage and connected between the gate electrode of the B1-scan output switching device and a third discharging voltage line, the third discharging voltage line transferring a third discharging voltage, a fifth A1-control switching device controlled by the voltage at the A1-set node and connected between the gate electrode of the B1-scan output switching device and a fourth discharging voltage line, the fourth discharging voltage line transferring a fourth discharging voltage, a sixth A1-control switching device controlled by an A1-start pulse and connected between the gate electrode of the B1-scan output switching device and a fifth discharging voltage line, the fifth discharging voltage line transferring a fifth discharging voltage, a fourth A2-control switching device controlled by the A2-carry pulse from the A2-sub-stage and connected between the gate electrode of the B2-scan output switching device and the third discharging voltage line, a fifth A2-control switching device controlled by the voltage at the A2-set node and connected between the gate electrode of the B2-scan output switching device and the fourth discharging voltage line, a sixth A2-control switching device controlled by an A2-start pulse and connected between the gate electrode of the B2-scan output switching device and the fifth discharging voltage line, a seventh A1-control switching device controlled by the voltage at the B-reset node and connected between the gate electrode of the B1-scan output switching device and a sixth discharging voltage line, the sixth discharging voltage line transferring a sixth discharging voltage, and a seventh A2-control switching device controlled by the voltage at the B-reset node and connected between the gate electrode of the B2-scan output switching device and the sixth discharging voltage line.

As another alternative, the scan output controller may further include an A1-scan discharge switching device controlled by a voltage at the A1-reset node and connected between the first scan output terminal and a first discharging voltage line, the first discharging voltage line transferring a first discharging voltage, a first A1-control switching device controlled by the B-carry pulse and connected between the A1-reset node and a second discharging voltage line, the second discharging voltage line transferring a second discharging voltage, a second A1-control switching device controlled by the B-carry pulse and connected between the B-carry output terminal and a gate electrode of the B1-scan output switching device, a seventh A1-control switching device controlled by the voltage at the B-reset node and connected between the gate electrode of the B1-scan output switching device and a sixth discharging voltage line, the sixth discharging voltage line transferring a sixth discharging voltage, an A2-scan discharge switching device controlled by a voltage at the A2-reset node and connected between the second scan output terminal and the first discharging voltage line, a first A2-control switching device controlled by the B-carry pulse and connected between the A2-reset node and the second discharging voltage line, a second A2-control switching device controlled by the B-carry pulse and connected between the B-carry output terminal and a gate electrode of the B2-scan output switching device, and a seventh A2-control switching device controlled by the voltage at the B-reset node and connected between the gate electrode of the B2-scan output switching device and the sixth discharging voltage line.

As another alternative, the scan output controller may further include an A1-scan discharge switching device controlled by a voltage at the A1-reset node and connected between the first scan output terminal and a first discharging voltage line, the first discharging voltage line transferring a first discharging voltage, a first A1-control switching device controlled by a voltage applied to a gate electrode of the B1-scan output switching device and connected between the A1-reset node and a second discharging voltage line, the second discharging voltage line transferring a second discharging voltage, a third A1-control switching device controlled by an external switching control signal and connected between the B-carry output terminal and the gate electrode of the B1-scan output switching device, a seventh A1-control switching device controlled by the voltage at the B-reset node and connected between the gate electrode of the B1-scan output switching device and a sixth discharging voltage line, the sixth discharging voltage line transferring a sixth discharging voltage, an A2-scan discharge switching device controlled by a voltage at the A2-reset node and connected between the second scan output terminal and the first discharging voltage line, a first A2-control switching device controlled by the voltage applied to the gate electrode of the B1-scan output switching device and connected between the A2-reset node and the second discharging voltage line, a third A2-control switching device controlled by the switching control signal and connected between the gate electrode of the B1-scan output switching device and a gate electrode of the B2-scan output switching device, and a seventh A2-control switching device controlled by the voltage at the B-reset node and connected between the gate electrode of the B2-scan output switching device and the sixth discharging voltage line.

The scan output controller may further include at least one of an eighth A1-control switching device controlled by the B-carry pulse and connected between the A1-set node and a seventh discharging voltage line, the seventh discharging voltage line transferring a seventh discharging voltage, an eighth A2-control switching device controlled by the B-carry pulse and connected between the A2-set node and the seventh discharging voltage line, and a ninth control switching device controlled by any one of the A1-carry pulse and the A2-carry pulse and connected between the B-carry output terminal of the B-sub-stage and the seventh discharging voltage line.

The A1-clock pulse may be of two or more phases, the A2-clock pulse may be of two or more phases, the B-clock pulse may be of two or more phases, the BA1-clock pulse may be of one or more phases, and the BA2-clock pulse may be of one or more phases, wherein the B-clock pulse may have a period longer than that of each of the A1-clock pulse and A2-clock pulse, wherein the A1-clock pulse, the A2-clock pulse, the B-clock pulse, the BA1-clock pulse and the BA2-clock pulse may have the same pulse widths or at least two of the A1-clock pulse, the A2-clock pulse, the B-clock pulse, the BA1-clock pulse and the BA2-clock pulse may have different pulse widths.

The A1-clock pulse and the A2-clock pulse may be kept low while the B-clock pulse is kept high.

The A-control signal may include an A1-set control signal, an A1-reset control signal, an A2-set control signal and an A2-reset control signal, wherein the A1-sub-stage of the at least one stage may include a first A1-switching device controlled by the A1-set control signal and connected between a charging voltage line, the charging voltage line transferring a charging voltage, and the A1-set node, a second A1-switching device controlled by the A1-reset control signal and connected between the A1-set node and an eighth discharging voltage line, the eighth discharging voltage line transferring an eighth discharging voltage, an A1-inverter for controlling a voltage at the A1-reset node based on the voltage at the A1-set node such that the voltage at the A1-set node and the voltage at the A1-reset node have opposite logics, an A1-carry output switching device controlled by the voltage at the A1-set node and connected between an A1-clock transfer line, the A1-clock transfer line transferring the A1-clock pulse, and the A1-carry output terminal, and an A1-carry discharge switching device controlled by the voltage at the A1-reset node and connected between the A1-carry output terminal and a ninth discharging voltage line, the ninth discharging voltage line transferring a ninth discharging voltage.

The A1-inverter may include a first A1-inverting switching device controlled by a high voltage from a high voltage line and connected between the high voltage line and the A1-reset node, and a second A1-inverting switching device controlled by the voltage at the A1-set node and connected between the A1-reset node and a low voltage line, the low voltage line transferring a low voltage.

Alternatively, the A1-inverter may include a first A1-inverting switching device controlled by an external control signal and connected between a high voltage line, the high voltage line transferring a high voltage, and the A1-reset node, and a second A1-inverting switching device controlled by the voltage at the A1-set node and connected between the A1-reset node and a low voltage line, the low voltage line transferring a low voltage.

As another alternative, the A1-inverter may include a first A1-inverting switching device controlled by an external control signal and connected between a high voltage line, the high voltage line transferring a high voltage, and an A1-common node, a second A1-inverting switching device controlled by the voltage at the A1-set node and connected between the A1-common node and a low voltage line, the low voltage line transferring a low voltage, a third A1-inverting switching device controlled by a voltage at the A1-common node and connected between the high voltage line and the A1-reset node, and a fourth A1-inverting switching device controlled by the voltage at the A1-set node and connected between the A1-reset node and the low voltage line.

As another alternative, the A1-inverter may include a first A1-inverting switching device controlled by a high voltage from a high voltage line and connected between the high voltage line and an A1-common node, a second A1-inverting switching device controlled by the voltage at the A1-set node and connected between the A1-common node and a low voltage line, the low voltage line transferring a low voltage, a third A1-inverting switching device controlled by a voltage at the A1-common node and connected between the high voltage line and the A1-reset node, and a fourth A1-inverting switching device controlled by the voltage at the A1-set node and connected between the A1-reset node and the low voltage line.

As another alternative, the A1-inverter may include a first A1-inverting switching device controlled by the voltage at the A1-set node and connected between the A1-reset node and a low voltage line, the low voltage line transferring a low voltage, a second A1-inverting switching device controlled by the voltage at the A1-reset node and connected between the A1-set node and the first scan output terminal or between the A1-set node and the A1-carry output terminal, and an A1-capacitor connected between the A1-clock transfer line and the A1-reset node.

The A1-inverter may further include at least one of a fifth A1-inverting switching device controlled by the A1-set control signal and connected between the A1-reset node and the low voltage line, a sixth A1-inverting switching device controlled by the voltage at the A1-reset node and connected between the A1-set node and the low voltage line, and a seventh A1-inverting switching device controlled by the A1-clock pulse from the A1-clock transfer line and connected between an output terminal, the output terminal outputting the A1-set control signal, and the A1-set node.

The A1-inverter may further include an eighth A1-inverting switching device controlled by the B-carry pulse or a voltage applied to a gate electrode of a B1-scan output switching device of the scan output controller and connected between the A1-common node and the low voltage line.

The A1-set control signal may be an A1-start pulse, or an A1-carry pulse output from any one of stages operating earlier than the at least one stage, among the plurality of stages, and the A1-reset control signal may be an A1-carry pulse output from any one of stages operating later than the at least one stage, among the plurality of stages.

The A-control signal may include an A1-set control signal, an A1-reset control signal, an A2-set control signal and an A2-reset control signal, wherein the A2-sub-stage of the at least one stage may include a first A2-switching device controlled by the A2-set control signal and connected between a charging voltage line, the charging voltage line transferring a charging voltage, and the A2-set node, a second A2-switching device controlled by the A2-reset control signal and connected between the A2-set node and an eighth discharging voltage line, the eighth discharging voltage line transferring an eighth discharging voltage, an A2-inverter for controlling a voltage at the A2-reset node based on the voltage at the A2-set node such that the voltage at the A2-set node and the voltage at the A2-reset node have opposite logics, an A2-carry output switching device controlled by the voltage at the A2-set node and connected between an A2-clock transfer line, the A2-clock transfer line transferring the A2-clock pulse, and the A2-carry output terminal, and an A2-carry discharge switching device controlled by the voltage at the A2-reset node and connected between the A2-carry output terminal and a ninth discharging voltage line, the ninth discharging voltage line transferring a ninth discharging voltage.

The A2-set control signal may be an A2-start pulse, or an A2-carry pulse output from any one of stages operating earlier than the at least one stage, among the plurality of stages, and the A2-reset control signal may be an A2-carry pulse output from any one of stages operating later than the at least one stage, among the plurality of stages.

The B-control signal may include a B-set control signal and a B-reset control signal, wherein the B-sub-stage of the at least one stage may include a first B-switching device controlled by the B-set control signal and connected between a charging voltage line, the charging voltage line transferring a charging voltage, and the B-set node, a second B-switching device controlled by the B-reset control signal and connected between the B-set node and a tenth discharging voltage line, the tenth discharging voltage line transferring a tenth discharging voltage, a B-inverter for controlling the voltage at the B-reset node based on the voltage at the B-set node such that the voltage at the B-set node and the voltage at the B-reset node have opposite logics, a B-carry output switching device controlled by the voltage at the B-set node and connected between a B-clock transfer line, the B-clock transfer line transferring the B-clock pulse, and the B-carry output terminal, and a B-carry discharge switching device controlled by the voltage at the B-reset node and connected between the B-carry output terminal and an eleventh discharging voltage line, the eleventh discharging voltage line transferring an eleventh discharging voltage.

The B-sub-stage may further include a third B-switching device controlled by the voltage at the B-set node and connected between a control transfer line, the control transfer line transferring an external switching control signal, and the B-set node.

The B-set control signal may be a B-start pulse, or a B-carry pulse output from any one of stages operating earlier than the at least one stage, among the plurality of stages, and the B-reset control signal may be a B-carry pulse output from any one of stages operating later than the at least one stage, among the plurality of stages.

The at least one A1-reset node may include a first A1-reset node and a second A1-reset node, and the A-control signal may include an A1-set control signal, an A1-reset control signal, an A2-set control signal and an A2-reset control signal, wherein the A1-sub-stage of the at least one stage may include a first A1-switching device controlled by the A1-set control signal and connected between a charging voltage line, the charging voltage line transferring a charging voltage, and the A1-set node, a second A1-switching device controlled by the A1-reset control signal and connected between the A1-set node and a twelfth discharging voltage line, the twelfth discharging voltage line transferring a twelfth discharging voltage, a third A1-switching device controlled by a voltage at the first A1-reset node and connected between the A1-set node and a thirteenth discharging voltage line, the thirteenth discharging voltage line transferring a thirteenth discharging voltage, a fourth A1-switching device controlled by a voltage at the second A1-reset node and connected between the A1-set node and a fourteenth discharging voltage line, the fourteenth discharging voltage line transferring a fourteenth discharging voltage, a first A1-inverter for controlling the voltage at the first A1-reset node based on the voltage at the A1-set node such that the voltage at the A1-set node and the voltage at the first A1-reset node have opposite logics, a second A1-inverter for controlling the voltage at the second A1-reset node based on the voltage at the A1-set node such that the voltage at the A1-set node and the voltage at the second A1-reset node have opposite logics, an A1-carry output switching device controlled by the voltage at the A1-set node and connected between an A1-clock transfer line, the A1-clock transfer line transferring the A1-clock pulse, and the A1-carry output terminal, a first A1-carry discharge switching device controlled by the voltage at the first A1-reset node and connected between the A1-carry output terminal and a fifteenth discharging voltage line, the fifteenth discharging voltage line transferring a fifteenth discharging voltage, and a second A1-carry discharge switching device controlled by the voltage at the second A1-reset node and connected between the A1-carry output terminal and the fifteenth sixteenth discharging voltage line.

The at least one A2-reset node may include a first A2-reset node and a second A2-reset node, and the A-control signal may include an A1-set control signal, an A1-reset control signal, an A2-set control signal and an A2-reset control signal, wherein the A2-sub-stage of the at least one stage may include a first A2-switching device controlled by the A2-set control signal and connected between a charging voltage line, the charging voltage line transferring a charging voltage, and the A2-set node, a second A2-switching device controlled by the A2-reset control signal and connected between the A2-set node and a twelfth discharging voltage line, the twelfth discharging voltage line transferring a twelfth discharging voltage, a third A2-switching device controlled by a voltage at the first A2-reset node and connected between the A2-set node and a thirteenth discharging voltage line, the thirteenth discharging voltage line transferring a thirteenth discharging voltage, a fourth A2-switching device controlled by a voltage at the second A2-reset node and connected between the A2-set node and a fourteenth discharging voltage line, the fourteenth discharging voltage line transferring a fourteenth discharging voltage, a first A2-inverter for controlling the voltage at the first A2-reset node based on the voltage at the A2-set node such that the voltage at the A2-set node and the voltage at the first A2-reset node have opposite logics, a second A2-inverter for controlling the voltage at the second A2-reset node based on the voltage at the A2-set node such that the voltage at the A2-set node and the voltage at the second A2-reset node have opposite logics, an A2-carry output switching device controlled by the voltage at the A2-set node and connected between an A2-clock transfer line, the A2-clock transfer line transferring the A2-clock pulse, and the A2-carry output terminal, a first A2-carry discharge switching device controlled by the voltage at the first A2-reset node and connected between the A2-carry output terminal and a fifteenth discharging voltage line, the fifteenth discharging voltage line transferring a fifteenth discharging voltage, and a second A2-carry discharge switching device controlled by the voltage at the second A2-reset node and connected between the A2-carry output terminal and the fifteenth sixteenth discharging voltage line.

The at least one B-reset node may include a first B-reset node and a second B-reset node, and the B-control signal may include a B-set control signal and a B-reset control signal, wherein the B-sub-stage of the at least one stage may include a first B-switching device controlled by the B-set control signal and connected between a charging voltage line, the charging voltage line transferring a charging voltage, and the B-set node, a second B-switching device controlled by the B-reset control signal and connected between the B-set node and a sixteenth discharging voltage line, the sixteenth discharging voltage line transferring a sixteenth discharging voltage, a third B-switching device controlled by a voltage at the first B-reset node and connected between the B-set node and a seventeenth discharging voltage line, the seventeenth discharging voltage line transferring a seventeenth discharging voltage, a fourth B-switching device controlled by a voltage at the second B-reset node and connected between the B-set node and an eighteenth discharging voltage line, the eighteenth discharging voltage line transferring an eighteenth discharging voltage, a first B-inverter for controlling the voltage at the first B-reset node based on the voltage at the B-set node such that the voltage at the B-set node and the voltage at the first B-reset node have opposite logics, a second B-inverter for controlling the voltage at the second B-reset node based on the voltage at the B-set node such that the voltage at the B-set node and the voltage at the second B-reset node have opposite logics, a B-carry output switching device controlled by the voltage at the B-set node and connected between a B-clock transfer line, the B-clock transfer line transferring the B-clock pulse, and the B-carry output terminal, a first B-carry discharge switching device controlled by the voltage at the first B-reset node and connected between the B-carry output terminal and a nineteenth discharging voltage line, the nineteenth discharging voltage line transferring a nineteenth discharging voltage, and a second B-carry discharge switching device controlled by the voltage at the second B-reset node and connected between the B-carry output terminal and the nineteenth discharging voltage.

The scan output controller may further include a tenth A1-control switching device controlled by the B-carry pulse and connected between the A1-set node and a twenties discharging voltage line, the twenties discharging voltage line transferring a twenties discharging voltage, and a tenth A2-control switching device controlled by the B-carry pulse and connected between the A2-set node and the twenties discharging voltage line.

The scan output controller may further include a first B-control switching device controlled by the B-carry pulse and connected between the B-carry output terminal and a gate electrode of the B1-scan output switching device, and a second B-control switching device controlled by the voltage at the B-reset node and connected between the gate electrode of the B1-scan output switching device and an eleventh discharging voltage line, the eleventh discharging voltage line transferring an eleventh discharging voltage.

The scan output controller may further include at least one of a third B-control switching device controlled by an external first signal and connected between the gate electrode of the B1-scan output switching device and a twenty-first discharging voltage line, the twenty-first discharging voltage line transferring a twenty-first discharging voltage, a fourth B-control switching device controlled by an external second signal and connected between the gate electrode of the B1-scan output switching device and a twenty-second discharging voltage line, the twenty-second discharging voltage line transferring a twenty-second discharging voltage, and a fifth B-control switching device controlled by an external third signal and connected between the gate electrode of the B1-scan output switching device and a twenty-third discharging voltage line, the twenty-third discharging voltage line transferring a twenty-third discharging voltage.

The first signal may be any one of the A1-carry pulse and the voltage at the A1-set node, the second signal may be any one of the A2-carry pulse and the voltage at the A2-set node, and the third signal may be any one of an A1-start pulse and an A2-start pulse.

Alternatively, the scan output controller may further include a first B1-control switching device controlled by the B-carry pulse and connected between the B-carry output terminal and a gate electrode of the B1-scan output switching device, a second B1-control switching device controlled by the voltage at the B-reset node and connected between the gate electrode of the B1-scan output switching device and an eleventh discharging voltage line, the eleventh discharging voltage line transferring an eleventh discharging voltage, a first B2-control switching device controlled by the B-carry pulse and connected between the B-carry output terminal and a gate electrode of the B2-scan output switching device, and a second B2-control switching device controlled by the voltage at the B-reset node and connected between the gate electrode of the B2-scan output switching device and the eleventh discharging voltage line.

The scan output controller may further include at least one of a third B1-control switching device controlled by an external first signal and connected between the gate electrode of the B1-scan output switching device and a twenty-first discharging voltage line, the twenty-first discharging voltage line transferring a twenty-first discharging voltage, and a fourth B1-control switching device controlled by an external second signal and connected between the gate electrode of the B1-scan output switching device and a twenty-second discharging voltage line, the twenty-second discharging voltage line transferring a twenty-second discharging voltage.

The first signal may be any one of the A1-carry pulse and the voltage at the A1-set node, and the second signal may be an A1-start pulse.

The scan output controller may further include at least one of a third B2-control switching device controlled by an external third signal and connected between the gate electrode of the B2-scan output switching device and the twenty-first discharging voltage line, and a fourth B2-control switching device controlled by an external fourth signal and connected between the gate electrode of the B2-scan output switching device and the twenty-second discharging voltage line.

The third signal may be any one of the A2-carry pulse and the voltage at the A2-set node, and the fourth signal may be an A2-start pulse.

As another alternative, the scan output controller may further include a first B1-control switching device controlled by the B-carry pulse and connected between the B-carry output terminal and a gate electrode of the B1-scan output switching device, a second B1-control switching device controlled by the voltage at the B-reset node and connected between the gate electrode of the B1-scan output switching device and an eleventh discharging voltage line, the eleventh discharging voltage line transferring an eleventh discharging voltage, a first B2-control switching device controlled by a voltage applied to the gate electrode of the B1-scan output switching device and connected between the gate electrode of the B1-scan output switching device and a gate electrode of the B2-scan output switching device, and a second B2-control switching device controlled by the voltage at the B-reset node and connected between the gate electrode of the B2-scan output switching device and the eleventh discharging voltage line.

The scan output controller may further include at least one of a third B1-control switching device controlled by an external first signal and connected between the gate electrode of the B1-scan output switching device and a twenty-first discharging voltage line, the twenty-first discharging voltage line transferring a twenty-first discharging voltage, and a fourth B1-control switching device controlled by an external second signal and connected between the gate electrode of the B1-scan output switching device and a twenty-second discharging voltage line, the twenty-second discharging voltage line transferring a twenty-second discharging voltage.

The first signal may be any one of the A1-carry pulse and the voltage at the A1-set node, and the second signal may be any one of an A1-start pulse and an A2-start pulse.

The scan output controller may further include at least one of a third B2-control switching device controlled by an external third signal and connected between the gate electrode of the B2-scan output switching device and the twenty-first discharging voltage line, and a fourth B2-control switching device controlled by an external fourth signal and connected between the gate electrode of the B2-scan output switching device and the twenty-second discharging voltage line.

The third signal may be any one of the A2-carry pulse and an A2-set control signal, and the fourth signal may be any one of an A1-start pulse and an A2-start pulse.

As another alternative, the scan output controller may further include a first B-control switching device controlled by an external switching control signal and connected between the B-carry output terminal and a gate electrode of the B1-scan output switching device, and a second B-control switching device controlled by the voltage at the B-reset node and connected between the gate electrode of the B1-scan output switching device and an eleventh discharging voltage line, the eleventh discharging voltage line transferring an eleventh discharging voltage.

The scan output controller may further include at least one of a third B-control switching device controlled by an external first signal and connected between the gate electrode of the B1-scan output switching device and a twenty-first discharging voltage line, the twenty-first discharging voltage line transferring a twenty-first discharging voltage, a fourth B-control switching device controlled by an external second signal and connected between the gate electrode of the B1-scan output switching device and a twenty-second discharging voltage line, the twenty-second discharging voltage line transferring a twenty-second discharging voltage, and a fifth B-control switching device controlled by an external third signal and connected between the gate electrode of the B1-scan output switching device and a twenty-third discharging voltage line, the twenty-third discharging voltage line transferring a twenty-third discharging voltage.

The first signal may be any one of the A1-carry pulse and the voltage at the A1-set node, the second signal may be any one of the A2-carry pulse and the voltage at the A2-set node, and the third signal may be any one of an A1-start pulse and an A2-start pulse.

As another alternative, the scan output controller may further include a first B1-control switching device controlled by an external switching control signal and connected between the B-carry output terminal and a gate electrode of the B1-scan output switching device, a second B1-control switching device controlled by the voltage at the B-reset node and connected between the gate electrode of the B1-scan output switching device and an eleventh discharging voltage line, the eleventh discharging voltage line transferring an eleventh discharging voltage, a first B2-control switching device controlled by the switching control signal and connected between the B-carry output terminal and a gate electrode of the B2-scan output switching device, and a second B2-control switching device controlled by the voltage at the B-reset node and connected between the gate electrode of the B2-scan output switching device and the eleventh discharging voltage line.

The scan output controller may further include at least one of a third B1-control switching device controlled by an external first signal and connected between the gate electrode of the B1-scan output switching device and a twenty-first discharging voltage line, the twenty-first discharging voltage line transferring a twenty-first discharging voltage, and a fourth B1-control switching device controlled by an external second signal and connected between the gate electrode of the B1-scan output switching device and a twenty-second discharging voltage line, the twenty-second discharging voltage line transferring a twenty-second discharging voltage.

The first signal may be any one of the A1-carry pulse and the voltage at the A1-set node, and the second signal may be any one of an A1-start pulse and an A2-start pulse.

The scan output controller may further include at least one of a third B2-control switching device controlled by an external third signal and connected between the gate electrode of the B2-scan output switching device and the twenty-first discharging voltage line, and a fourth B2-control switching device controlled by an external fourth signal and connected between the gate electrode of the B2-scan output switching device and the twenty-second discharging voltage line.

The third signal may be any one of the A2-carry pulse and an A2-set control signal, and the fourth signal may be any one of an A1-start pulse and an A2-start pulse.

The A2-set control signal may be an A2-start pulse, or an A2-carry pulse output from any one of stages operating earlier than the at least one stage, among the plurality of stages, the A2-reset control signal may be an A2-carry pulse output from any one of stages operating later than the at least one stage, among the plurality of stages, and the A1-start pulse and the A2-start pulse may be the same.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 16 is a view illustrating switching devices which may be additionally provided in the scan output controller;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
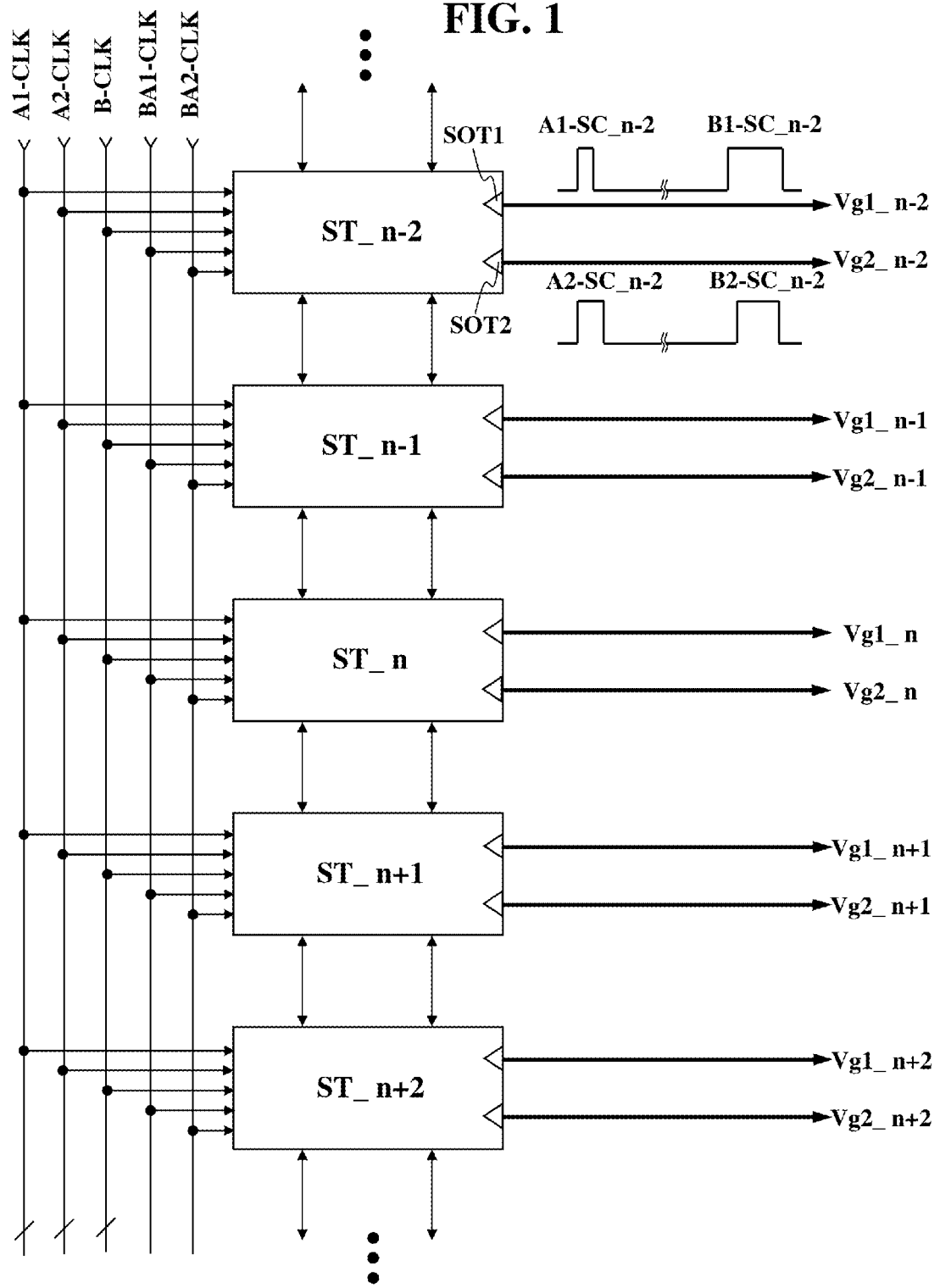
FIG. 1 is a block diagram showing the configuration of a shift register according to an embodiment of the present invention.

FIG. 1 is a block diagram showing the configuration of a shift register according to an embodiment of the present invention.

The shift register according to the present embodiment includes a plurality of stages ST_n−2 to ST_n+2, as shown in FIG. 1.

Each stage ST_n−2 to ST_n+2 outputs first and second composite pulses Vg1_n−2 to Vg1_n+2 and Vg2_n−2 to Vg2_n+2, respectively, through first and second scan output terminals SOT1 and SOT2 thereof. That is, a pair of two composite pulses are output from each stage. On the other hand, although not shown, a set of three or more composite pulses may be output from each stage. In this case, each stage may have three or more scan output terminals.

The first composite pulse and the second composite pulse output from one stage may have the same output timings and the same pulse widths or have different output timings and different pulse widths. As an example, as shown in FIG. 1, an A1-scan pulse included in the first composite pulse output from the (n−2)th stage ST_n−2 and an A2-scan pulse included in the second composite pulse output therefrom have the same output timings, but different pulse widths. Also, a B1-scan pulse included in the first composite pulse output from the (n−2)th stage ST_n−2 and a B2-scan pulse included in the second composite pulse output therefrom have the same output timings, but different pulse widths.

A composite pulse output through a first scan output terminal SOT1 of any one stage is divided into an A1-scan pulse and a B1-scan pulse, which are output at different periods. For example, seeing an A1-scan pulse A1-SC_n−2 and a B1-scan pulse B1-SC_n−2 output through the first scan output terminal SOT1 of the (n−2)th stage ST_n−2, the A1-scan pulse A1-SC_n−2 may be generated once in every frame, and the B1-scan pulse B1-SC_n−2 may be generated once in several frames.

As a detailed example, assume that a total number of gate lines of a panel to be driven is twenty, a shift register for driving of the twenty gate lines includes a total of ten stages, the (n−2)th stage ST_n−2 is a first one of the ten stages which drives first and second ones of the twenty gate lines, a time for which one gate line is driven is one horizontal period, and a time for which ten odd-numbered ones of the twenty gate lines are all driven once is one frame period.

On this assumption, the first stage outputs an A1-scan pulse in a first horizontal period of each of first to tenth frame periods to drive the first gate line in the first horizontal period of each frame period. Further, the first stage outputs a B1-scan pulse immediately after a tenth horizontal period of the first frame period. That is, the B1-scan pulse may be generated at any time in a period between the end of generation of a last A1-scan pulse in the current frame period and the start of the next frame period.

Here, the B1-scan pulse is again output through the first stage in an eleventh frame period. That is, under the above condition, the first stage outputs an A1-scan pulse once in every frame period and a B1-scan pulse once in ten frame periods. In the same manner, each of the other stages outputs an A1-scan pulse in a corresponding horizontal period of every frame period and a B1-scan pulse in an end period of a corresponding frame period (a period subsequent to a last horizontal period in each frame period). As stated above, the "period subsequent to the last horizontal period" signifies any specific period belonging to the period between the end of the generation of the last A1-scan pulse in the current frame period and the start of the next frame period.

Also, a composite pulse output through a second scan output terminal SOT2 of any one stage is divided into an A2-scan pulse and a B2-scan pulse, which are output at different periods. For example, seeing an A2-scan pulse A2-SC_n−2 and a B2-scan pulse B2-SC_n−2 output through the second scan output terminal SOT2 of the (n−2)th stage ST_n−2, the A2-scan pulse A2-SC_n−2 may be generated once in every frame, and the B2-scan pulse B2-SC_n−2 may be generated once in several frames.

As a detailed example, assume that a total number of gate lines of a panel to be driven is twenty, a shift register for driving of the twenty gate lines includes a total of ten stages, the (n−2)th stage ST_n−2 is a first one of the ten stages which drives first and second ones of the twenty gate lines, a time for which one gate line is driven is one horizontal period, and a time for which ten even-numbered ones of the twenty gate lines are all driven once is one frame period.

On this assumption, the first stage outputs an A2-scan pulse in a first horizontal period of each of first to tenth frame periods to drive the second gate line in the first horizontal period of each frame period. Further, the first stage outputs a B2-scan pulse immediately after a tenth horizontal period of the first frame period. That is, the B2-scan pulse may be generated at any time in a period between the end of generation of a last A2-scan pulse in the current frame period and the start of the next frame period.

Here, the B2-scan pulse is again output through the first stage in an eleventh frame period. That is, under the above condition, the first stage outputs an A2-scan pulse once in every frame period and a B2-scan pulse once in ten frame periods. In the same manner, each of the other stages outputs an A2-scan pulse in a corresponding horizontal period of every frame period and a B2-scan pulse in an end period of a corresponding frame period (a period subsequent to a last horizontal period in each frame period). As stated above, the "period subsequent to the last horizontal period" signifies any specific period belonging to the period between the end of the generation of the last A2-scan pulse in the current frame period and the start of the next frame period.

In order to generate the above A#-scan pulse and B#-scan pulse (where # is 1 or 2), each stage ST_n−2 to ST_n+2 is supplied with any one of a plurality of A1-clock pulses A1-CLK having different phases, any one of a plurality of A2-clock pulses A2-CLK having different phases, any one of a plurality of B-clock pulses B-CLK having different phases, and a BA1-clock pulse BA1-CLK and a BA2-clock pulse BA2-CLK having different phases.

That is, each stage ST_n−2 to ST_n+2 generates an A1-scan pulse A1-SC_i (where i is a natural number) based on an A1-clock pulse A1-CLK supplied thereto, an A2-scan pulse A2-SC_i based on an A2-clock pulse A2-CLK supplied thereto, a B1-scan pulse B1-SC_i based on a B-clock pulse B-CLK and a BA1-clock pulse BA1-CLK supplied thereto, and a B2-scan pulse B2-SC_i based on a B-clock pulse B-CLK and a BA2-clock pulse BA2-CLK supplied thereto.

On the other hand, the B-clock pulses may be one in number, not plural in number. That is, only a B-clock pulse of one phase may be used. Similarly, the BA-clock pulses may be one in number, not plural in number. That is, only a BA-clock pulse of one phase may be used.

In this manner, each stage ST_n−2 to ST_n+2 drives an odd-numbered gate line connected thereto using a first composite pulse Vg1_n−2 to Vg1_n+2 including an A1-scan pulse and a B1-scan pulse and drives an even-numbered gate line connected thereto using a second composite pulse Vg2_n−2 to Vg2_n+2 including an A2-scan pulse and a B2-scan pulse.

Hereinafter, the configuration of each stage will be described in detail with reference to FIG. 2.

Figure 2:
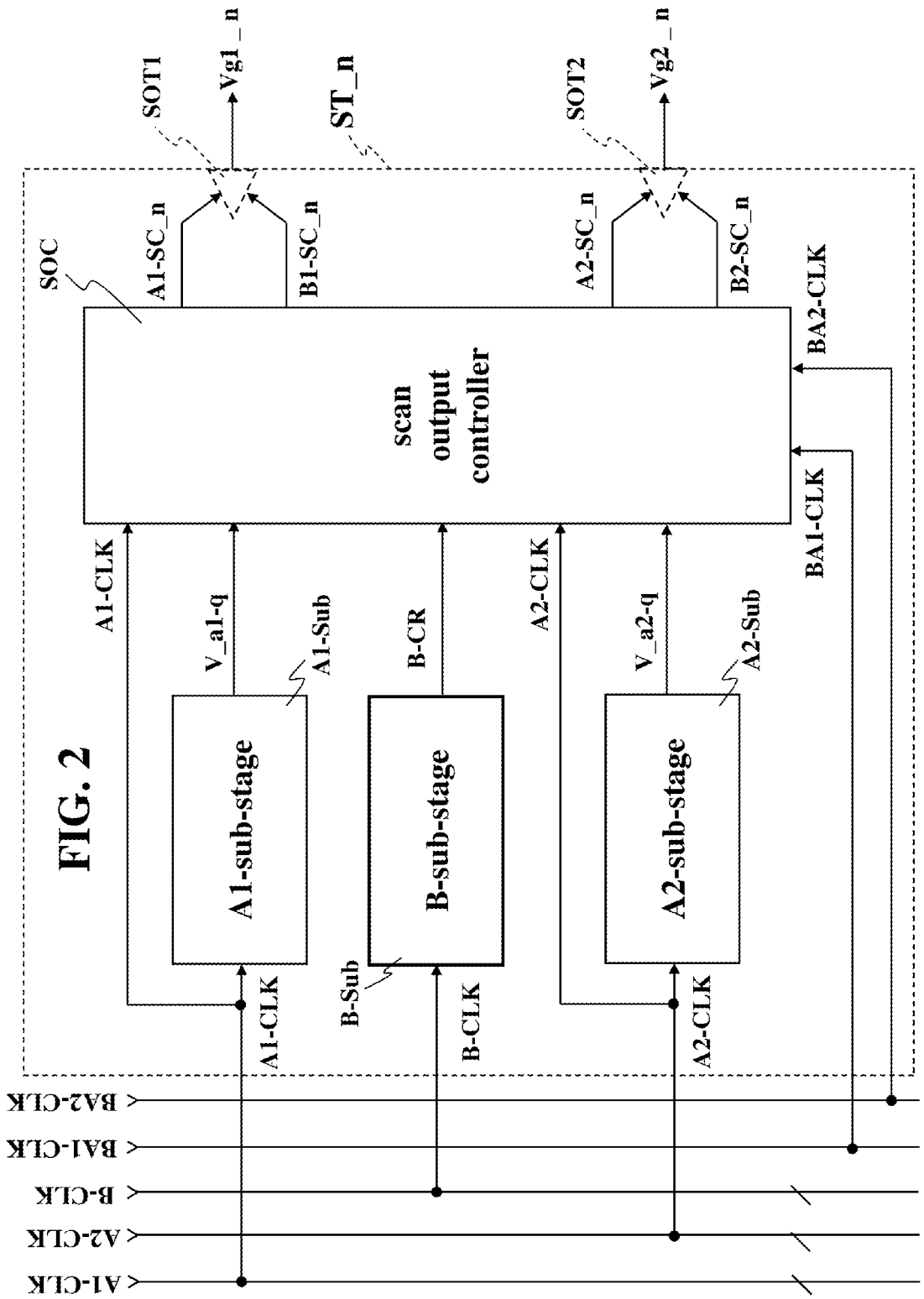
FIG. 2 is a detailed block diagram of any one stage in FIG. 1.

FIG. 2 is a detailed block diagram of any one stage in FIG. 1.

The stage (for example, the nth stage ST_n) includes an A1-sub-stage A1-Sub, an A2-sub-stage A2-Sub, a B-sub-stage B-Sub, and a scan output controller SOC, as shown in FIG. 2. Here, the A-sub-stages may be three or more in number.

The A1-sub-stage A1-Sub controls a voltage $V\_a1\text{-}q$ at an A1-set node and a voltage at least one A1-reset node in response to an external A-control signal. The A1-sub-stage A1-Sub also generates an A1-carry pulse based on the voltage $V\_a1\text{-}q$ at the A1-set node, the voltage at the at least one A1-reset node and any one A1-clock pulse A1-CLK.

The A2-sub-stage A2-Sub controls a voltage $V\_a2\text{-}q$ at an A2-set node and a voltage at least one A2-reset node in response to the external A-control signal. The A2-sub-stage A2-Sub also generates an A2-carry pulse based on the voltage $V\_a2\text{-}q$ at the A2-set node, the voltage at the at least one A2-reset node and any one A2-clock pulse A2-CLK.

The B-sub-stage B-Sub controls a voltage at a B-set node and a voltage at at least one B-reset node in response to an external B-control signal. The B-sub-stage B-Sub also generates a B-carry pulse B-CR based on the voltage at the B-set node, the voltage at the at least one B-reset node and any one B-clock pulse B-CLK.

The scan output controller SOC generates an A1-scan pulse A1-SC_n based on the voltage V_a1-$q$ at the A1-set node and the A1-clock pulse A1-CLK. The scan output controller SOC also generates an A2-scan pulse A2-SC_n based on the voltage V_a2-$q$ at the A2-set node and the A2-clock pulse A2-CLK. The scan output controller SOC also generates a B1-scan pulse B1-SC_n based on the B-carry pulse B-CR and a BA1-clock pulse BA1-CLK. In addition, the scan output controller SOC generates a B2-scan pulse B2-SC_n based on the B-carry pulse B-CR and a BA2-clock pulse BA2-CLK.

Here, the A-control signal and B-control signal supplied to each stage ST_n–2 to ST_n+2 may be signals as will hereinafter be described in detail with reference to FIG. 3.

Figure 3:
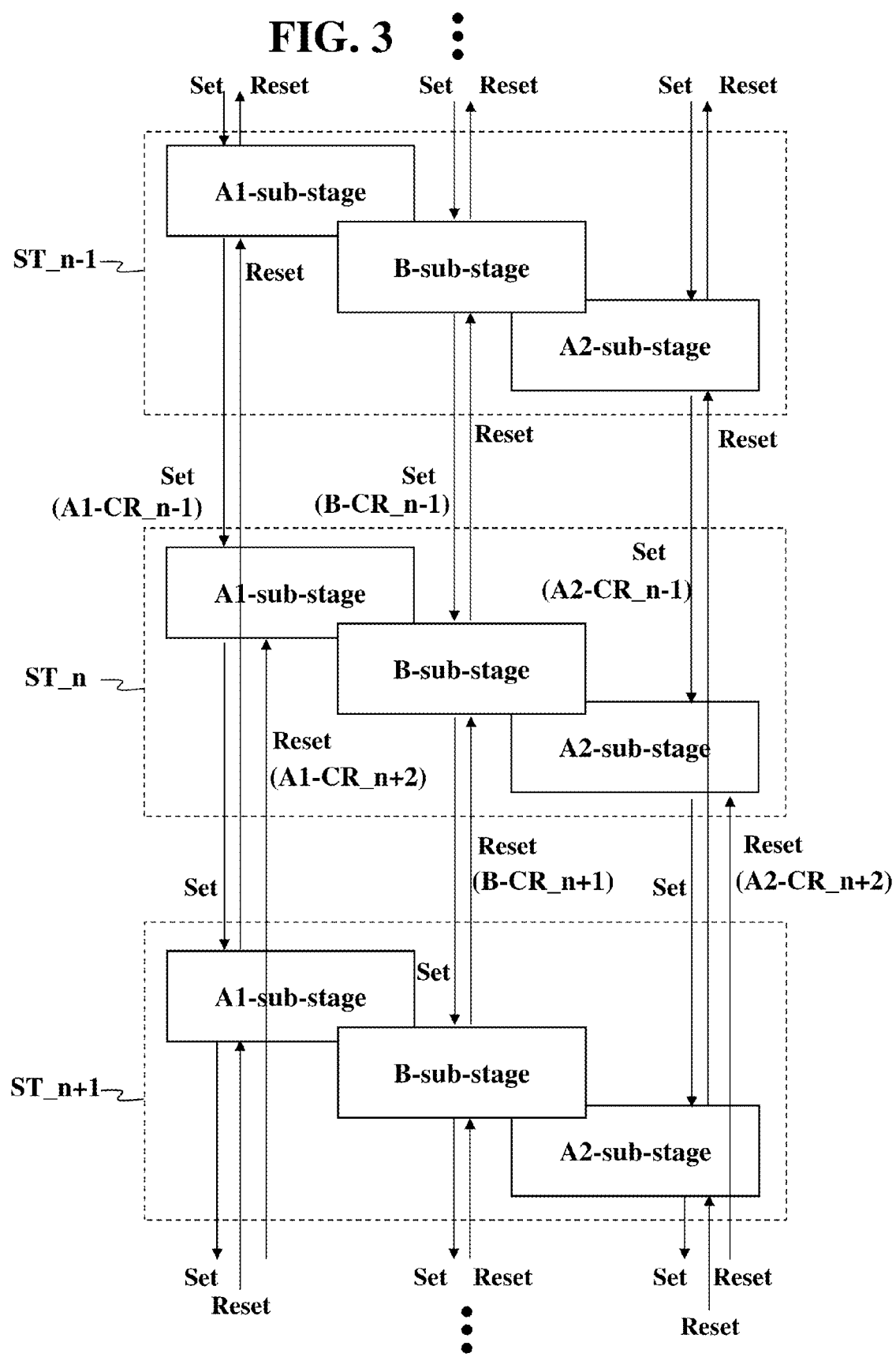
FIG. 3 is a block diagram illustrating an example of use of outputs from each stage in FIG. 1 as an A-control signal and a B-control signal.

FIG. 3 is a block diagram illustrating an example of use of outputs from each stage in FIG. 1 as an A-control signal and a B-control signal. Although not shown in FIG. 3, each stage of FIG. 3 includes the above scan output controller SOC therein.

The A-control signal may be divided into an A1-set control signal, an A1-reset control signal, an A2-set control signal and an A2-reset control signal. The A1-set control signal is required to set the A1-sub-stage A1-Sub of a corresponding stage supplied with the A1-set control signal, and the A1-reset control signal is required to reset the A1-sub-stage A1-Sub of a corresponding stage supplied with the A1-reset control signal. The A2-set control signal is required to set the A2-sub-stage A2-Sub of a corresponding stage supplied with the A2-set control signal, and the A2-reset control signal is required to reset the A2-sub-stage A2-Sub of a corresponding stage supplied with the A2-reset control signal.

The A1-set control signal may be an output from any one of stages upstream of the current stage supplied with the A1-set control signal. That is, the A1-sub-stage A1-Sub of the nth stage ST_n (where n is a natural number) may receive, as the above A1-set control signal, an A1-carry pulse output from the A1-sub-stage A1-Sub of an (n–p)th stage (where p is a natural number less than n). For example, the A1-sub-stage A1-Sub of the nth stage ST_n may receive, as the above A1-set control signal, an A1-carry pulse A1-CR_n–1 output from the A1-sub-stage A1-Sub of the (n–1)th stage ST_n–1, as shown in FIG. 3. Here, the upstream stages signify stages that operate earlier than the current stage.

In contrast, the A1-reset control signal may be an output from any one of stages downstream of the current stage supplied with the A1-reset control signal. That is, the A1-sub-stage A1-Sub of the nth stage ST_n may receive, as the above A1-reset control signal, an A1-carry pulse output from the A1-sub-stage A1-Sub of an (n+q)th stage (where q is an arbitrary natural number or a natural number equal to p). For example, the A1-sub-stage A1-Sub of the nth stage ST_n may receive, as the above A1-reset control signal, an A1-carry pulse A1-CR_n+2 output from the A1-sub-stage A1-Sub of the (n+2)th stage ST_n+2, as shown in FIG. 3. Here, the downstream stages signify stages that operate later than the current stage.

Similarly, the A2-set control signal may be an output from any one of stages upstream of the current stage supplied with the A2-set control signal. That is, the A2-sub-stage A2-Sub of the nth stage ST_n may receive, as the above A2-set control signal, an A2-carry pulse output from the A2-sub-stage A2-Sub of the (n–p)th stage. For example, the A2-sub-stage A2-Sub of the nth stage ST_n may receive, as the above A2-set control signal, an A2-carry pulse A2-CR_n–1 output from the A2-sub-stage A2-Sub of the (n–1)th stage ST_n–1, as shown in FIG. 3. Here, the upstream stages signify stages that operate earlier than the current stage.

In contrast, the A2-reset control signal may be an output from any one of stages downstream of the current stage supplied with the A2-reset control signal. That is, the A2-sub-stage A2-Sub of the nth stage ST_n may receive, as the above A2-reset control signal, an A2-carry pulse output from the A2-sub-stage A2-Sub of the (n+q)th stage. For example, the A2-sub-stage A2-Sub of the nth stage ST_n may receive, as the above A2-reset control signal, an A2-carry pulse A2-CR_n+2 output from the A2-sub-stage A2-Sub of the (n+2)th stage ST_n+2, as shown in FIG. 3. Here, the downstream stages signify stages that operate later than the current stage.

Similarly, the B-control signal may be divided into a B-set control signal and a B-reset control signal. The B-set control signal is required to set the B-sub-stage B-Sub of a corresponding stage supplied with the B-set control signal, and the B-reset control signal is required to reset the B-sub-stage B-Sub of a corresponding stage supplied with the B-reset control signal.

The B-set control signal may be an output from any one of stages upstream of the current stage supplied with the B-set control signal. That is, the B-sub-stage B-Sub of the nth stage ST_n (where n is a natural number) may receive, as the above B-set control signal, a B-carry pulse output from the B-sub-stage B-Sub of an (n–r)th stage (where r is a natural number less than n or equal to p). For example, the B-sub-stage B-Sub of the nth stage ST_n may receive, as the above B-set control signal, a B-carry pulse B-CR_n–1 output from the B-sub-stage B-Sub of the (n–1)th stage ST_n–1, as shown in FIG. 3.

In contrast, the B-reset control signal may be an output from any one of stages downstream of the current stage supplied with the B-reset control signal. That is, the B-sub-stage B-Sub of the nth stage ST_n may receive, as the above B-reset control signal, a B-carry pulse output from the B-sub-stage B-Sub of an (n+s)th stage (where s is an arbitrary natural number or a natural number equal to r). For example, the B-sub-stage B-Sub of the nth stage ST_n may receive, as the above B-reset control signal, a B-carry pulse B-CR_n+1 output from the B-sub-stage B-Sub of the (n+1)th stage ST_n+1, as shown in FIG. 3.

In this manner, the A1-sub-stages A1-Sub are interconnected to constitute one shift register that sequentially outputs A1-carry pulses A1-CR_i, the A2-sub-stages A2-Sub are interconnected to constitute another shift register that sequentially outputs A2-carry pulses A2-CR_i, and the B-sub-stages B-Sub are interconnected to constitute another shift register that sequentially outputs B-carry pulses B-CR_i.

Figure 4:
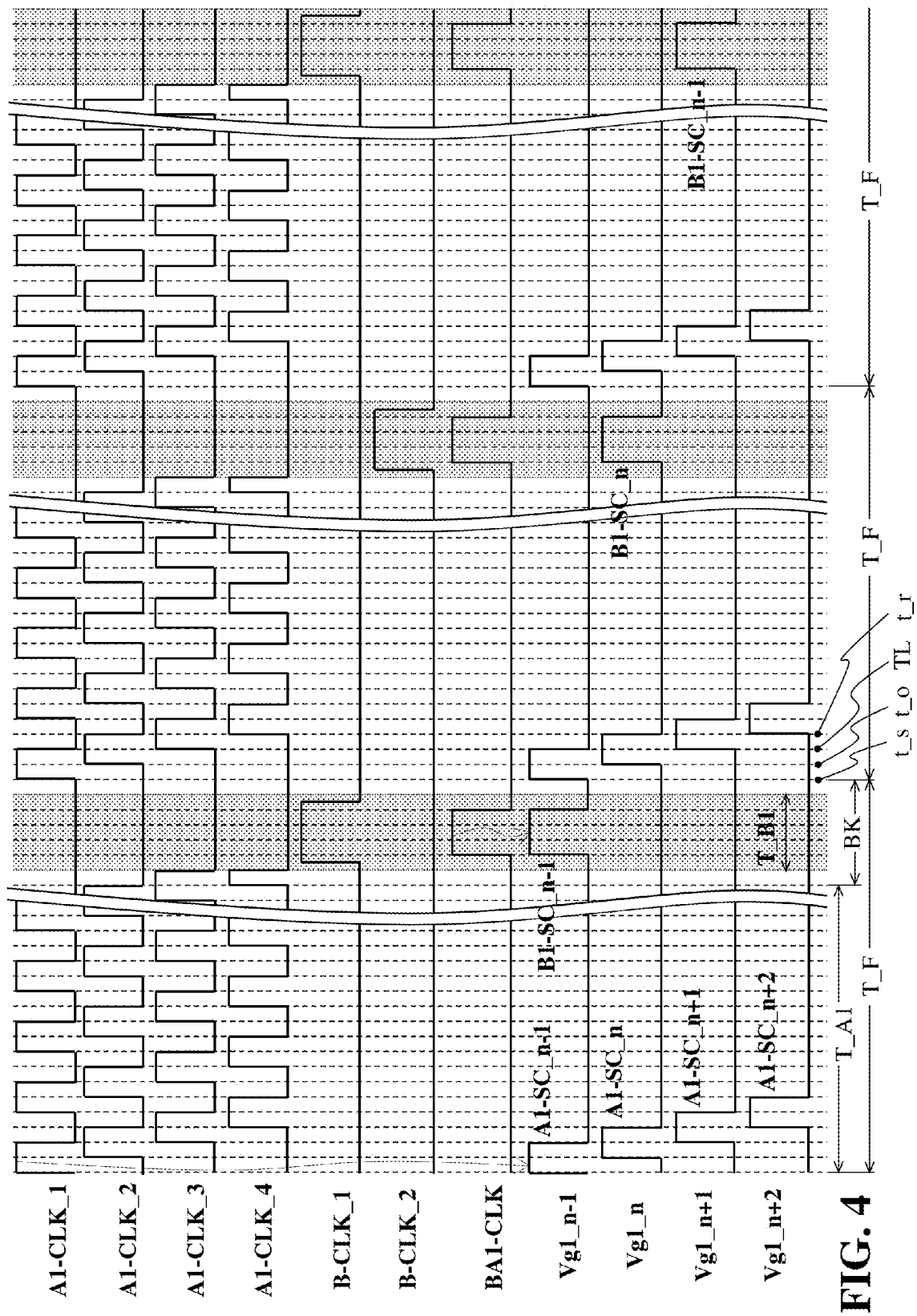
FIG. 4 is a timing diagram illustrating an example of an A1-clock pulse, a B-clock pulse and a BA1-clock pulse, and A1-scan pulses generated thereby.

FIG. 4 is a timing diagram illustrating an example of an A1-clock pulse A1-CLK, a B-clock pulse B-CLK and a BA1-clock pulse BA1-CLK, and A1-scan pulses generated thereby.

As shown in FIG. 4, the A1-clock pulse A1-CLK may be composed of clock pulses A1-CLK_1 to A1-CLK_4 of four phases, the B-clock pulse B-CLK may be composed of clock pulses B-CLK_1 and B-CLK_2 of two phases, and the BA1-clock pulse BA1-CLK may be composed of a clock pulse BA1-CLK of one phase.

The A1-clock pulse A1-CLK may include first to fourth A1-clock pulses A1-CLK_1 to A1-CLK_4 having different phases and the same pulse widths. Here, the pulse widths of adjacent ones of the first to fourth A1-clock pulses A1-CLK_1 to A1-CLK_4 may partially overlap each other.

FIG. 4 shows an example in which the respective pulse widths of the adjacent A1-clock pulses A1-CLK overlap each other by ½. It should be noted that this is but one example and the overlap size is changeable to any value. Alternatively, the A1-clock pulses A1-CLK may be output without overlap in their pulse widths.

When the A1-clock pulses A1-CLK_1 to A1-CLK_4 are output without overlap in their pulse widths, an A1-carry pulse from the A1-sub-stage A1-Sub of the (n+1)th stage ST_n+1, not the above (n+2)th stage ST_n+2, may be used to reset the A1-sub-stage A1-Sub of the nth stage ST_n.

The A1-clock pulse A1-CLK is used as an A1-scan pulse A1-SC and an A1-carry pulse A1-CR. For example, when the A1-clock pulses A1-CLK_1 to A1-CLK_4 of four phases are used as shown in FIG. 4, a (4x+1)th stage (where x is a natural number including 0) may receive the first A1-clock pulse A1-CLK_1 and output a (4x+1)th A1-scan pulse and a (4x+1)th A1-carry pulse, a (4x+2)th stage may receive the second A1-clock pulse A1-CLK_2 and output a (4x+2)th A1-scan pulse and a (4x+2)th A1-carry pulse, a (4x+3)th stage may receive the third A1-clock pulse A1-CLK_3 and output a (4x+3)th A1-scan pulse and a (4x+3)th A1-carry pulse, and a (4x+4)th stage may receive the fourth A1-clock pulse A1-CLK_4 and output a (4x+4)th A1-scan pulse and a (4x+4)th A1-carry pulse.

The B-clock pulse B-CLK may include first and second B-clock pulses B-CLK_1 and B-CLK_2 having different phases.

Each of the first and second B-clock pulses B-CLK_1 and B-CLK_2 controls output timing of a B-scan pulse B-SC and is used as a B-carry pulse B-CR. For example, when the B-clock pulses B-CLK_1 and B-CLK_2 of two phases are used as shown in FIG. 4, the B-sub-stage B-Sub of an odd-numbered stage may receive the first B-clock pulse B-CLK_1 and determine output timings of a B-carry pulse B-CR and a B-scan pulse B-SC based on the first B-clock pulse B-CLK_1, and the B-sub-stage B-Sub of an even-numbered stage may receive the second B-clock pulse B-CLK_2 and determine output timings of a B-carry pulse B-CR and a B-scan pulse B-SC based on the second B-clock pulse B-CLK_2.

In addition, the B-sub-stage B-Sub of the odd-numbered stage may receive the first B-clock pulse B-CLK_1 and output an odd-numbered B-carry pulse B-CR, and the B-sub-stage B-Sub of the even-numbered stage may receive the second B-clock pulse B-CLK_2 and output an even-numbered B-carry pulse B-CR.

Each of the first and second B-clock pulses B-CLK_1 and B-CLK_2 is output in an end period of a corresponding frame period (a period subsequent to a last horizontal period in each frame period, which will hereinafter be referred to as a B1-output period T_B1), as stated previously. In this regard, the B-carry pulse B-CR and the B-scan pulse B-SC are also output in every B1-output period T_B1. Here, the first B-clock pulse B-CLK_1 may be output in every odd-numbered frame period, and the second B-clock pulse B-CLK_2 may be output in every even-numbered frame period.

On the other hand, FIG. 4 shows three frame periods, each of which includes, at the end thereof, a blank period BK in which various signals necessary for the next frame period are set. Exceptionally, a data signal required for display of an image is not included in the various signals. That is, this data signal is not generated in the blank period BK.

The above B1-output period T_B1 is included in the blank period BK. That is, the B-clock pulses B-CLK_1 and B-CLK_2, the B-carry pulse B-CR and the B-scan pulse B-SC are generated in the blank period BK.

The BA1-clock pulse BA1-CLK is used as a B1-scan pulse B1-SC. This BA1-clock pulse BA1-CLK is output synchronously with the first and second B-clock pulses B-CLK_1 and B-CLK_2. In other words, the BA1-clock pulse BA1-CLK is output in the B1-output period T_B1 of every frame period, too. Exceptionally, the BA1-clock pulse BA1-CLK has a narrower pulse width than that of the B-clock pulse B-CLK such that it is completely surrounded by the B-clock pulse B-CLK. That is, as shown in FIG. 4, the B-clock pulse B-CLK_1 or B-CLK_2 has a rising edge which is ahead of that of the BA1-clock pulse BA1-CLK and a falling edge which is behind that of the BA1-clock pulse BA1-CLK. As a result, the BA1-clock pulse BA1-CLK can be securely kept high while the B-clock pulse B-CLK_1 or B-CLK_2 is kept high.

On the other hand, the pulse width of the BA1-clock pulse BA1-CLK may be equal to that of the B-clock pulse B-CLK. In this case, the rising edges of the respective clock pulses may coincide with each other and the falling edges thereof may coincide with each other.

Alternatively, the BA1-clock pulse BA1-CLK may be of two or more phases, not the single phase. For example, the BA1-clock pulse BA1-CLK may also be of two phases like the B-clock pulse B-CLK. As a detailed example, the first BA1-clock pulse may be set to be synchronized with the first B-clock pulse B-CLK_1, and the second BA1-clock pulse may be set to be synchronized with the second B-clock pulse B-CLK_2. In this case, the pulse width of the BA1-clock pulse BA1-CLK must be smaller than or equal to that of the B-clock pulse B-CLK_1 or B-CLK_2. Also, the timing between the BA1-clock pulse BA1-CLK and the B-clock pulse B-CLK conforms to the above conditions.

On the other hand, each of the A1-clock pulses A1-CLK_1 to A1-CLK_4 has a pulse width smaller than that of each of the B-clock pulses B-CLK_1 and B-CLK_2 and BA1-clock pulse BA1-CLK.

A1-scan pulses A1-SC_n−1 to A1-SC_n+2 are generated based on the A1-clock pulses A1-CLK_1 to A1-CLK_4. Accordingly, the pulse widths of adjacent ones of the A1-scan pulses A1-SC_n−1 to A1-SC_n+2 partially overlap each other, as shown in FIG. 4. The A1-scan pulses A1-SC_n−1 to A1-SC_n+2 are sequentially output once for one frame period.

B1-scan pulses B1-SC_n−1 to B1-SC_n+1 are generated based on the BA1-clock pulse BA1-CLK. Accordingly, each of the B1-scan pulses B1-SC_n−1 to B1-SC_n+1 has the same shape as that of the BA1-clock pulse BA1-CLK and is output with the same timing as that of the BA1-clock pulse BA1-CLK, as shown in FIG. 4. Each of the B1-scan pulses B1-SC_n−1 to B1-SC_n+1 is output once in one frame period. In this regard, the B1-scan pulses B1-SC_n−1 to B1-SC_n+1 are changed in output position on a frame period basis. For example, as shown in FIG. 4, the B1-scan pulse B1-SC_n−1 may be output from the (n−1)th stage in the leftmost, first frame period, the B1-scan pulse B1-SC_n may be output from the nth stage in the second frame period positioned at the right-hand side of the first frame period, and the B1-scan pulse B1-SC_n+1 may be output from the (n+1)th stage in the third frame period positioned at the right-hand side of the second frame period.

Because the B1-scan pulses B1-SC_n−1 to B1-SC_n+1 are changed in output position on a frame period basis in this manner, the distance between an A1-scan pulse A1-SC and a B1-scan pulse B1-SC output as one composite pulse (first composite pulse) to the same gate line in one frame period is gradually reduced as shown in FIG. 4.

On the other hand, when a period of one frame period T_F in which the first to fourth A1-clock pulses A1-CLK_1 to A1-CLK_4 are output is defined as an A1-output period T_A1 and the remaining period of the one frame period T_F is defined as the B1-output period T_B1 as stated previously, all of the first to fourth A1-clock pulses A1-CLK_1 to A1-CLK_4 may be kept low in the B1-output period T_B1 of the one frame period T_F, as shown in FIG. 4. Alternatively, in this B1-output period T_B1, the first to fourth A1-clock pulses A1-CLK_1 to A1-CLK_4 may be output in the same manner as in the A1-output period T_A1.

Figure 5:
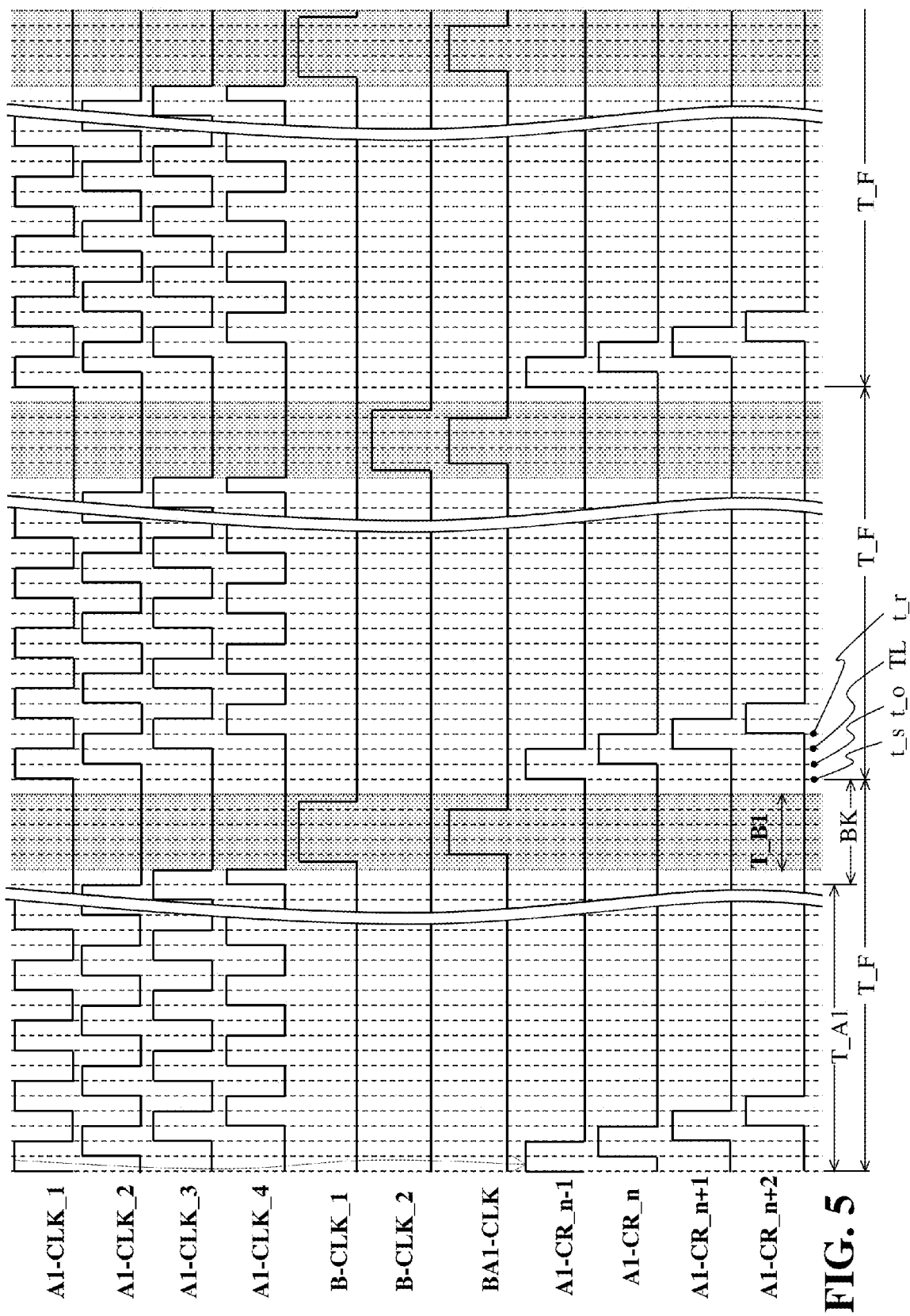
FIG. 5 is a timing diagram illustrating an example of the A1-clock pulse, B-clock pulse and BA1-clock pulse, and A1-carry pulses generated thereby.

FIG. 5 is a timing diagram illustrating an example of the A1-clock pulse A1-CLK, B-clock pulse B-CLK and BA1-clock pulse BA1-CLK, and A1-carry pulses generated thereby.

A1-carry pulses A1-CR_n−1 to A1-CR_n+2 are generated based on the A1-clock pulses A1-CLK_1 to A1-CLK_4. Accordingly, the pulse widths of adjacent ones of the A1-carry pulses A1-CR_n−1 to A1-CR_n+2 partially overlap each other, as shown in FIG. 5. The A1-carry pulses A1-CR_n−1 to A1-CR_n+2 are sequentially output once for one frame period. Here, the A1-carry pulses A1-CR_n−1 to A1-CR_n+2 are substantially the same as the A1-scan pulses A1-SC_n−1 to A1-SC_n+2.

Figure 6:
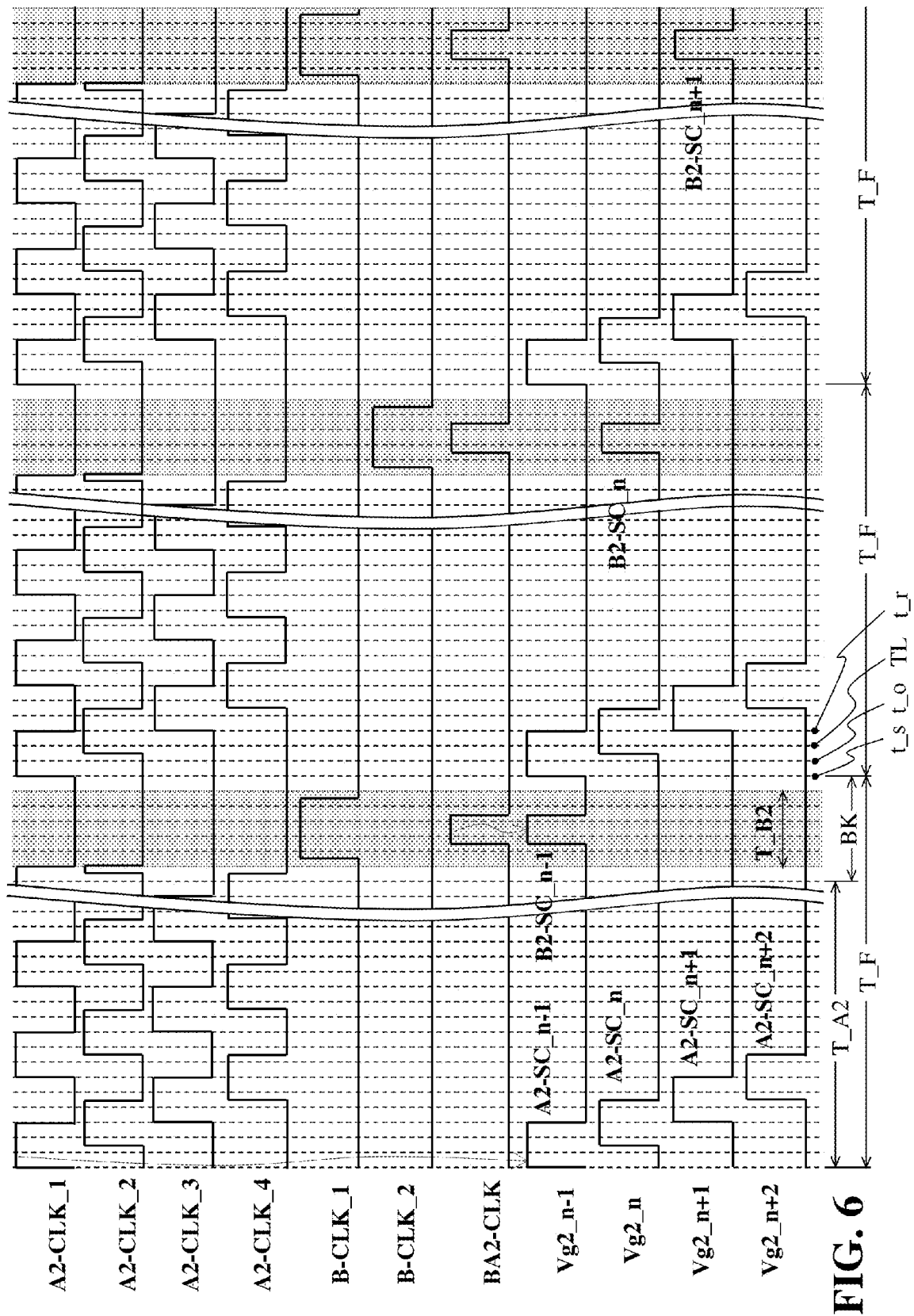
FIG. 6 is a timing diagram illustrating an example of an A2-clock pulse, a B-clock pulse and a BA2-clock pulse, and A2-scan pulses generated thereby.

FIG. 6 is a timing diagram illustrating an example of an A2-clock pulse A2-CLK, a B-clock pulse B-CLK and a BA2-clock pulse BA2-CLK, and A2-scan pulses generated thereby.

As shown in FIG. 6, the A2-clock pulse A2-CLK may be composed of clock pulses A2-CLK_1 to A2-CLK_4 of four phases, the B-clock pulse B-CLK may be composed of clock pulses B-CLK_1 and B-CLK_2 of two phases, and the BA2-clock pulse BA2-CLK may be composed of a clock pulse BA2-CLK of one phase.

The A2-clock pulse A2-CLK may include first to fourth A2-clock pulses A2-CLK_1 to A2-CLK_4 having different phases and the same pulse widths. Here, the pulse widths of adjacent ones of the first to fourth A2-clock pulses A2-CLK_1 to A2-CLK_4 may partially overlap each other. FIG. 6 shows an example in which the respective pulse widths of the adjacent A2-clock pulses A2-CLK overlap each other by ½. It should be noted that this is but one example and the overlap size is changeable to any value. Alternatively, the A2-clock pulses A2-CLK may be output without overlap in their pulse widths.

When the A2-clock pulses A2-CLK_1 to A2-CLK_4 are output without overlap in their pulse widths, an A2-carry pulse from the A2-sub-stage A2-Sub of the (n+1)th stage ST_n+1, not the above (n+2)th stage ST_n+2, may be used to reset the A2-sub-stage A2-Sub of the nth stage ST_n.

The A2-clock pulse A2-CLK is used as an A2-scan pulse A2-SC and an A2-carry pulse A2-CR. For example, when the A2-clock pulses A2-CLK_1 to A2-CLK_4 of four phases are used as shown in FIG. 6, a (4x+1)th stage may receive the first A2-clock pulse A2-CLK_1 and output a (4x+1)th A2-scan pulse and a (4x+1)th A2-carry pulse, a (4x+2)th stage may receive the second A2-clock pulse A2-CLK_2 and output a (4x+2)th A2-scan pulse and a (4x+2)th A2-carry pulse, a (4x+3)th stage may receive the third A2-clock pulse A2-CLK_3 and output a (4x+3)th A2-scan pulse and a (4x+3)th A2-carry pulse, and a (4x+4)th stage may receive the fourth A2-clock pulse A2-CLK_4 and output a (4x+4)th A2-scan pulse and a (4x+4)th A2-carry pulse.

The B-clock pulse B-CLK is the same as that in FIG. 4, stated above, and a description thereof will thus be omitted.

The BA2-clock pulse BA2-CLK is used as a B2-scan pulse B2-SC. This BA2-clock pulse BA2-CLK is output synchronously with the first and second B-clock pulses B-CLK_1 and B-CLK_2. In other words, the BA2-clock pulse BA2-CLK is output in a B2-output period T_B2 of every frame period, too. Exceptionally, the BA2-clock pulse BA2-CLK has a narrower pulse width than that of the B-clock pulse B-CLK such that it is completely surrounded by the B-clock pulse B-CLK. On the other hand, the pulse width of the BA2-clock pulse BA2-CLK may be equal to that of the B-clock pulse B-CLK.

Alternatively, the BA2-clock pulse BA2-CLK may be of two or more phases, not the single phase. For example, the BA2-clock pulse BA2-CLK may also be of two phases like the B-clock pulse B-CLK. As a detailed example, the first BA2-clock pulse may be set to be synchronized with the first B-clock pulse B-CLK_1, and the second BA2-clock pulse may be set to be synchronized with the second B-clock pulse B-CLK_2. In this case, the pulse width of the BA2-clock pulse BA2-CLK must be smaller than or equal to that of the B-clock pulse B-CLK_1 or B-CLK_2. Also, the timing between the BA2-clock pulse BA2-CLK and the B-clock pulse B-CLK conforms to the above conditions.

On the other hand, each of the A2-clock pulses A2-CLK_1 to A2-CLK_4 has a pulse width smaller than that of each of the B-clock pulses B-CLK_1 and B-CLK_2 and larger than that of the BA2-clock pulse BA2-CLK. It should be noted that this is but one example and the relative sizes of the pulse widths of the A1-clock pulse, A2-clock pulse, B-clock pulse and BA-clock pulse to one another are freely settable to any values. Exceptionally, the pulse width of the B-clock pulse B-CLK_1 or B-CLK_2 must be larger than that of each of the BA1-clock pulse BA1-CLK and BA2-clock pulse BA2-CLK to contain both.

A2-scan pulses A2-SC_n−1 to A2-SC_n+2 are generated based on the A2-clock pulses A2-CLK_1 to A2-CLK_4. Accordingly, the pulse widths of adjacent ones of the A2-scan pulses A2-SC_n−1 to A2-SC_n+2 partially overlap each other, as shown in FIG. 6. The A2-scan pulses A2-SC_n−1 to A2-SC_n+2 are sequentially output once for one frame period.

B2-scan pulses B2-SC_n−1 to B2-SC_n+1 are generated based on the BA2-clock pulse BA2-CLK. Accordingly, each of the B2-scan pulses B2-SC_n−1 to B2-SC_n+1 has the same shape as that of the BA2-clock pulse BA2-CLK and is output with the same timing as that of the BA2-clock pulse BA2-CLK, as shown in FIG. 6. Each of the B2-scan pulses B2-SC_n−1 to B2-SC_n+1 is output once in one frame period. In this regard, the B2-scan pulses B2-SC_n−1 to B2-SC_n+1 are changed in output position on a frame period basis. For example, as shown in FIG. 6, the B2-scan pulse B2-SC_n−1 may be output from the (n−1)th stage in the leftmost, first frame period, the B2-scan pulse B2-SC_n may be output from the nth stage in the second frame period positioned at the right-hand side of the first frame period, and the B2-scan pulse B2-SC_n+1 may be output from the (n+1)th stage in the third frame period positioned at the right-hand side of the second frame period.

Because the B2-scan pulses B2-SC_n−1 to B2-SC_n+1 are changed in output position on a frame period basis in this manner, the distance between an A2-scan pulse A2-SC and a B2-scan pulse B2-SC output as one composite pulse (second composite pulse) to the same gate line in one frame period is gradually reduced as shown in FIG. 6.

On the other hand, when a period of one frame period T_F in which the first to fourth A2-clock pulses A2-CLK_1 to A2-CLK_4 are output is defined as an A2-output period T_A2 and the remaining period of the one frame period T_F is defined as the B2-output period T_B2 as stated previously, all of the first to fourth A2-clock pulses A2-CLK_1 to A2-CLK_4 may be kept low in the B2-output period T_B2 of the one frame period T_F, as shown in FIG. 6. Alternatively, in this B2-output period T_B2, the first to fourth A2-clock pulses A2-CLK_1 to A2-CLK_4 may be output in the same manner as in the A2-output period T_A2.

Figure 7:
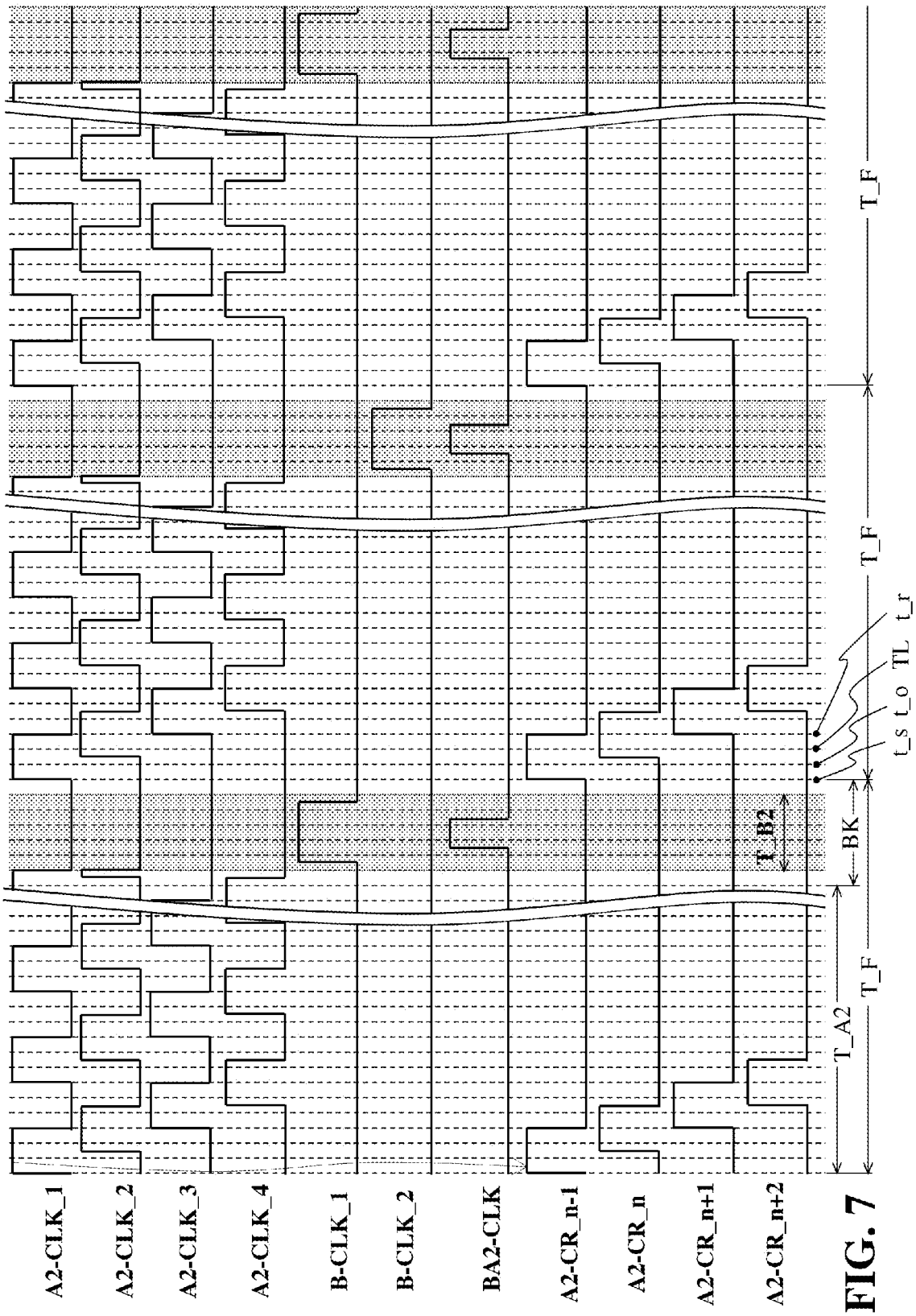
FIG. 7 is a timing diagram illustrating an example of the A2-clock pulse, B-clock pulse and BA2-clock pulse, and A2-carry pulses generated thereby.

FIG. 7 is a timing diagram illustrating an example of the A2-clock pulse A2-CLK, B-clock pulse B-CLK and BA2-clock pulse BA2-CLK, and A2-carry pulses generated thereby. A2-carry pulses A2-CR_n−1 to A2-CR_n+2 are generated based on the A2-clock pulses A2-CLK_1 to A2-CLK_4. Accordingly, the pulse widths of adjacent ones of the A2-carry pulses A2-CR_n−1 to A2-CR_n+2 partially overlap each other, as shown in FIG. 7. The A2-carry pulses A2-CR_n−1 to A2-CR_n+2 are sequentially output once for one frame period. Here, the A2-carry pulses A2-CR_n−1 to A2-CR_n+2 are substantially the same as the A2-scan pulses A2-SC_n−1 to A2-SC_n+2.

Figure 8:
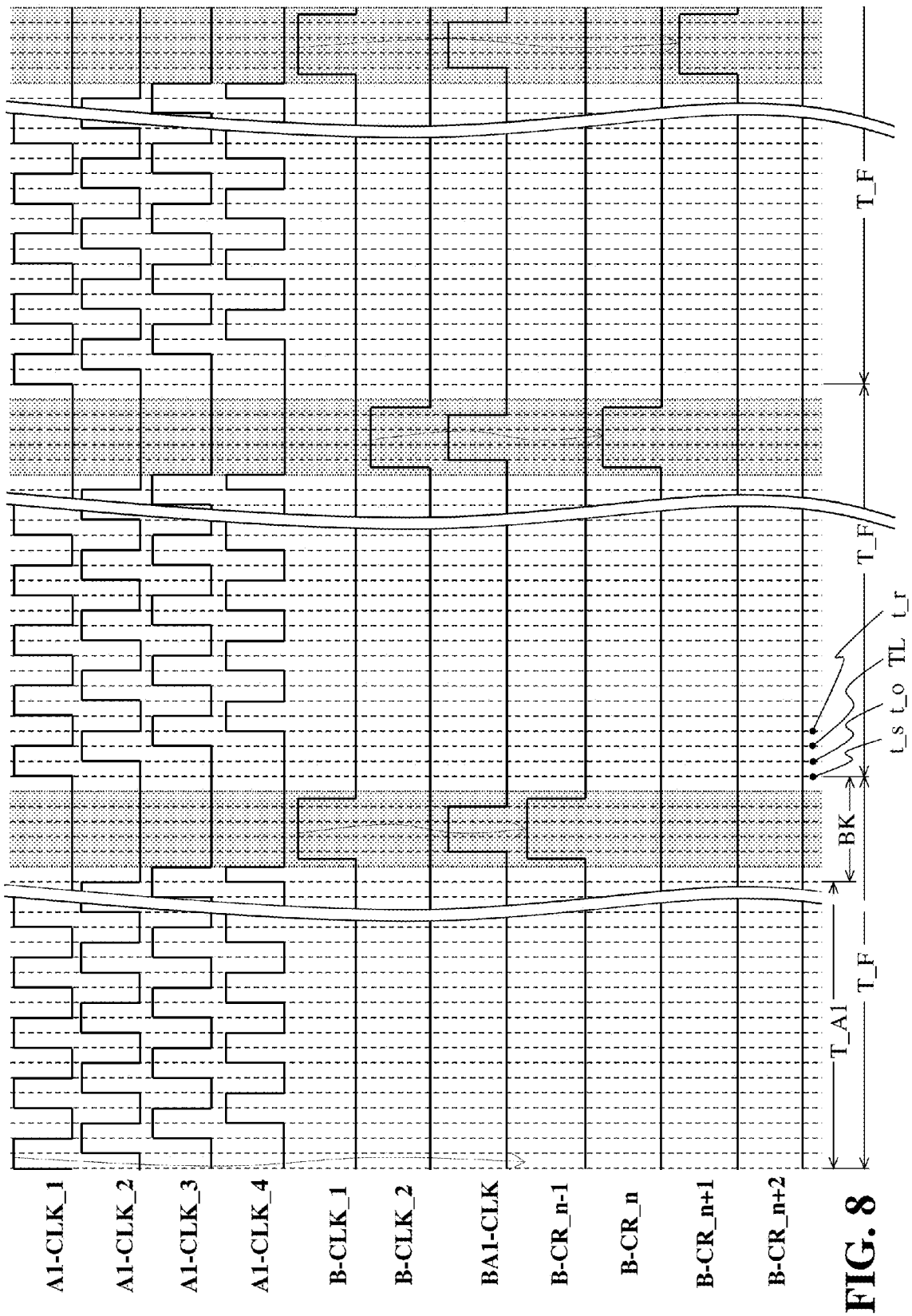
FIG. 8 is a timing diagram illustrating an example of the A1-clock pulse, B-clock pulse and BA1-clock pulse, and B-carry pulses generated thereby.

FIG. 8 is a timing diagram illustrating an example of the A1-clock pulse A1-CLK, B-clock pulse B-CLK and BA1-clock pulse BA1-CLK, and B-carry pulses generated thereby.

B-carry pulses B-CR_n−1 to B-CR_n+2 are generated based on the B-clock pulses B-CLK_1 and B-CLK_2. Accordingly, each of the B-carry pulses B-CR_n−1 to B-CR_n+2 has the same shape as that of a corresponding one of the B-clock pulses B-CLK_1 and B-CLK_2 and is output with the same timing as that of the corresponding B-clock pulse, as shown in FIG. 8. Each of the B-carry pulses B-CR_n−1 to B-CR_n+2 is output once in one frame period. In this regard, the B-carry pulses B-CR_n−1 to B-CR_n+2 are changed in output position on a frame period basis. For example, as shown in FIG. 8, the B-carry pulse B-CR_n−1 may be output from the (n−1)th B-sub-stage B-Sub in the leftmost, first frame period T_F, the B-carry pulse B-CR_n may be output from the nth B-sub-stage B-Sub in the second frame period T_F positioned at the right-hand side of the first frame period, and the B-carry pulse B-CR_n+1 may be output from the (n+1)th B-sub-stage B-Sub in the third frame period T_F positioned at the right-hand side of the second frame period. Here, the B-carry pulses B-CR_n−1 to B-CR_n+2 are synchronized with the B1-scan pulses B1-SC_n−1 to B1-SC_n+2 and the B2-scan pulses B2-SC_n−1 to B2-SC_n+2.

On the other hand, in FIGS. 4 to 8, the A1-clock pulse A1-CLK may be of a phases, the B-clock pulse B-CLK may be of a*b phases, and the BA1-clock pulse BA1-CLK may be of a*c phases. Here, a is a natural number greater than 1, a*b is a natural number greater than 1, and a*c is a natural number equal to or greater than 1.

The period of the BA1-clock pulse BA1-CLK is a*c times the output generation period of the B-sub-stage B-Sub. For several examples, the respective clock pulses may be of:

1) A1-clock pulse A1-CLK: 4 phases, B-clock pulse B-CLK: 2 phases, and BA1-clock pulse BA1-CLK: 1 phase;

2) A1-clock pulse A1-CLK: 4 phases, B-clock pulse B-CLK: 2 phases, and BA1-clock pulse BA1-CLK: 2 phases (or 4 phases); or 3) A1-clock pulse A1-CLK: 6 phases, B-clock pulse B-CLK: 2 phases, and BA1-clock pulse BA1-CLK: 2 phases (or 4 phases).

On the other hand, the A2-clock pulse, B-clock pulse and BA2-clock pulse may be configured in the same manner as the above.

In this manner, the scan output controller SOC according to the present invention generates a desired scan pulse (including an A1-scan pulse A1-SC, a B1-scan pulse B1-SC, an A2-scan pulse A2-SC and a B2-scan pulse B2-SC) using an A1-clock pulse A1-CLK, an A2-clock pulse A2-CLK, a B-clock pulse B-CLK, a BA1-clock pulse BA1-CLK and a BA2-clock pulse BA2-CLK. Therefore, output switching devices formed in the scan output controller SOC do not need to be large in size, and the voltage of the scan pulse is also prevented from being attenuated. In addition, a B-sub-stage of one stage is shared by a plurality of A-sub-stages of the same stage, so that a plurality of composite pulses can be output from the one stage using only a small number of switching devices.

Hereinafter, the configuration of the scan output controller SOC according to the present invention will be described in detail.

First Embodiment of Scan Output Controller SOC

Figure 9:
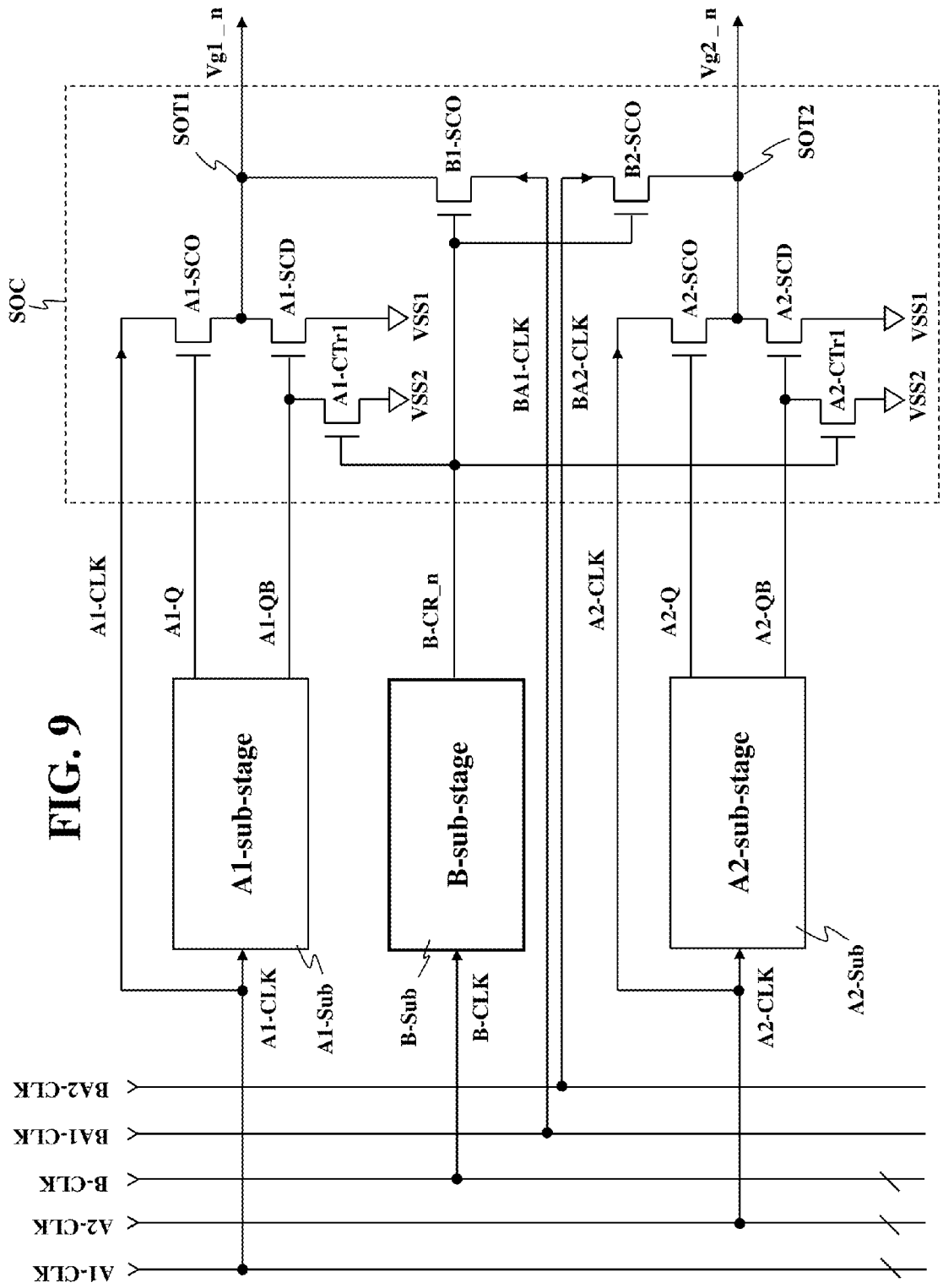
FIG. 9 is a circuit diagram of a first embodiment of a scan output controller according to the present invention.

FIG. 9 is a circuit diagram of a first embodiment of the scan output controller SOC according to the present invention.

Because all stages are the same in configuration, the configuration of the scan output controller SOC of the nth stage will be representatively described.

The scan output controller SOC according to the first embodiment includes, as shown in FIG. 9, an A1-scan output switching device A1-SCO, a B1-scan output switching device B1-SCO, an A1-scan discharge switching device A1-SCD, a first A1-control switching device A1-CTr1, an A2-scan output switching device A2-SCO, a B2-scan output switching device B2-SCO, an A2-scan discharge switching device A2-SCD, and a first A2-control switching device A2-CTr1.

The A1-scan output switching device A1-SCO is controlled by a voltage at an A1-set node A1-Q and is connected between an A1-clock transfer line and a first scan output terminal SOT1. That is, the A1-scan output switching device A1-SCO is turned on or off in response to the voltage at the A1-set node A1-Q, and interconnects the A1-clock transfer line and the first scan output terminal SOT1 when turned on. Here, the A1-clock transfer line is supplied with an A1-clock pulse A1-CLK.

The B1-scan output switching device B1-SCO is controlled by a B-carry pulse B-CR_n from a B-sub-stage B-Sub and is connected between the first scan output terminal SOT1 and a BA1-clock transfer line. That is, the B1-scan output switching device B1-SCO is turned on or off in response to the B-carry pulse B-CR_n, and interconnects the first scan output terminal SOT1 and the BA1-clock transfer line when turned on. Here, the BA1-clock transfer line is supplied with a BA1-clock pulse BA1-CLK.

The A1-scan discharge switching device A1-SCD is controlled by a voltage at an A1-reset node A1-QB and is connected between the first scan output terminal SOT1 and a first discharging voltage line. That is, the A1-scan discharge switching device A1-SCD is turned on or off in response to the voltage at the A1-reset node A1-QB, and interconnects the first scan output terminal SOT1 and the first discharging voltage line when turned on. Here, the first discharging voltage line is supplied with a first discharging voltage VSS1.

The first A1-control switching device A1-CTr1 is controlled by the B-carry pulse B-CR_n and is connected between the A1-reset node A1-QB and a second discharging voltage line. That is, the first A1-control switching device A1-CTr1 is turned on or off in response to the B-carry pulse B-CR_n, and interconnects the A1-reset node A1-QB and the second discharging voltage line when turned on. Here, the second discharging voltage line is supplied with a second discharging voltage VSS2.

This first A1-control switching device A1-CTr1 acts to make the A1-reset node A1-QB discharged (namely, low) irrespective of an output from an A1-inverter to be described later in detail.

The A2-scan output switching device A2-SCO is controlled by a voltage at an A2-set node A2-Q and is connected between an A2-clock transfer line and a second scan output terminal SOT2. That is, the A2-scan output switching device A2-SCO is turned on or off in response to the voltage at the A2-set node A2-Q, and interconnects the A2-clock transfer line and the second scan output terminal SOT2 when turned on. Here, the A2-clock transfer line is supplied with an A2-clock pulse A2-CLK.

The B2-scan output switching device B2-SCO is controlled by the B-carry pulse B-CR_n from the B-sub-stage B-Sub and is connected between the second scan output terminal SOT2 and a BA2-clock transfer line. That is, the B2-scan output switching device B2-SCO is turned on or off in response to the B-carry pulse B-CR_n, and interconnects the second scan output terminal SOT2 and the BA2-clock transfer line when turned on. Here, the BA2-clock transfer line is supplied with a BA2-clock pulse BA2-CLK.

The A2-scan discharge switching device A2-SCD is controlled by a voltage at an A2-reset node A2-QB and is connected between the second scan output terminal SOT2 and the first discharging voltage line. That is, the A2-scan discharge switching device A2-SCD is turned on or off in response to the voltage at the A2-reset node A2-QB, and interconnects the second scan output terminal SOT2 and the first discharging voltage line when turned on.

The first A2-control switching device A2-CTr1 is controlled by the B-carry pulse B-CR_n and is connected between the A2-reset node A2-QB and the second discharging voltage line. That is, the first A2-control switching device A2-CTr1 is turned on or off in response to the B-carry pulse B-CR_n, and interconnects the A2-reset node A2-QB and the second discharging voltage line when turned on.

This first A2-control switching device A2-CTr1 acts to make the A2-reset node A2-QB discharged (namely, low) irrespective of an output from an A2-inverter to be described later in detail.

On the other hand, the B-carry pulse B-CR_n is provided from the B-sub-stage B-Sub through a B-carry output terminal B-COT of the B-sub-stage B-Sub.

Second Embodiment of Scan Output Controller SOC

Figure 10:
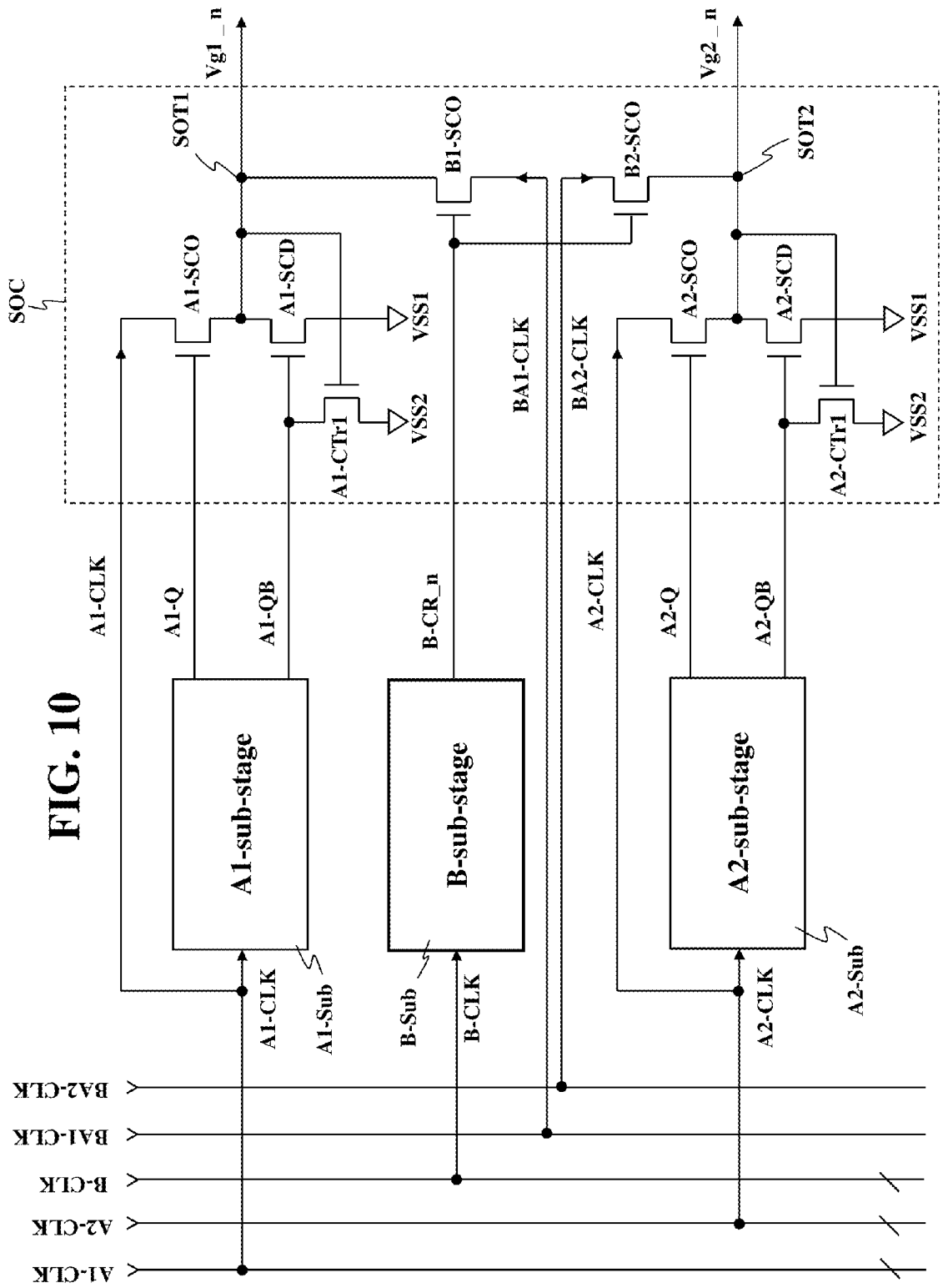
FIG. 10 is a circuit diagram of a second embodiment of the scan output controller according to the present invention.

FIG. 10 is a circuit diagram of a second embodiment of the scan output controller SOC according to the present invention.

The scan output controller SOC according to the second embodiment includes, as shown in FIG. 10, an A1-scan output switching device A1-SCO, a B1-scan output switching device B1-SCO, an A1-scan discharge switching device A1-SCD, a first A1-control switching device A1-CTr1, an A2-scan output switching device A2-SCO, a B2-scan output switching device B2-SCO, an A2-scan discharge switching device A2-SCD, and a first A2-control switching device A2-CTr1.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the second embodiment are the same as those in the first embodiment, stated above, respectively, and a description thereof will thus be replaced by the above description of the first embodiment.

The first A1-control switching device A1-CTr1 in the second embodiment is controlled by a voltage at the first scan output terminal SOT1 and is connected between the A1-reset node A1-QB and a second discharging voltage line. That is, the first A1-control switching device A1-CTr1 is turned on or off in response to the voltage at the first scan output terminal SOT1, and interconnects the A1-reset node A1-QB and the second discharging voltage line when turned on.

The first A2-control switching device A2-CTr1 in the second embodiment is controlled by a voltage at the second scan output terminal SOT2 and is connected between the A2-reset node A2-QB and the second discharging voltage line. That is, the first A2-control switching device A2-CTr1 is turned on or off in response to the voltage at the second scan output terminal SOT2, and interconnects the A2-reset node A2-QB and the second discharging voltage line when turned on.

Third Embodiment of Scan Output Controller SOC

Figure 11:
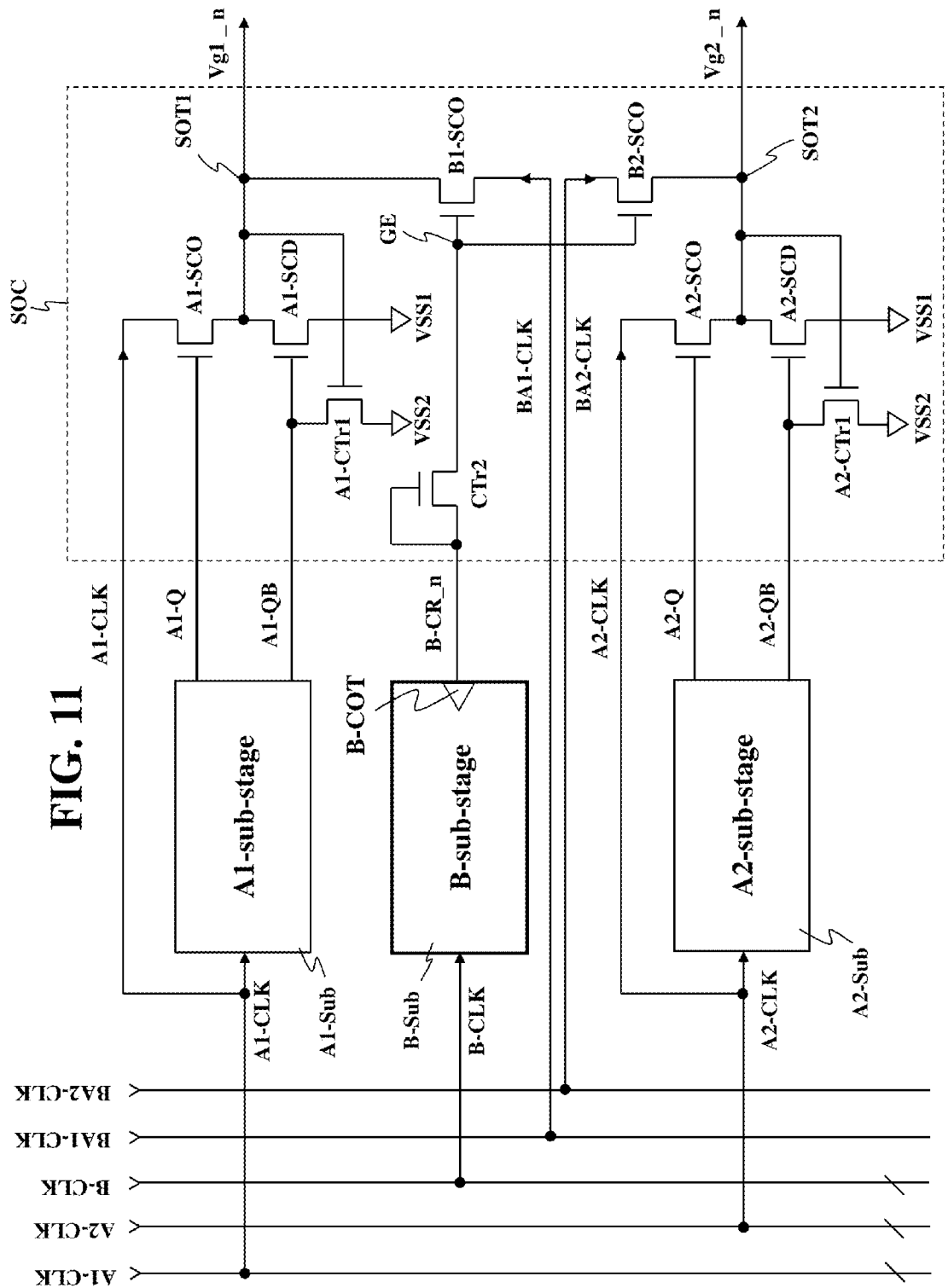
FIG. 11 is a circuit diagram of a third embodiment of the scan output controller according to the present invention.

FIG. 11 is a circuit diagram of a third embodiment of the scan output controller SOC according to the present invention.

The scan output controller SOC according to the third embodiment includes, as shown in FIG. 11, an A1-scan output switching device A1-SCO, a B1-scan output switching device B1-SCO, an A1-scan discharge switching device A1-SCD, a first A1-control switching device A1-CTr1, an A2-scan output switching device A2-SCO, a B2-scan output switching device B2-SCO, an A2-scan discharge switching device A2-SCD, a first A2-control switching device A2-CTr1, and a second control switching device CTr2.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the third embodiment are the same as those in the first embodiment, stated above, respectively, and a description thereof will thus be replaced by the above description of the first embodiment.

Also, the first A1-control switching device A1-CTr1 and first A2-control switching device A2-CTr1 in the third embodiment are the same as those in the second embodiment, stated above, respectively, and a description thereof will thus be replaced by the above description of the second embodiment.

The second control switching device CTr2 in the third embodiment is controlled by the B-carry pulse B-CR_n from the B-sub-stage B-Sub and is connected between the B-carry output terminal B-COT of the B-sub-stage B-Sub and the gate electrode GE of the B1-scan output switching device B1-SCO. That is, the second control switching device CTr2 is turned on or off in response to the B-carry pulse B-CR_n, and interconnects the B-carry output terminal B-COT and the gate electrode GE of the B1-scan output switching device B1-SCO when turned on.

According to the third embodiment, the gate electrode GE of the B1-scan output switching device B1-SCO and the gate electrode GE of the B2-scan output switching device B2-SCO are connected to each other.

On the other hand, a signal (B-carry pulse B-CR_n) output from the B-carry output terminal B-COT or a voltage applied to the gate electrode GE of the B1-scan output switching device B 1-SCO may be used as the above-stated B-set control signal and B-reset control signal.

On the other hand, the gate electrode of the first A1-control switching device A1-CTr1 and the gate electrode of the first A2-control switching device A2-CTr1 may be connected to the B-carry output terminal B-COT or the gate electrode GE of the B1-scan output switching device B1-SCO.

Fourth Embodiment of Scan Output Controller SOC

Figure 12:
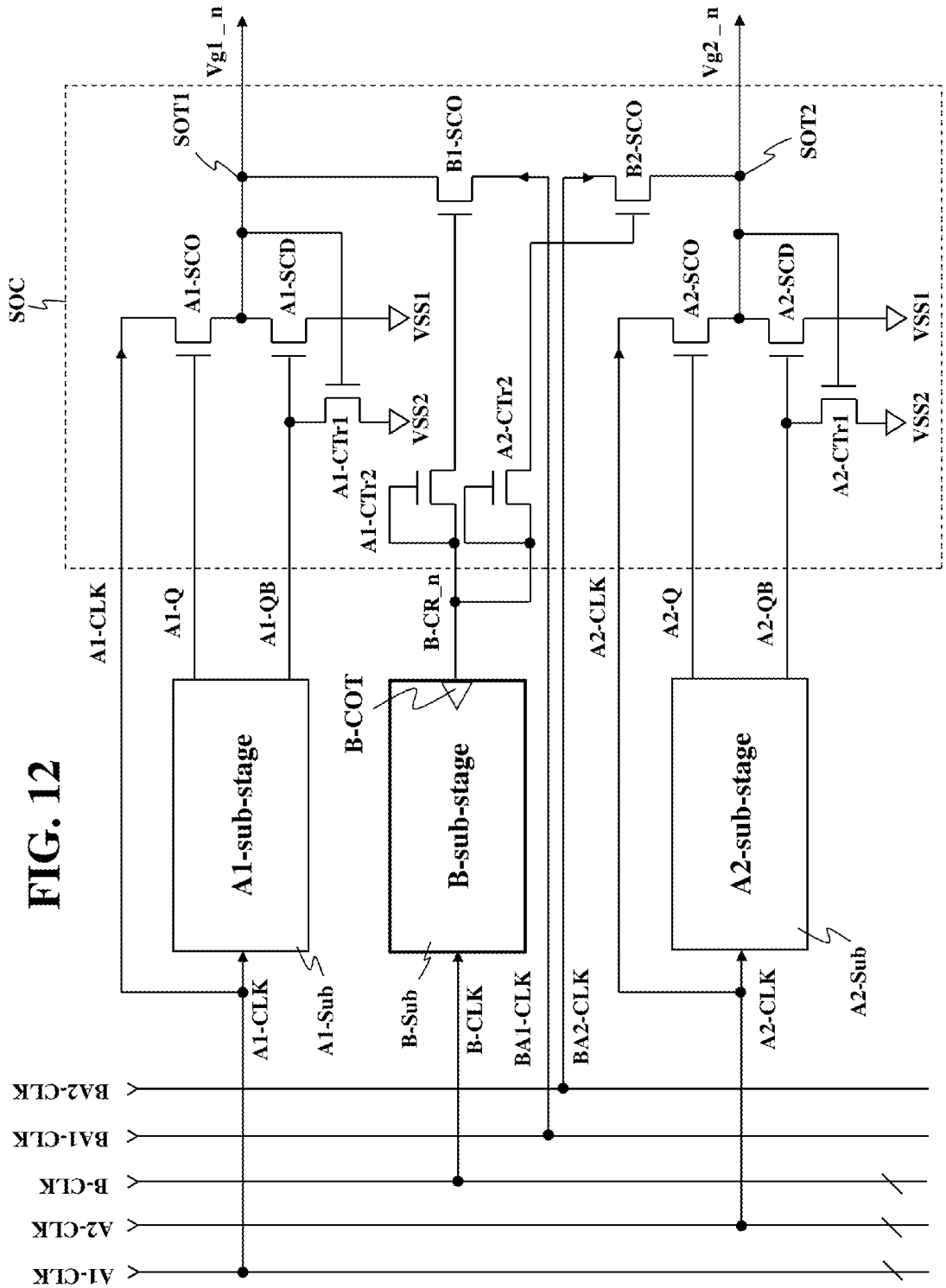
FIG. 12 is a circuit diagram of a fourth embodiment of the scan output controller according to the present invention.

FIG. 12 is a circuit diagram of a fourth embodiment of the scan output controller SOC according to the present invention.

The scan output controller SOC according to the fourth embodiment includes, as shown in FIG. 12, an A1-scan output switching device A1-SCO, a B1-scan output switching device B1-SCO, an A1-scan discharge switching device A1-SCD, a first A1-control switching device A1-CTr1, a second A1-control switching device A1-CTr2, an A2-scan output switching device A2-SCO, a B2-scan output switching device B2-SCO, an A2-scan discharge switching device A2-SCD, a first A2-control switching device A2-CTr1, and a second A2-control switching device A2-CTr2.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the fourth embodiment are the same as those in the first embodiment, stated above, respectively, and a description thereof will thus be replaced by the above description of the first embodiment.

Also, the first A1-control switching device A1-CTr1 and first A2-control switching device A2-CTr1 in the fourth embodiment are the same as those in the second embodiment, stated above, respectively, and a description thereof will thus be replaced by the above description of the second embodiment.

The second A1-control switching device A1-CTr2 in the fourth embodiment is controlled by the B-carry pulse B-CR_n from the B-sub-stage B-Sub and is connected between the B-carry output terminal B-COT of the B-sub-stage B-Sub and the gate electrode of the B1-scan output switching device B1-SCO. That is, the second A1-control switching device A1-CTr2 is turned on or off in response to the B-carry pulse B-CR_n, and interconnects the B-carry output terminal B-COT and the gate electrode of the B1-scan output switching device B1-SCO when turned on.

The second A2-control switching device A2-CTr2 in the fourth embodiment is controlled by the B-carry pulse B-CR_n from the B-sub-stage B-Sub and is connected between the B-carry output terminal B-COT of the B-sub-stage B-Sub and the gate electrode of the B2-scan output switching device B2-SCO. That is, the second A2-control switching device A2-CTr2 is turned on or off in response to the B-carry pulse B-CR_n, and interconnects the B-carry output terminal B-COT and the gate electrode of the B2-scan output switching device B2-SCO when turned on.

On the other hand, the gate electrode of the first A1-control switching device A1-CTr1 may be connected to the B-carry output terminal B-COT or the gate electrode of the B1-scan output switching device B1-SCO.

Also, the gate electrode of the first A2-control switching device A2-CTr1 may be connected to the B-carry output terminal B-COT or the gate electrode of the B2-scan output switching device B2-SCO.

Fifth Embodiment of Scan Output Controller SOC

Figure 13:
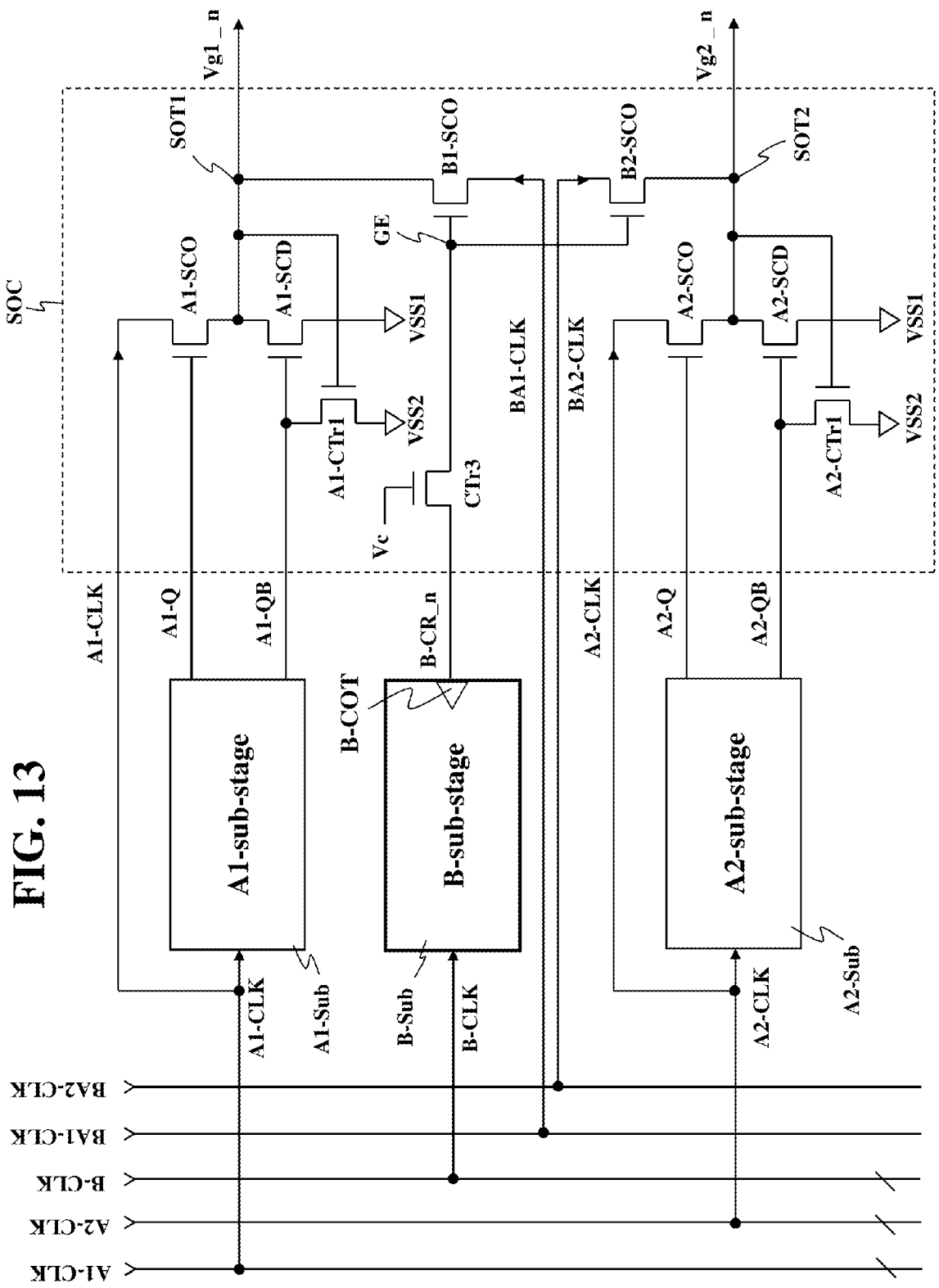
FIG. 13 is a circuit diagram of a fifth embodiment of the scan output controller according to the present invention.

FIG. 13 is a circuit diagram of a fifth embodiment of the scan output controller SOC according to the present invention.

The scan output controller SOC according to the fifth embodiment includes, as shown in FIG. 13, an A1-scan output switching device A1-SCO, a B1-scan output switching device B1-SCO, an A1-scan discharge switching device A1-SCD, a first A1-control switching device A1-CTr1, an A2-scan output switching device A2-SCO, a B2-scan output switching device B2-SCO, an A2-scan discharge switching device A2-SCD, a first A2-control switching device A2-CTr1, and a third control switching device CTr3.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the fifth embodiment are the same as those in the first embodiment, stated above, respectively, and a description thereof will thus be replaced by the above description of the first embodiment.

Also, the first A1-control switching device A1-CTr1 and first A2-control switching device A2-CTr1 in the fifth embodiment are the same as those in the second embodiment, stated above, respectively, and a description thereof will thus be replaced by the above description of the second embodiment.

The third control switching device CTr3 in the fifth embodiment is controlled by an external switching control signal Vc and is connected between the B-carry output terminal B-COT of the B-sub-stage B-Sub and the gate electrode GE of the B1-scan output switching device B1-SCO. That is, the third control switching device CTr3 is turned on or off in response to the switching control signal Vc, and interconnects the B-carry output terminal B-COT and the gate electrode GE of the B1-scan output switching device B1-SCO when turned on.

According to the fifth embodiment, the gate electrode GE of the B1-scan output switching device B1-SCO and the gate electrode GE of the B2-scan output switching device B2-SCO are connected to each other.

Figure 14:
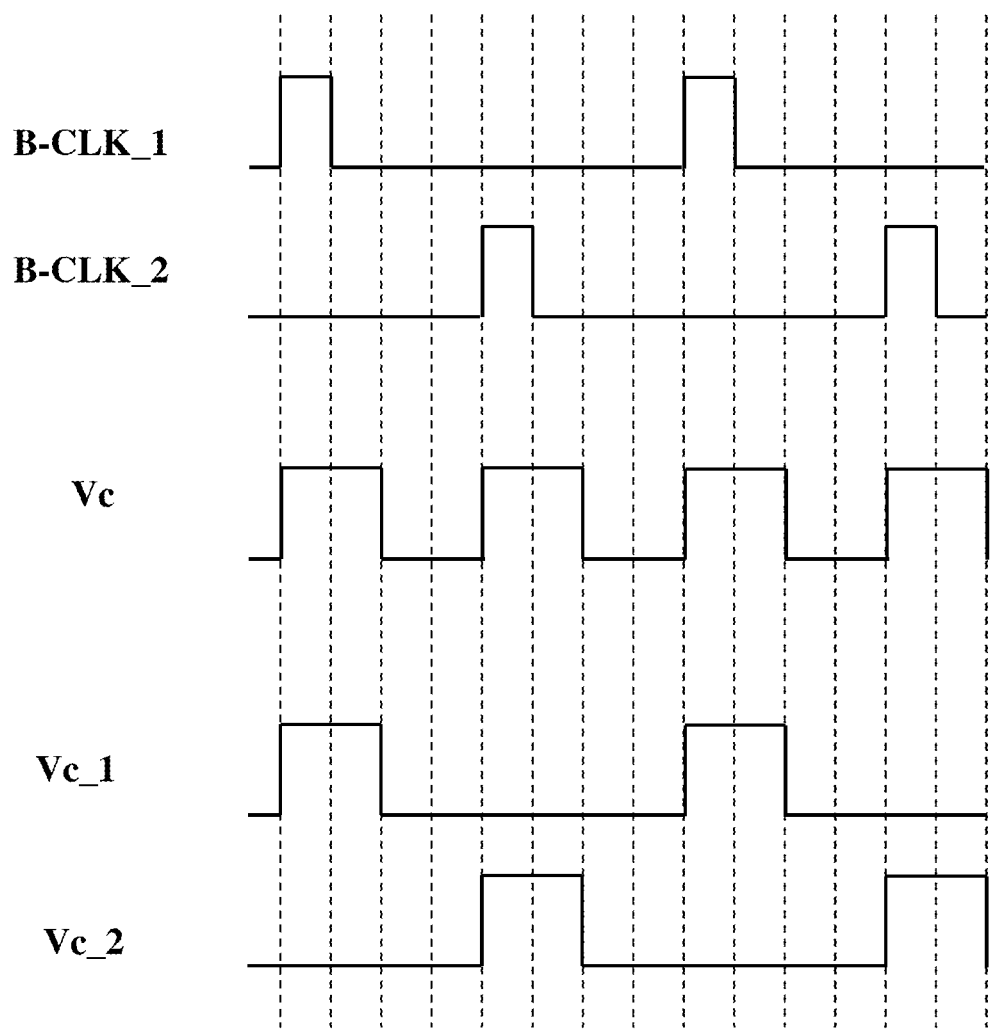
FIG. 14 is a timing diagram illustrating timing between a switching control signal and the B-clock pulse.

FIG. 14 is a timing diagram illustrating timing between the switching control signal and the B-clock pulse.

The switching control signal Vc may be any one of a direct current (DC) voltage and an alternating current (AC) voltage, and may have a waveform as shown in FIG. 14 when being the AC voltage. In this case, when the switching control signal Vc is of a single phase, odd-numbered pulses of the switching control signal Vc are output synchronously with the first B-clock pulse B-CLK_1 and even-numbered pulses thereof are output synchronously with the second B-clock pulse B-CLK_2.

On the other hand, when the switching control signal Vc is of two phases, it may be divided into a first switching control signal Vc1 and a second switching control signal Vc2. The first switching control signal Vc1 is composed of only the odd-numbered pulses among the above pulses of the switching control signal Vc, and the second switching control signal Vc2 is composed of only the even-numbered pulses among the above pulses of the switching control signal Vc. The pulses of the first switching control signal Vc1 are output synchronously with the first B-clock pulse B-CLK_1, and the pulses of the second switching control signal Vc2 are output synchronously with the second B-clock pulse B-CLK_2.

The switching control signal Vc may have a pulse width which is the same as or different from that of the B-clock pulse B-CLK_1 or B-CLK_2. On the other hand, the switching control signal Vc may have a wider pulse width than that of the B-clock pulse B-CLK_1 or B-CLK_2 such that it completely surrounds the B-clock pulse B-CLK_1 or B-CLK_2.

On the other hand, the gate electrode of the first A1-control switching device A1-CTr1 may be connected to the B-carry output terminal B-COT or the gate electrode GE of the B1-scan output switching device B1-SCO.

Also, the gate electrode of the first A2-control switching device A2-CTr1 may be connected to the B-carry output terminal B-COT or the gate electrode GE of the B2-scan output switching device B2-SCO.

Sixth Embodiment of Scan Output Controller SOC

Figure 15:
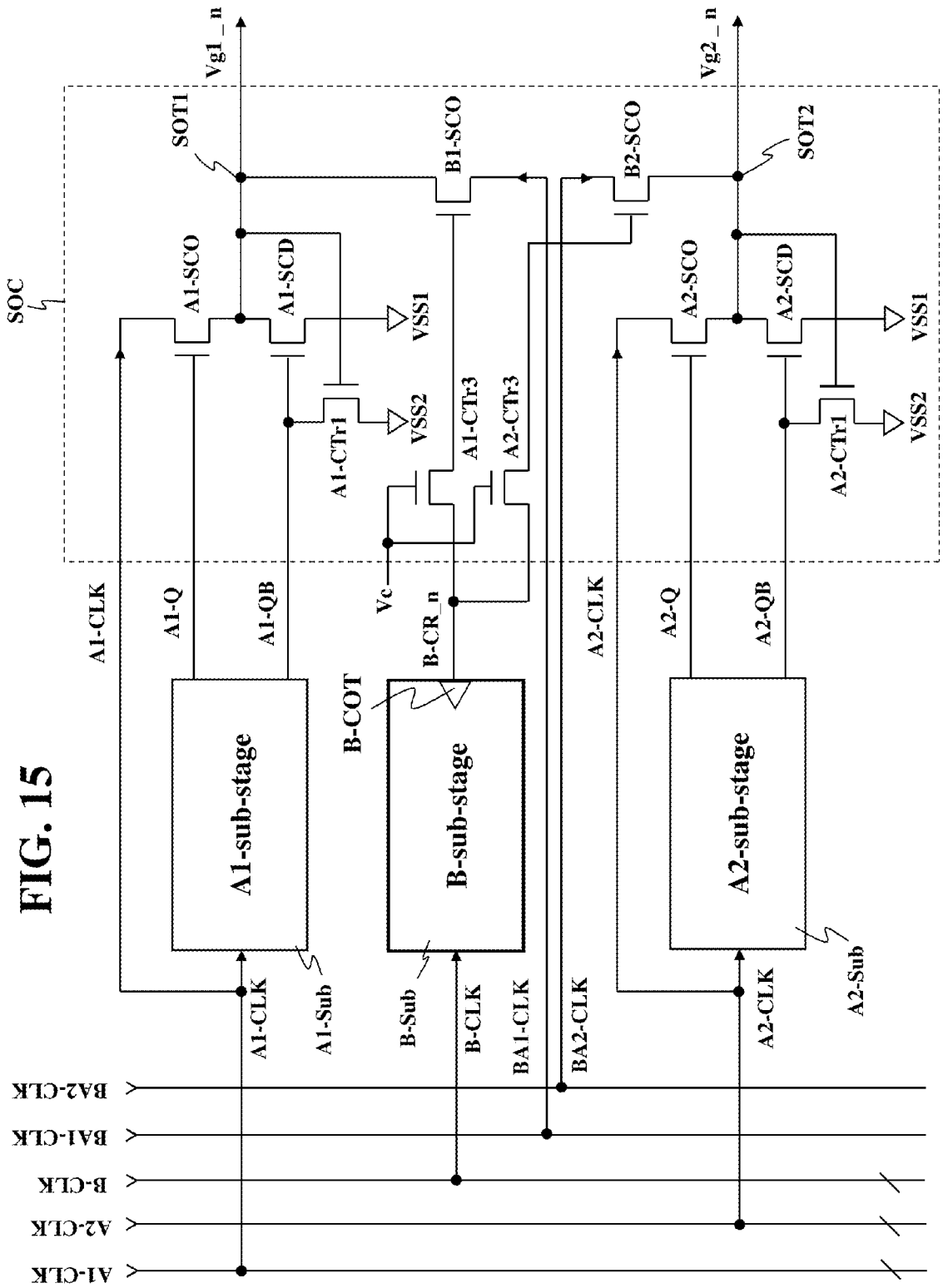
FIG. 15 is a circuit diagram of a sixth embodiment of the scan output controller according to the present invention.

FIG. 15 is a circuit diagram of a sixth embodiment of the scan output controller SOC according to the present invention.

The scan output controller SOC according to the sixth embodiment includes, as shown in FIG. 15, an A1-scan output switching device A1-SCO, a B1-scan output switching device B1-SCO, an A1-scan discharge switching device A1-SCD, a first A1-control switching device A1-CTr1, a third A1-control switching device A1-CTr3, an A2-scan output switching device A2-SCO, a B2-scan output switching device B2-SCO, an A2-scan discharge switching device A2-SCD, a first A2-control switching device A2-CTr1, and a third A2-control switching device A2-CTr3.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the sixth embodiment are the same as those in the first embodiment, stated above, respectively, and a description thereof will thus be replaced by the above description of the first embodiment.

Also, the first A1-control switching device A1-CTr1 and first A2-control switching device A2-CTr1 in the sixth embodiment are the same as those in the second embodiment, stated above, respectively, and a description thereof will thus be replaced by the above description of the second embodiment.

The third A1-control switching device A1-CTr3 in the sixth embodiment is controlled by an external switching control signal Vc and is connected between the B-carry output terminal B-COT of the B-sub-stage B-Sub and the gate electrode of the B1-scan output switching device B1-SCO. That is, the third A1-control switching device A1-CTr3 is turned on or off in response to the switching control signal Vc, and interconnects the B-carry output terminal B-COT and the gate electrode of the B1-scan output switching device B1-SCO when turned on. Here, the switching control signal Vc may have the aforementioned waveform shown in FIG. 14.

The third A2-control switching device A2-CTr3 in the sixth embodiment is controlled by the external switching control signal Vc and is connected between the B-carry output terminal B-COT of the B-sub-stage B-Sub and the gate electrode of the B2-scan output switching device B2-SCO. That is, the third A2-control switching device A2-CTr3 is turned on or off in response to the switching control signal Vc, and interconnects the B-carry output terminal B-COT and the gate electrode of the B2-scan output switching device B2-SCO when turned on. Here, the switching control signal Vc may have the aforementioned waveform shown in FIG. 14.

On the other hand, the gate electrode of the first A1-control switching device A1-CTr1 may be connected to the B-carry output terminal B-COT or the gate electrode of the B1-scan output switching device B1-SCO.

Also, the gate electrode of the first A2-control switching device A2-CTr1 may be connected to the B-carry output terminal B-COT or the gate electrode of the B2-scan output switching device B2-SCO.

FIG. 16 illustrates switching devices which may be additionally provided in the scan output controller SOC. The scan output controller SOC shown in FIG. 11 may further include at least one of seven control switching devices A1-CTr4 to A1-CTr6, A2-CTr4 to A2-CTr6 and CTr7 as shown in FIG. 16.

Each of the seven control switching devices A1-CTr4 to A1-CTr6, A2-CTr4 to A2-CTr6 and CTr7 will hereinafter be described in detail.

The fourth A1-control switching device A1-CTr4 shown in FIG. 16(*a*) is controlled by an A1-carry pulse from an A1-sub-stage A1-Sub and is connected between the gate electrode GE of the B1-scan output switching device B1-SCO and a third discharging voltage line which transfers a third discharging voltage VSS3. That is, the fourth A1-control switching device A1-CTr4 is turned on or off in response to the A1-carry pulse from an A1-carry output terminal A1-COT of the A1-sub-stage A1-Sub, and interconnects the gate electrode GE of the B1-scan output switching device B1-SCO and the third discharging voltage line when turned on.

The fifth A1-control switching device A1-CTr5 shown in FIG. 16(*b*) is controlled by the voltage at the A1-set node A1-Q of the A1-sub-stage A1-Sub and is connected between the gate electrode GE of the B1-scan output switching device B1-SCO and a fourth discharging voltage line which transfers a fourth discharging voltage VSS4. That is, the fifth A1-control switching device A1-CTr5 is turned on or off in response to the voltage at the A1-set node A1-Q, and interconnects the gate electrode GE of the B1-scan output switching device B1-SCO and the fourth discharging voltage line when turned on.

The sixth A1-control switching device A1-CTr6 shown in FIG. 16(*c*) is controlled by an A1-start pulse A1-Vst and is connected between the gate electrode GE of the B1-scan output switching device B1-SCO and a fifth discharging voltage line which transfers a fifth discharging voltage VSS5. That is, the sixth A1-control switching device A1-CTr6 is turned on or off in response to the A1-start pulse A1-Vst, and interconnects the gate electrode GE of the B1-scan output switching device B1-SCO and the fifth discharging voltage line when turned on. Here, the A1-start pulse A1-Vst is a start signal that is supplied to a first A1-sub-stage which is driven earliest among A1-sub-stages. The first A1-sub-stage operates first by the A1-start pulse A1-Vst.

The fourth A2-control switching device A2-CTr4 shown in FIG. 16(*d*) is controlled by an A2-carry pulse from an A2-sub-stage A2-Sub and is connected between the gate electrode GE of the B1-scan output switching device B1-SCO and the third discharging voltage line. That is, the fourth A2-control switching device A2-CTr4 is turned on or off in response to the A2-carry pulse from an A2-carry output terminal A2-COT of the A2-sub-stage A2-Sub, and interconnects the gate electrode GE of the B1-scan output switching device B1-SCO and the third discharging voltage line when turned on.

The fifth A2-control switching device A2-CTr5 shown in FIG. 16(*e*) is controlled by the voltage at the A2-set node A2-Q and is connected between the gate electrode GE of the B1-scan output switching device B1-SCO and the fourth discharging voltage line. That is, the fifth A2-control switching device A2-CTr5 is turned on or off in response to the voltage at the A2-set node A2-Q, and interconnects the gate electrode GE of the B1-scan output switching device B1-SCO and the fourth discharging voltage line when turned on.

The sixth A2-control switching device A2-CTr6 shown in FIG. 16(*f*) is controlled by an A2-start pulse A2-Vst and is connected between the gate electrode GE of the B1-scan output switching device B1-SCO and the fifth discharging voltage line. That is, the sixth A2-control switching device A2-CTr6 is turned on or off in response to the A2-start pulse A2-Vst, and interconnects the gate electrode GE of the B1-scan output switching device B1-SCO and the fifth discharging voltage line when turned on. Here, the A2-start pulse A2-Vst is a start signal that is supplied to a first A2-sub-stage which is driven earliest among A2-sub-stages. The first A2-sub-stage operates first by the A2-start pulse A2-Vst.

The seventh control switching device CTr7 shown in FIG. 16(*g*) is controlled by a voltage at a B-reset node B-QB and is connected between the gate electrode GE of the B1-scan output switching device B1-SCO and a sixth discharging voltage line which transfers a sixth discharging voltage VSS6.

That is, the seventh control switching device CTr7 is turned on or off in response to the voltage at the B-reset node B-QB, and interconnects the gate electrode GE of the B1-scan output switching device B1-SCO and the sixth discharging voltage line when turned on.

Seventh Embodiment of Scan Output Controller SOC

Figure 17:
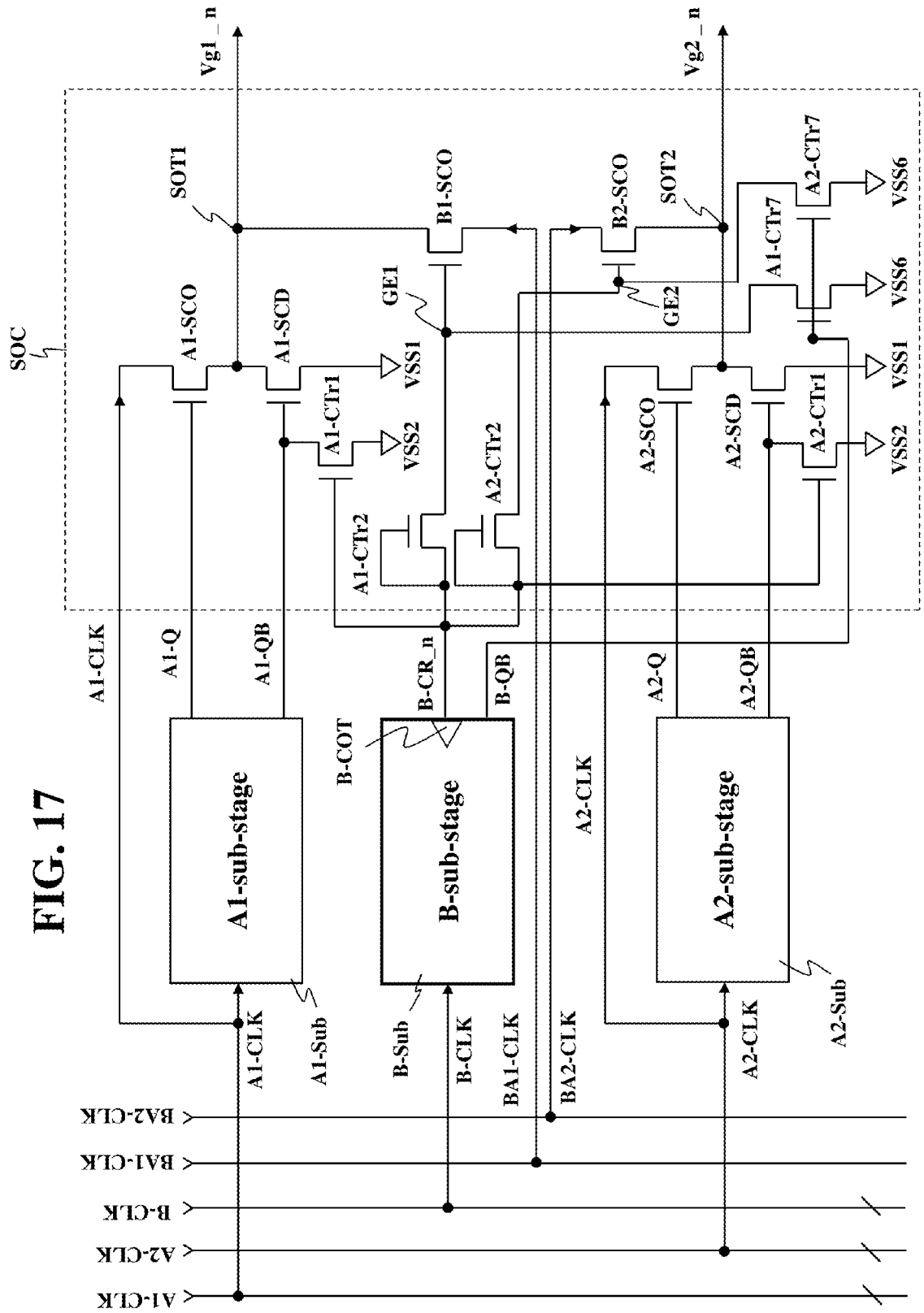
FIG. 17 is a circuit diagram of a seventh embodiment of the scan output controller according to the present invention.

FIG. 17 is a circuit diagram of a seventh embodiment of the scan output controller SOC according to the present invention.

The scan output controller SOC according to the seventh embodiment includes, as shown in FIG. 17, an A1-scan output switching device A1-SCO, a B1-scan output switching device B1-SCO, an A1-scan discharge switching device A1-SCD, a first A1-control switching device A1-CTr1, a second A1-control switching device A1-CTr2, a seventh A1-control switching device A1-CTr7, an A2-scan output switching device A2-SCO, a B2-scan output switching device B2-SCO, an A2-scan discharge switching device A2-SCD, a first A2-control switching device A2-CTr1, a second A2-control switching device A2-CTr2, and a seventh A2-control switching device A2-CTr7.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the seventh embodiment are the same as those in the first embodiment, stated above, respectively, and a description thereof will thus be replaced by the above description of the first embodiment.

Also, the first A1-control switching device A1-CTr1 and first A2-control switching device A2-CTr1 in the seventh embodiment are the same as those in the first embodiment, stated above, respectively, and a description thereof will thus be replaced by the above description of the first embodiment.

Also, the second A1-control switching device A1-CTr2 and second A2-control switching device A2-CTr2 in the seventh embodiment are the same as those in the fourth embodiment, stated above, respectively, and a description thereof will thus be replaced by the above description of the fourth embodiment.

The seventh A1-control switching device A1-CTr7 in the seventh embodiment is controlled by a voltage at a B-reset node B-QB of the B-sub-stage B-Sub and is connected between the gate electrode GE1 of the B1-scan output switching device B1-SCO and a sixth discharging voltage line which transfers a sixth discharging voltage VSS6. That is, the seventh A1-control switching device A1-CTr7 is turned on or off in response to the voltage at the B-reset node B-QB, and interconnects the gate electrode GE1 of the B1-scan output switching device B1-SCO and the sixth discharging voltage line when turned on.

The seventh A2-control switching device A2-CTr7 in the seventh embodiment is controlled by the voltage at the B-reset node B-QB of the B-sub-stage B-Sub and is connected between the gate electrode GE2 of the B2-scan output switching device B2-SCO and the sixth discharging voltage line. That is, the seventh A2-control switching device A2-CTr7 is turned on or off in response to the voltage at the B-reset node B-QB, and interconnects the gate electrode GE2 of the B2-scan output switching device B2-SCO and the sixth discharging voltage line when turned on.

On the other hand, the gate electrode of the first A1-control switching device A1-CTr1 may be connected to the gate electrode GE1 of the B1-scan output switching device B1-SCO or the first scan output terminal SOT1.

Also, the gate electrode of the first A2-control switching device A2-CTr1 may be connected to the gate electrode GE2 of the B2-scan output switching device B2-SCO or the second scan output terminal SOT2.

Figure 18:
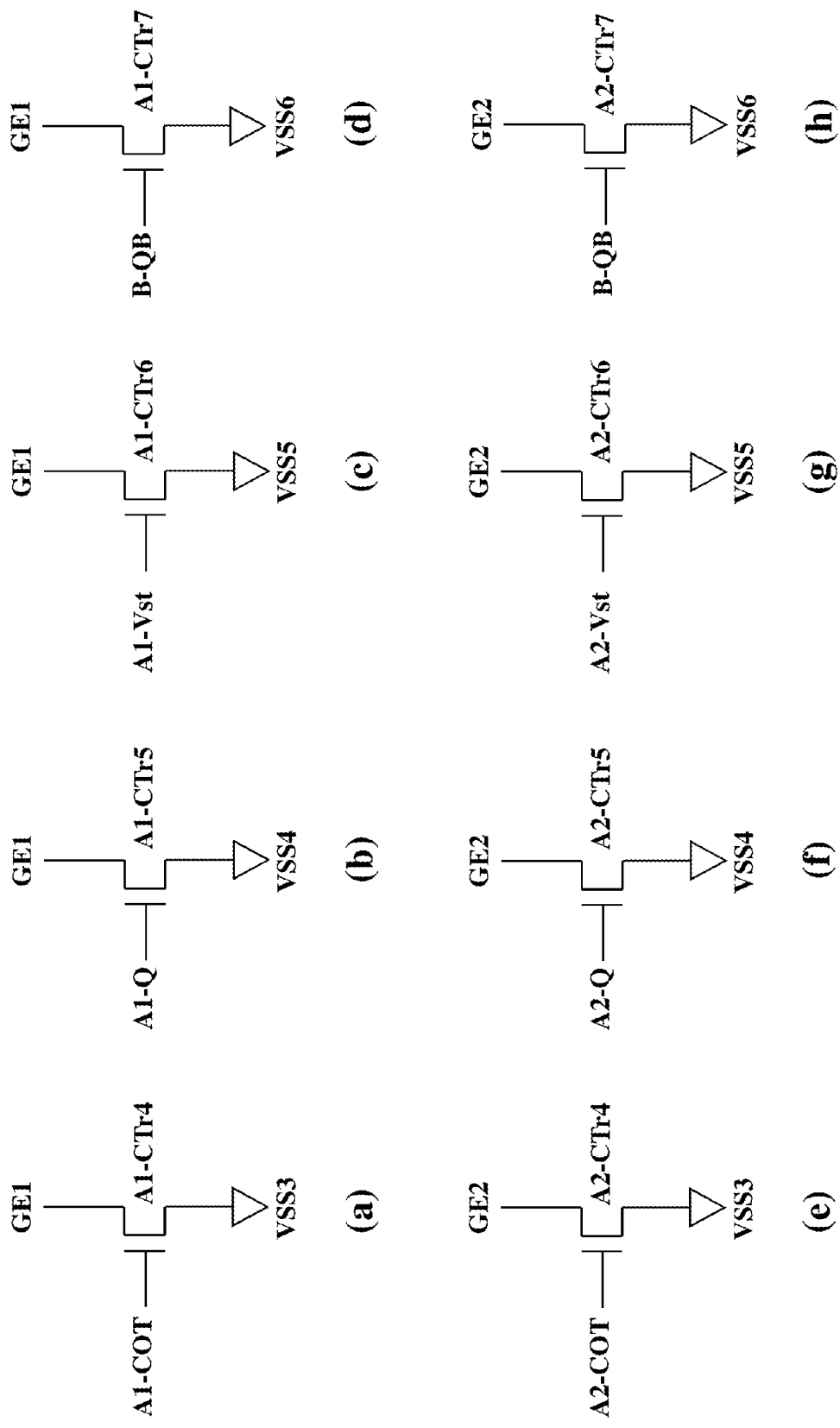
FIG. 18 is a view illustrating switching devices which may be additionally provided in the scan output controller.

FIG. 18 illustrates switching devices which may be additionally provided in the scan output controller SOC. The scan output controller SOC shown in FIG. 17 may further include at least one of eight control switching devices A1-CTr4 to A1-CTr7 and A2-CTr4 to A2-CTr7 shown in FIG. 18.

Each of the eight control switching devices A1-CTr4 to A1-CTr7 and A2-CTr4 to A2-CTr7 will hereinafter be described in detail.

The fourth A1-control switching device A1-CTr4 shown in FIG. 18(*a*) is controlled by an A1-carry pulse from an A1-sub-stage A1-Sub and is connected between the gate electrode GE1 of the B1-scan output switching device B1-SCO and a third discharging voltage line which transfers a third discharging voltage VSS3. That is, the fourth A1-control switching device A1-CTr4 is turned on or off in response to the A1-carry pulse from an A1-carry output terminal A1-COT of the A1-sub-stage A1-Sub, and interconnects the gate electrode GE1 of the B1-scan output switching device B1-SCO and the third discharging voltage line when turned on.

The fifth A1-control switching device A1-CTr5 shown in FIG. 18(*b*) is controlled by the voltage at the A1-set node A1-Q of the A1-sub-stage A1-Sub and is connected between the gate electrode GE1 of the B1-scan output switching device B1-SCO and a fourth discharging voltage line which transfers a fourth discharging voltage VSS4. That is, the fifth A1-control switching device A1-CTr5 is turned on or off in response to the voltage at the A1-set node A1-Q, and interconnects the gate electrode GE1 of the B1-scan output switching device B1-SCO and the fourth discharging voltage line when turned on.

The sixth A1-control switching device A1-CTr6 shown in FIG. 18(*c*) is controlled by an A1-start pulse A1-Vst and is connected between the gate electrode GE1 of the B1-scan output switching device B1-SCO and a fifth discharging voltage line which transfers a fifth discharging voltage VSS5. That is, the sixth A1-control switching device A1-CTr6 is turned on or off in response to the A1-start pulse A1-Vst, and interconnects the gate electrode GE1 of the B1-scan output switching device B1-SCO and the fifth discharging voltage line when turned on.

The seventh A1-control switching device A1-CTr7 shown in FIG. 18(*d*) is controlled by a voltage at a B-reset node B-QB and is connected between the gate electrode GE1 of the B1-scan output switching device B1-SCO and a sixth discharging voltage line which transfers a sixth discharging voltage VSS6. That is, the seventh A1-control switching device A1-CTr7 is turned on or off in response to the voltage at the B-reset node B-QB, and interconnects the gate electrode GE1 of the B1-scan output switching device B1-SCO and the sixth discharging voltage line when turned on.

The fourth A2-control switching device A2-CTr4 shown in FIG. 18(*e*) is controlled by an A2-carry pulse from an A2-sub-stage A2-Sub and is connected between the gate electrode GE2 of the B2-scan output switching device B2-SCO and the third discharging voltage line. That is, the fourth A2-control switching device A2-CTr4 is turned on or off in response to the A2-carry pulse from an A2-carry output terminal A2-COT of the A2-sub-stage A2-Sub, and interconnects the gate electrode GE2 of the B2-scan output switching device B2-SCO and the third discharging voltage line when turned on.

The fifth A2-control switching device A2-CTr5 shown in FIG. 18(*f*) is controlled by the voltage at the A2-set node A2-Q and is connected between the gate electrode GE2 of the B2-scan output switching device B2-SCO and the fourth discharging voltage line. That is, the fifth A2-control switching device A2-CTr5 is turned on or off in response to the voltage at the A2-set node A2-Q, and interconnects the gate electrode GE2 of the B2-scan output switching device B2-SCO and the fourth discharging voltage line when turned on.

The sixth A2-control switching device A2-CTr6 shown in FIG. 18(g) is controlled by an A2-start pulse A2-Vst and is connected between the gate electrode GE2 of the B2-scan output switching device B2-SCO and the fifth discharging voltage line. That is, the sixth A2-control switching device A2-CTr6 is turned on or off in response to the A2-start pulse A2-Vst, and interconnects the gate electrode GE2 of the B2-scan output switching device B2-SCO and the fifth discharging voltage line when turned on.

The seventh A2-control switching device A2-CTr7 shown in FIG. 18(h) is controlled by the voltage at the B-reset node B-QB and is connected between the gate electrode GE2 of the B2-scan output switching device B2-SCO and the sixth discharging voltage line. That is, the seventh A2-control switching device A2-CTr7 is turned on or off in response to the voltage at the B-reset node B-QB, and interconnects the gate electrode GE2 of the B2-scan output switching device B2-SCO and the sixth discharging voltage line when turned on.

Eighth Embodiment of Scan Output Controller SOC

Figure 19:
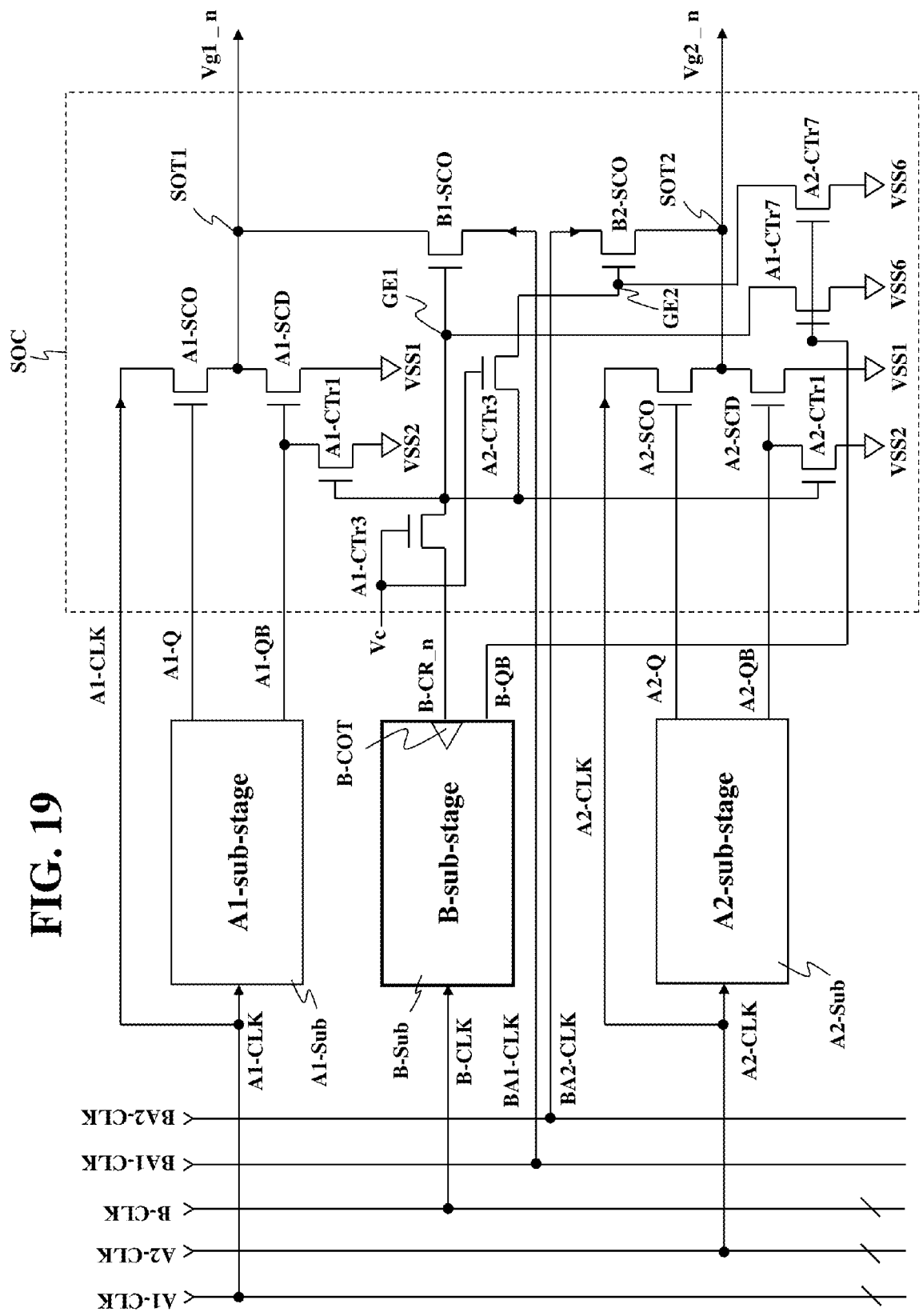
FIG. 19 is a circuit diagram of an eighth embodiment of the scan output controller according to the present invention.

FIG. 19 is a circuit diagram of an eighth embodiment of the scan output controller SOC according to the present invention.

The scan output controller SOC according to the eighth embodiment includes, as shown in FIG. 19, an A1-scan output switching device A1-SCO, a B1-scan output switching device B1-SCO, an A1-scan discharge switching device A1-SCD, a first A1-control switching device A1-CTr1, a third A1-control switching device A1-CTr3, a seventh A1-control switching device A1-CTr7, an A2-scan output switching device A2-SCO, a B2-scan output switching device B2-SCO, an A2-scan discharge switching device A2-SCD, a first A2-control switching device A2-CTr1, a third A2-control switching device A2-CTr3, and a seventh A2-control switching device A2-CTr7.

The A1-scan output switching device A1-SCO, B1-scan output switching device B1-SCO, A1-scan discharge switching device A1-SCD, A2-scan output switching device A2-SCO, B2-scan output switching device B2-SCO and A2-scan discharge switching device A2-SCD in the eighth embodiment are the same as those in the first embodiment, stated above, respectively, and a description thereof will thus be replaced by the above description of the first embodiment.

Also, the seventh A1-control switching device A1-CTr7 and seventh A2-control switching device A2-CTr7 in the eighth embodiment are the same as those in the seventh embodiment, stated above, respectively, and a description thereof will thus be replaced by the above description of the seventh embodiment.

Also, the third A1-control switching device A1-CTr3 in the eighth embodiment is the same as that in the sixth embodiment, stated above, and a description thereof will thus be replaced by the above description of the sixth embodiment.

The first A1-control switching device A1-CTr1 in the eighth embodiment is controlled by a voltage applied to the gate electrode GE1 of the B1-scan output switching device B1-SCO and is connected between the A1-reset node A1-QB and a second discharging voltage line. That is, the first A1-control switching device A1-CTr1 is turned on or off in response to the voltage applied to the gate electrode GE1 of the B1-scan output switching device B1-SCO, and interconnects the A1-reset node A1-QB and the second discharging voltage line when turned on.

The first A2-control switching device A2-CTr1 in the eighth embodiment is controlled by the voltage applied to the gate electrode GE1 of the B1-scan output switching device B1-SCO and is connected between the A2-reset node A2-QB and the second discharging voltage line. That is, the first A2-control switching device A2-CTr1 is turned on or off in response to the voltage applied to the gate electrode GE1 of the B1-scan output switching device B1-SCO, and interconnects the A2-reset node A2-QB and the second discharging voltage line when turned on.

The third A2-control switching device A2-CTr3 in the eighth embodiment is controlled by the switching control signal Vc and is connected between the gate electrode GE1 of the B1-scan output switching device B1-SCO and the gate electrode GE2 of the B2-scan output switching device B2-SCO. That is, the third A2-control switching device A2-CTr3 is turned on or off in response to the switching control signal Vc, and interconnects the gate electrode GE1 of the B1-scan output switching device B1-SCO and the gate electrode GE2 of the B2-scan output switching device B2-SCO when turned on.

On the other hand, the gate electrode of the first A1-control switching device A1-CTr1 may be connected to the gate electrode GE1 of the B1-scan output switching device B1-SCO or the first scan output terminal SOT1.

Also, the gate electrode of the first A2-control switching device A2-CTr1 may be connected to the gate electrode GE2 of the B2-scan output switching device B2-SCO or the second scan output terminal SOT2.

Figure 20:
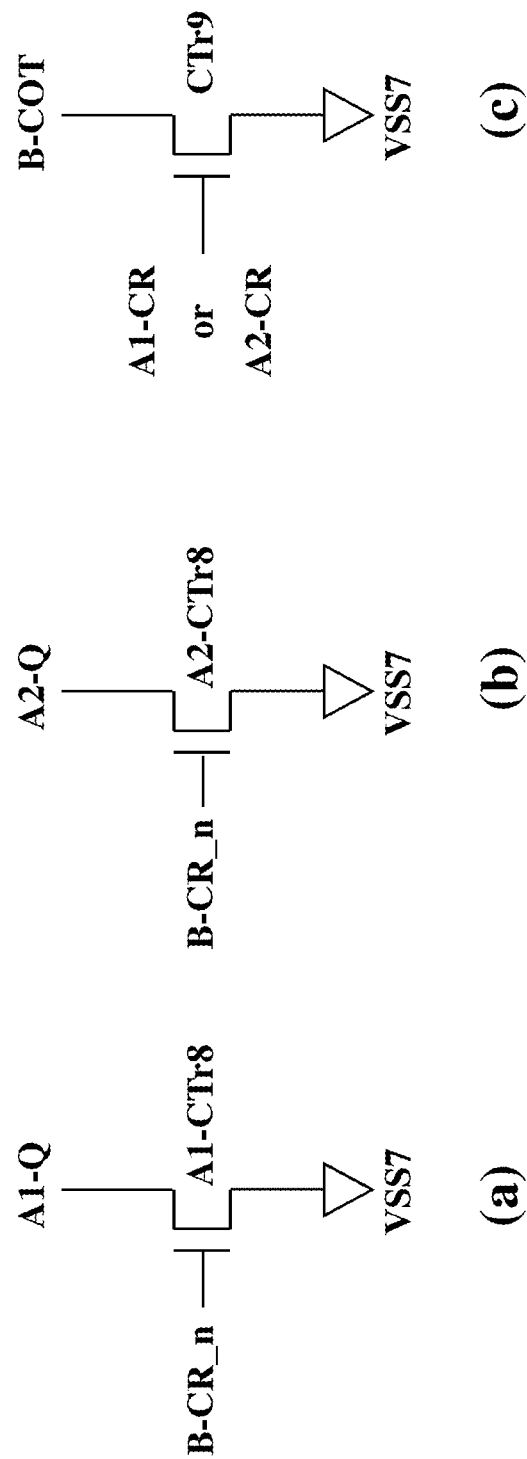
FIG. 20 is a view illustrating switching devices which may be additionally provided in the scan output controller.

FIG. 20 illustrates switching devices which may be additionally provided in the scan output controller SOC. The scan output controller SOC according to each of all the above-stated embodiments may further include at least one of three control switching devices A1-CTr8, A2-CTr8 and CTr9 as shown in FIG. 20.

Each of the three control switching devices A1-CTr8, A2-CTr8 and CTr9 will hereinafter be described in detail.

The eighth A1-control switching device A1-CTr8 shown in FIG. 20(a) is controlled by the B-carry pulse B-CR_n from the B-sub-stage B-Sub and is connected between the A1-set node A1-Q and a seventh discharging voltage line which transfers a seventh discharging voltage VSS7. That is, the eighth A1-control switching device A1-CTr8 is turned on or off in response to the B-carry pulse B-CR_n, and interconnects the A1-set node A1-Q and the seventh discharging voltage line when turned on.

The eighth A2-control switching device A2-CTr8 shown in FIG. 20(b) is controlled by the B-carry pulse B-CR_n from the B-sub-stage B-Sub and is connected between the A2-set node A2-Q and the seventh discharging voltage line. That is, the eighth A2-control switching device A2-CTr8 is turned on or off in response to the B-carry pulse B-CR_n, and interconnects the A2-set node A2-Q and the seventh discharging voltage line when turned on.

The ninth control switching device CTr9 shown in FIG. 20(c) is controlled by any one of an A1-carry pulse from an A1-sub-stage A1-Sub and an A2-carry pulse from an A2-sub-stage A2-Sub and is connected between the B-carry output terminal B-COT of the B-sub-stage B-Sub which outputs the B-carry pulse and the seventh discharging voltage line. That is, the ninth control switching device CTr9 is turned on or off in response to any one of the A1-carry pulse and A2-carry pulse, and interconnects the B-carry output terminal B-COT of the B-sub-stage B-Sub and the seventh discharging voltage line when turned on.

Hereinafter, the configurations of the A-sub-stage A-Sub and B-sub-stage B-Sub of each stage will be described in detail.

First Embodiment of Stage

Figure 21:
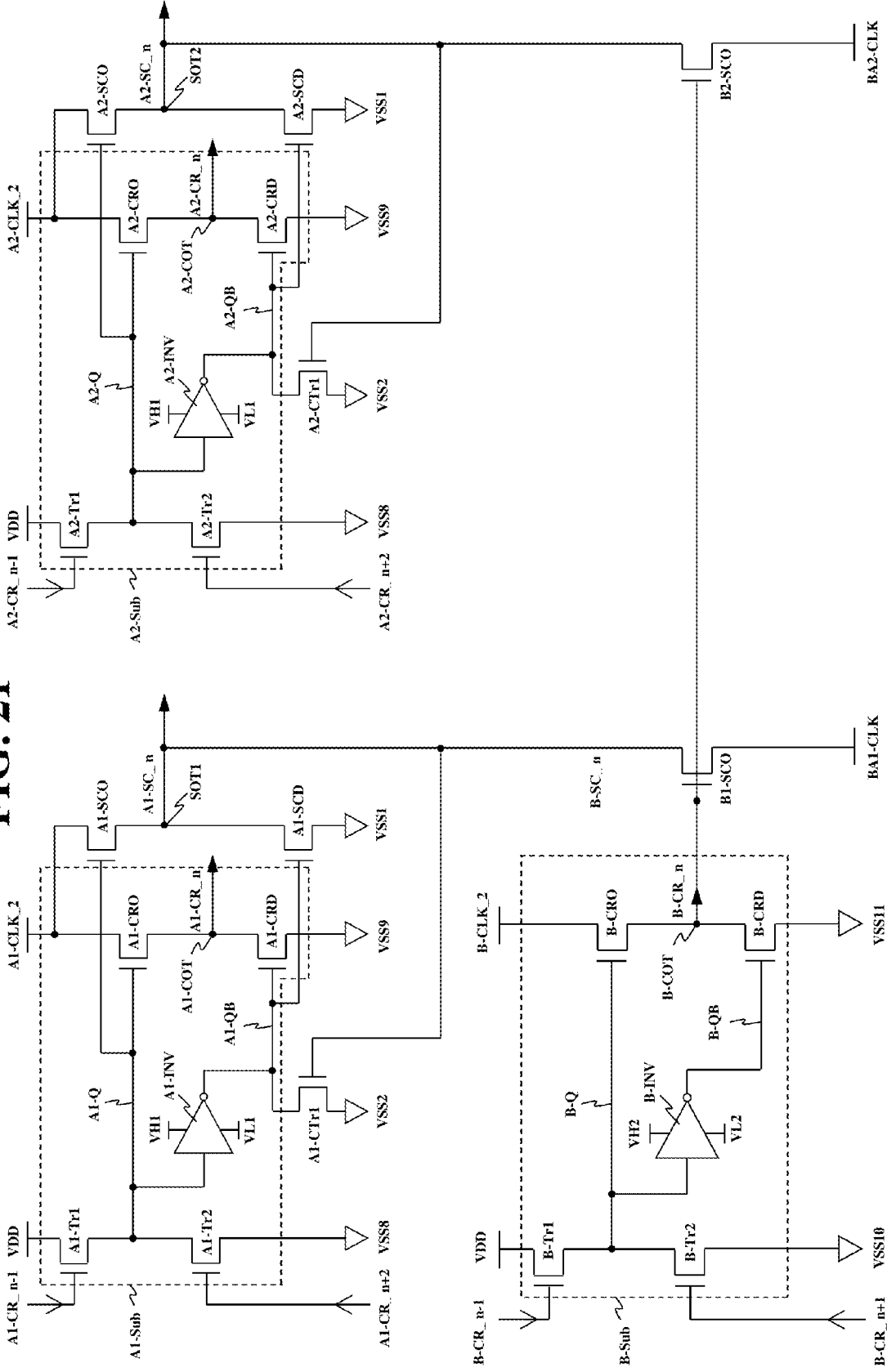
FIG. 21 is a circuit diagram of a first embodiment of a circuit configuration of an A1-sub-stage, an A2-sub-stage, a B-sub-stage and a scan output controller provided in an nth stage in FIG. 1.

FIG. 21 is a circuit diagram of a first embodiment of a circuit configuration of an A1-sub-stage A1-Sub, an A2-sub-stage A2-Sub, a B-sub-stage B-Sub and a scan output controller SOC provided in the nth stage.

Configuration of A1-Sub-Stage A1-Sub of Nth Stage

The A1-sub-stage A1-Sub of the nth stage (referred to hereinafter as an nth A1-sub-stage A1-Sub) includes a first A1-switching device A1-Tr1, a second A1-switching device A1-Tr2, an A1-inverter A1-INV, an A1-carry output switching device A1-CRO, and an A1-carry discharge switching device A1-CRD, as shown in FIG. 21.

The first A1-switching device A1-Tr1 of the nth A1-sub-stage A1-Sub is controlled by an A1-set control signal (for example, an A1-carry pulse A1-CR from an (n−1)th A1-sub-stage A1-Sub) and is connected between a charging voltage line and an A1-set node A1-Q. That is, the first A1-switching device A1-Tr1 is turned on or off in response to the A1-carry pulse A1-CR from the (n−1)th A1-sub-stage A1-Sub, and interconnects the charging voltage line and the A1-set node A1-Q when turned on. Here, the charging voltage line is supplied with a charging voltage VDD. This charging voltage VDD is a DC voltage having a value capable of turning on corresponding switching devices, which is a high voltage higher than the above-stated uth discharging voltage (where u is a natural number).

Exceptionally, because there is no stage upstream of the first stage which operates earliest among all stages in one frame period T_F, the A1-sub-stage A1-Sub of the first stage (referred to hereinafter as a first A1-sub-stage A1-Sub) is supplied with an A1-start pulse A1-Vst from a timing controller (not shown). As a result, the first A1-switching device A1-Tr1 of the first A1-sub-stage A1-Sub is supplied with the A1-start pulse A1-Vst instead of an upstream A1-carry pulse A1-CR.

The second A1-switching device A1-Tr2 of the nth A1-sub-stage A1-Sub is controlled by an A1-reset control signal (for example, an A1-carry pulse A1-CR from an (n+2)th A1-sub-stage A1-Sub) and is connected between the A1-set node A1-Q and an eighth discharging voltage line. That is, the second A1-switching device A1-Tr2 is turned on or off in response to the A1-carry pulse A1-CR from the (n+2)th A1-sub-stage A1-Sub, and interconnects the A1-set node A1-Q and the eighth discharging voltage line when turned on. Here, the eighth discharging voltage line is supplied with an eighth discharging voltage VSS8.

The A1-inverter A1-INV of the nth A1-sub-stage A1-Sub controls a voltage at an A1-reset node A1-QB based on a voltage at the A1-set node A1-Q such that the voltage at the A1-set node A1-Q and the voltage at the A1-reset node A1-QB have opposite logics. For example, when the voltage at the A1-set node A1-Q is high, the A1-inverter A1-INV makes the voltage at the A1-reset node A1-QB low. Conversely, when the voltage at the A1-set node A1-Q is low, the A1-inverter A1-INV makes the voltage at the A1-reset node A1-QB high. Here, the A1-inverter A1-INV makes the voltage at the A1-reset node A1-QB high using a first high voltage VH1, and low using a first low voltage VL1.

The A1-carry output switching device A1-CRO of the nth A1-sub-stage A1-Sub is controlled by the voltage at the A1-set node A1-Q and is connected between any one A1-clock transfer line and an A1-carry output terminal A1-COT of the nth A1-sub-stage A1-Sub. That is, the A1-carry output switching device A1-CRO is turned on or off in response to the voltage at the A1-set node A1-Q, and interconnects the A1-clock transfer line and the A1-carry output terminal A1-COT when turned on.

The A1-carry discharge switching device A1-CRD of the nth A1-sub-stage A1-Sub is controlled by the voltage at the A1-reset node A1-QB and is connected between the A1-carry output terminal A1-COT and a ninth discharging voltage line. That is, the A1-carry discharge switching device A1-CRD is turned on or off in response to the voltage at the A1-reset node A1-QB, and interconnects the A1-carry output terminal A1-COT and the ninth discharging voltage line when turned on. Here, the ninth discharging voltage line is supplied with a ninth discharging voltage VSS9.

A first A1-control switching device A1-CTr1 in FIG. 21 is controlled by a voltage at a first scan output terminal SOT1 and is connected between the A1-reset node A1-QB and a second discharging voltage line. That is, the first A1-control switching device A1-CTr1 is turned on or off in response to the voltage at the first scan output terminal SOT1, and interconnects the A1-reset node A1-QB and the second discharging voltage line when turned on. Here, the second discharging voltage line is supplied with a second discharging voltage VSS2. On the other hand, the gate electrode of the first A1-control switching device A1-CTr1 may be connected to the A1-carry output terminal A1-COT.

Configuration of A2-Sub-Stage A2-Sub of Nth Stage

The A2-sub-stage A2-Sub of the nth stage (referred to hereinafter as an nth A2-sub-stage A2-Sub) includes a first A2-switching device A2-Tr1, a second A2-switching device A2-Tr2, an A2-inverter A2-INV, an A2-carry output switching device A2-CRO, and an A2-carry discharge switching device A2-CRD, as shown in FIG. 21.

The first A2-switching device A2-Tr1 of the nth A2-sub-stage A2-Sub is controlled by an A2-set control signal (for example, an A2-carry pulse A2-CR from an (n−1)th A2-sub-stage A2-Sub) and is connected between the charging voltage line and an A2-set node A2-Q. That is, the first A2-switching device A2-Tr1 is turned on or off in response to the A2-carry pulse A2-CR from the (n−1)th A2-sub-stage A2-Sub, and interconnects the charging voltage line and the A2-set node A2-Q when turned on.

Exceptionally, because there is no stage upstream of the first stage which operates earliest among all stages in one frame period T_F, the A2-sub-stage A2-Sub of the first stage (referred to hereinafter as a first A2-sub-stage A2-Sub) is supplied with an A2-start pulse A2-Vst from the timing controller (not shown). As a result, the first A2-switching device A2-Tr1 of the first A2-sub-stage A2-Sub is supplied with the A2-start pulse A2-Vst instead of an upstream A2-carry pulse A2-CR.

The second A2-switching device A2-Tr2 of the nth A2-sub-stage A2-Sub is controlled by an A2-reset control signal (for example, an A2-carry pulse A2-CR from an (n+2)th A2-sub-stage A2-Sub) and is connected between the A2-set node A2-Q and the eighth discharging voltage line. That is, the second A2-switching device A2-Tr2 is turned on or off in response to the A2-carry pulse A2-CR from the (n+2)th A2-sub-stage A2-Sub, and interconnects the A2-set node A2-Q and the eighth discharging voltage line when turned on.

The A2-inverter A2-INV of the nth A2-sub-stage A2-Sub controls a voltage at an A2-reset node A2-QB based on a voltage at the A2-set node A2-Q such that the voltage at the A2-set node A2-Q and the voltage at the A2-reset node A2-QB have opposite logics. For example, when the voltage at the A2-set node A2-Q is high, the A2-inverter A2-INV makes the voltage at the A2-reset node A2-QB low. Conversely, when the voltage at the A2-set node A2-Q is low, the A2-inverter A2-INV makes the voltage at the A2-reset node A2-QB high. Here, the A2-inverter A2-INV makes the voltage at the A2-reset node A2-QB high using the first high voltage VH1, and low using the first low voltage VL1.

The A2-carry output switching device A2-CRO of the nth A2-sub-stage A2-Sub is controlled by the voltage at the A2-set node A2-Q and is connected between any one A2-clock transfer line and an A2-carry output terminal A2-COT of the nth A2-sub-stage A2-Sub. That is, the A2-carry output switching device A2-CRO is turned on or off in response to the voltage at the A2-set node A2-Q, and interconnects the A2-clock transfer line and the A2-carry output terminal A2-COT when turned on.

The A2-carry discharge switching device A2-CRD of the nth A2-sub-stage A2-Sub is controlled by the voltage at the A2-reset node A2-QB and is connected between the A2-carry output terminal A2-COT and the ninth discharging voltage line. That is, the A2-carry discharge switching device A2-CRD is turned on or off in response to the voltage at the A2-reset node A2-QB, and interconnects the A2-carry output terminal A2-COT and the ninth discharging voltage line when turned on.

A first A2-control switching device A2-CTr1 in FIG. 21 is controlled by a voltage at a second scan output terminal SOT2 and is connected between the A2-reset node A2-QB and the second discharging voltage line. That is, the first A2-control switching device A2-CTr1 is turned on or off in response to the voltage at the second scan output terminal SOT2, and interconnects the A2-reset node A2-QB and the second discharging voltage line when turned on. On the other hand, the gate electrode of the first A2-control switching device A2-CTr1 may be connected to the A2-carry output terminal A2-COT.

Configuration of B-Sub-Stage B-Sub of Nth Stage

The B-sub-stage B-Sub of the nth stage (referred to hereinafter as an nth B-sub-stage B-Sub) includes a first B-switching device B-Tr1, a second B-switching device B-Tr2, a B-inverter B-INV, a B-carry output switching device B-CRO, and a B-carry discharge switching device B-CRD, as shown in FIG. 21.

The first B-switching device B-Tr1 of the nth B-sub-stage B-Sub is controlled by a B-set control signal (for example, a B-carry pulse B-CR from an (n−1)th B-sub-stage B-Sub) and is connected between the charging voltage line and a B-set node B-Q. That is, the first B-switching device B-Tr1 is turned on or off in response to the B-carry pulse B-CR from the (n−1)th B-sub-stage B-Sub, and interconnects the charging voltage line and the B-set node B-Q when turned on.

Exceptionally, because there is no stage upstream of the first stage which operates earliest among all stages in one frame period T_F, the B-sub-stage B-Sub of the first stage (referred to hereinafter as a first B-sub-stage B-Sub) is supplied with a B-start pulse B-Vst from the timing controller (not shown). As a result, the first B-switching device B-Tr1 of the first B-sub-stage B-Sub is supplied with the B-start pulse B-Vst instead of an upstream B-carry pulse B-CR.

The second B-switching device B-Tr2 of the nth B-sub-stage B-Sub is controlled by a B-reset control signal (for example, a B-carry pulse B-CR from an (n+1)th B-sub-stage B-Sub) and is connected between the B-set node B-Q and a tenth discharging voltage line. That is, the second B-switching device B-Tr2 is turned on or off in response to the B-carry pulse B-CR from the (n+1)th B-sub-stage B-Sub, and interconnects the B-set node B-Q and the tenth discharging voltage line when turned on. Here, the tenth discharging voltage line is supplied with a tenth discharging voltage VSS10.

The B-inverter B-INV of the nth B-sub-stage B-Sub controls a voltage at a B-reset node B-QB based on a voltage at the B-set node B-Q such that the voltage at the B-set node B-Q and the voltage at the B-reset node B-QB have opposite logics. For example, when the voltage at the B-set node B-Q is high, the B-inverter B-INV makes the voltage at the B-reset node B-QB low. Conversely, when the voltage at the B-set node B-Q is low, the B-inverter B-INV makes the voltage at the B-reset node B-QB high. Here, the B-inverter B-INV makes the voltage at the B-reset node B-QB high using a second high voltage VH2, and low using a second low voltage VL2.

The B-carry output switching device B-CRO of the nth B-sub-stage B-Sub is controlled by the voltage at the B-set node B-Q and is connected between any one B-clock transfer line and a B-carry output terminal B-COT of the nth B-sub-stage B-Sub. That is, the B-carry output switching device B-CRO is turned on or off in response to the voltage at the B-set node B-Q, and interconnects the B-clock transfer line and the B-carry output terminal B-COT when turned on.

The B-carry discharge switching device B-CRD of the nth B-sub-stage B-Sub is controlled by the voltage at the B-reset node B-QB and is connected between the B-carry output terminal B-COT and an eleventh discharging voltage line. That is, the B-carry discharge switching device B-CRD is turned on or off in response to the voltage at the B-reset node B-QB, and interconnects the B-carry output terminal B-COT and the eleventh discharging voltage line when turned on. Here, the eleventh discharging voltage line is supplied with an eleventh discharging voltage VSS11.

The operations of the A1-sub-stage A1-Sub, A2-sub-stage A2-Sub and B-sub-stage B-Sub with the above-stated configurations will hereinafter be described in detail.

First, the operation of the A1-sub-stage A1-Sub will be described with reference to FIGS. 4, 5 and 8 and the configurations of the A1-sub-stage A1-Sub and B-sub-stage B-Sub in FIG. 21.

1) Set Time

At a set time t_s of the nth A1-sub-stage A1-Sub, the A1-carry pulse (A1-CR_n−1 in FIG. 5) of the high state from the (n−1)th A1-sub-stage A1-Sub is supplied to the first A1-switching device A1-Tr1 of the nth A1-sub-stage A1-Sub. Accordingly, the first A1-switching device A1-Tr1 is turned on, and the charging voltage VDD is supplied to the A1-set node A1-Q of the nth A1-sub-stage A1-Sub through the turned-on first A1-switching device A1-Tr1. As a result, the A1-set node A1-Q is charged, and the A1-carry output switching device A1-CRO and an A1-scan output switching device A1-SCO, connected to the charged A1-set node A1-Q through the gate electrodes thereof, are turned on.

Also, because the voltage at the charged A1-set node A1-Q is high, the A1-inverter A1-INV discharges the A1-reset node A1-QB to the first low voltage VL1. As a result, the A1-carry discharge switching device A1-CRD and an A1-scan discharge switching device A1-SCD, connected to the discharged A1-reset node A1-QB through the gate electrodes thereof, are turned off.

On the other hand, at the set time t_s of the nth A1-sub-stage A1-Sub, the A1-carry pulse A1-CR_n+2 from the (n+2)th A1-sub-stage A1-Sub is low, thereby causing the second A1-switching device A1-Tr2, supplied with the A1-carry pulse A1-CR_n+2 through the gate electrode thereof, to be turned off.

Also, at the set time t_s of the nth A1-sub-stage A1-Sub, the B-set node B-Q of the nth B-sub-stage B-Sub is kept charged by the B-carry pulse B-CR from the (n−1)th B-sub-stage B-Sub, and the B-reset node B-QB of the nth B-sub-stage B-Sub is kept discharged by the B-carry pulse B-CR from the (n−1)th B-sub-stage B-Sub. As a result, the B-carry output switching device B-CRO is kept on, and the B-carry discharge switching device B-CRD is kept off. At this time, the second B-clock pulse B-CLK_2 is low. Accordingly, a B-carry pulse B-CR of the low state is output through the turned-on B-carry output switching device B-CRO. The output B-carry pulse B-CR of the low state is supplied to the gate electrode of a B1-scan output switching device B1-SCO through the B-carry output terminal B-COT. On the other hand, at this set time t_s, a first discharging voltage VSS1 of the low state is applied to the first scan output terminal SOT1 and, in turn, to the gate electrode of the first A1-control switching device A1-CTr1.

As a result, at the set time t_s of the nth A1-sub-stage A1-Sub, the first A1-control switching device A1-CTr1 and the B1-scan output switching device B1-SCO are both turned off.

In this manner, at the set time t_s of the A1-sub-stage A1-Sub, the A1-set node A1-Q of the A1-sub-stage A1-Sub is charged and the A1-reset node A1-QB of the A1-sub-stage A1-Sub is discharged, so that the A1-sub-stage A1-Sub is set.

2) Output Time

Thereafter, at an output time t_o of the nth A1-sub-stage A1-Sub, the second A1-clock pulse A1-CLK_2 is applied to the nth A1-sub-stage A1-Sub. That is, the second A1-clock pulse A1-CLK_2 is applied to both the turned-on A1-carry output switching device A1-CRO and A1-scan output switching device A1-SCO. Thus, an A1-carry pulse (A1-CR_n in FIG. 5) is output via the turned-on A1-carry output switching device A1-CRO, and an A1-scan pulse (A1-SC_n in FIG. 4) is output via the turned-on A1-scan output switching device A1-SCO.

Also, at a falling time TL of the first A1-clock pulse A1-CLK_1, the first A1-clock pulse A1-CLK_1 makes a high to low transition, so that the (n−1)th A1-carry pulse A1-CR_n−1 generated by the first A1-clock pulse A1-CLK_1 makes a high to low transition, thereby causing the first A1-switching device A1-Tr1 of the nth A1-sub-stage A1-Sub to be turned off. As a result, the A1-set node A1-Q of the nth A1-sub-stage A1-Sub floats, and the voltage at the A1-set node A1-Q is thus bootstrapped by a coupling phenomenon at the moment that the second A1-clock pulse A1-CLK_2 is input to the A1-sub-stage A1-Sub. Accordingly, the A1-carry output switching device A1-CRO and the A1-scan output switching device A1-SCO are almost completely turned on, so that the A1-carry pulse A1-CR_n and the A1-scan pulse A1-SC_n are stably output therefrom. At this time, the A1-scan pulse A1-SC_n is also supplied to the gate electrode of the first A1-control switching device A1-CTr1, so as to turn on the first A1-control switching device A1-CTr1. As a result, the A1-reset node A1-QB is discharged to the second discharging voltage VSS2 through the turned-on first A1-control switching device A1-CTr1.

In this manner, in the present invention, the A1-set node A1-Q is bootstrapped using the A1-clock pulse A1-CLK, not a constant voltage, and the floating structure, so that the A1-carry pulse A1-CR and the A1-scan pulse A1-SC can be stably output even using the A1-clock pulse A1-CLK of the relatively low voltage. Further, the stabilization of the output voltage by the bootstrapping makes it possible to prevent the output voltage from being attenuated even if the size of the A1-scan output switching device A1-SCO is made to be relatively small.

The A1-carry pulse A1-CR_n output through the A1-carry output terminal A1-COT is supplied to the (n+1)th A1-sub-stage A1-Sub and the (n−2)th A1-sub-stage A1-Sub. Therefore, the (n+1)th A1-sub-stage A1-Sub is set and the (n−2)th A1-sub-stage A1-Sub is reset.

The A1-scan pulse A1-SC_n output through the first scan output terminal SOT1 is also supplied to an mth gate line.

At the output time t_o of the nth A1-sub-stage A1-Sub, the B1-scan output switching device B1-SCO is kept off.

3) Reset Time

Thereafter, at a reset time t_r of the nth A1-sub-stage A1-Sub, the A1-carry pulse (A1-CR_n+2 in FIG. 5) from the (n+2)th A1-sub-stage A1-Sub becomes high, thereby causing the second A1-switching device A1-Tr2 of the nth A1-sub-stage A1-Sub, supplied with the A1-carry pulse A1-CR_n+2, to be turned on. As a result, the eighth discharging voltage VSS8 is supplied to the A1-set node A1-Q through the turned-on second A1-switching device A1-Tr2. Accordingly, the A1-set node A1-Q is discharged, and the A1-carry output switching device A1-CRO and A1-scan output switching device A1-SCO, connected to the discharged A1-set node A1-Q through the gate electrodes thereof, are turned off.

Also, because the voltage at the discharged A1-set node A1-Q is low, the A1-inverter A1-INV charges the A1-reset node A1-QB to the first high voltage VH1. As a result, the A1-carry discharge switching device A1-CRD and A1-scan discharge switching device A1-SCD, connected to the charged A1-reset node A1-QB through the gate electrodes thereof, are turned on.

Accordingly, the ninth discharging voltage VSS9 is output to the A1-carry output terminal A1-COT via the turned-on A1-carry discharge switching device A1-CRD, and the first discharging voltage VSS1 is output to the first scan output terminal SOT1 via the turned-on A1-scan discharge switching device A1-SCD. The first discharging voltage VSS1 output through the first scan output terminal SOT1 is supplied to the mth gate line.

On the other hand, the ninth discharging voltage VSS9 output through the A1-carry output terminal A1-COT is supplied to the (n+1)th A1-sub-stage A1-Sub and the (n−2)th A1-sub-stage A1-Sub.

At the reset time t_r of the nth A1-sub-stage A1-Sub, the first A1-control switching device A1-CTr1 and the B1-scan output switching device B1-SCO are both kept off.

After all A1-sub-stages A1-Sub output A1-carry pulses A1-CR once in the above manner, the second B-clock pulse B-CLK_2 and BA1-clock pulse BA1-CLK of the high state are applied to the nth stage ST_n in the B1-output period T_B1 of this frame period T_F. That is, the second B-clock pulse B-CLK_2 of the high state is applied to the B-carry output switching device B-CRO of the nth B-sub-stage B-Sub. Because the B-carry output switching device B-CRO has already been turned on, the second B-clock pulse B-CLK_2 of the high state applied thereto is output as a B-carry pulse (B-CR_n in FIG. 8) through the B-carry output terminal B-COT.

Here, the high state of each of the B-clock pulses B-CLK_1 and B-CLK_2 may be set to have a voltage higher than that of the high state of the BA1-clock pulse BA1-CLK. In this case, the voltage at the B-carry output terminal B-COT may be boosted, thereby causing the B1-scan output switching device B1-SCO to be almost completely turned on. Therefore, a B1-scan pulse B1-SC_n may be stably output from the B1-scan output switching device B1-SCO.

In this manner, in the present invention, the voltage at the B-carry output terminal B-COT can be boosted using the B-clock pulse B-CLK and the BA1-clock pulse BA1-CLK, which has a voltage lower than that of the B-clock pulse B-CLK, not a constant voltage. That is, the B1-scan pulse B1-SC can be stably output even using the BA1-clock pulse BA1-CLK of the relatively low voltage. Further, because the output voltage is stabilized by the boosting of the voltage at the B-carry output terminal B-COT, it can be prevented from being attenuated even if the size of the B1-scan output switching device B1-SCO is made to be relatively small.

The B-carry pulse B-CR_n of the high state, output through the B-carry output terminal B-COT in the above manner, is applied to the (n+1)th B-sub-stage B-Sub and the (n−1)th B-sub-stage B-Sub, as well as the B1-scan output switching device B1-SCO of the nth stage, as stated previously. Therefore, the (n+1)th B-sub-stage B-Sub is set and the (n−1)th B-sub-stage B-Sub is reset.

The BA1-clock pulse BA1-CLK is applied to the first scan output terminal SOT1 through the turned-on B1-scan output switching device B1-SCO. That is, the BA1-clock pulse BA1-CLK applied to the first scan output terminal SOT1 is the very B1-scan pulse (B1-SC_n in FIG. 4).

The B1-scan pulse B1-SC_n output through the first scan output terminal SOT1 is applied to the mth gate line.

Thereafter, at a reset time of the nth B-sub-stage B-Sub, the B-carry pulse B-CR_n+1 from the (n+1)th B-sub-stage B-Sub becomes high, thereby causing the second B-switching device B-Tr2 of the nth B-sub-stage B-Sub, supplied with the B-carry pulse B-CR_n+1, to be turned on. As a result, the tenth discharging voltage VSS10 is supplied to the B-set node B-Q through the turned-on second B-switching device B-Tr2. Accordingly, the B-set node B-Q is discharged, and the B-carry output switching device B-CRO, connected to the discharged B-set node B-Q through the gate electrode thereof, is turned off.

Also, because the voltage at the discharged B-set node B-Q is low, the B-inverter B-INV charges the B-reset node B-QB to the second high voltage VH2. As a result, the B-carry discharge switching device B-CRD, connected to the charged B-reset node B-QB through the gate electrode thereof, is turned on.

Accordingly, the eleventh discharging voltage VSS11 is output to the B-carry output terminal B-COT via the turned-on B-carry discharge switching device B-CRD. The eleventh discharging voltage VSS11 output through the B-carry output terminal B-COT is applied to the (n+1)th B-sub-stage B-Sub, the (n−1)th B-sub-stage B-Sub and the B1-scan output switching device B1-SCO of the nth stage. As a result, the B1-scan output switching device B1-SCO is turned off.

The A1-scan output switching device A1-SCO, B1-scan output switching device B1-SCO, A1-scan discharge switching device A1-SCD and first A1-control switching device A1-CTr1 in FIG. 21 are the same as those in FIG. 10, stated previously, respectively.

Next, the operation of the A2-sub-stage A2-Sub will be described with reference to FIGS. 6, 7 and 8 and the configurations of the A2-sub-stage A2-Sub and B-sub-stage B-Sub in FIG. 21.

1) Set Time

At a set time t_s of the nth A2-sub-stage A2-Sub, the A2-carry pulse (A2-CR_n−1 in FIG. 7) of the high state from the (n−1)th A2-sub-stage A2-Sub is supplied to the first A2-switching device A2-Tr1 of the nth A2-sub-stage A2-Sub. Accordingly, the first A2-switching device A2-Tr1 is turned on, and the charging voltage VDD is supplied to the A2-set node A2-Q of the nth A2-sub-stage A2-Sub through the turned-on first A2-switching device A2-Tr1. As a result, the A2-set node A2-Q is charged, and the A2-carry output switching device A2-CRO and an A2-scan output switching device A2-SCO, connected to the charged A2-set node A2-Q through the gate electrodes thereof, are turned on.

Also, because the voltage at the charged A2-set node A2-Q is high, the A2-inverter A2-INV discharges the A2-reset node A2-QB to the first low voltage VL1. As a result, the A2-carry discharge switching device A2-CRD and an A2-scan discharge switching device A2-SCD, connected to the discharged A2-reset node A2-QB through the gate electrodes thereof, are turned off.

On the other hand, at the set time t_s of the nth A2-sub-stage A2-Sub, the A2-carry pulse A2-CR_n+2 from the (n+2)th A2-sub-stage A2-Sub is low, thereby causing the second A2-switching device A2-Tr2, supplied with the A2-carry pulse A2-CR_n+2 through the gate electrode thereof, to be turned off.

Also, at the set time t_s of the nth A2-sub-stage A2-Sub, the B-set node B-Q of the nth B-sub-stage B-Sub is kept charged by the B-carry pulse B-CR from the (n−1)th B-sub-stage B-Sub, and the B-reset node B-QB of the nth B-sub-stage B-Sub is kept discharged by the B-carry pulse B-CR from the (n−1)th B-sub-stage B-Sub. As a result, the B-carry output switching device B-CRO is kept on, and the B-carry discharge switching device B-CRD is kept off. At this time, the second B-clock pulse B-CLK_2 is low. Accordingly, a B-carry pulse B-CR of the low state is output through the turned-on B-carry output switching device B-CRO. The output B-carry pulse B-CR of the low state is supplied to the gate electrode of a B2-scan output switching device B2-SCO through the B-carry output terminal B-COT. On the other hand, at this set time t_s, the first discharging voltage VSS1 of the low state is applied to the second scan output terminal SOT2 and, in turn, to the gate electrode of the first A2-control switching device A2-CTr1.

As a result, at the set time t_s of the nth A2-sub-stage A2-Sub, the first A2-control switching device A2-CTr1 and the B2-scan output switching device B2-SCO are both turned off.

In this manner, at the set time t_s of the A2-sub-stage A2-Sub, the A2-set node A2-Q of the A2-sub-stage A2-Sub is charged and the A2-reset node A2-QB of the A2-sub-stage A2-Sub is discharged, so that the A2-sub-stage A2-Sub is set.

2) Output Time

Thereafter, at an output time t_o of the nth A2-sub-stage A2-Sub, the second A2-clock pulse A2-CLK_2 is applied to the nth A2-sub-stage A2-Sub. That is, the second A2-clock pulse A2-CLK_2 is applied to both the turned-on A2-carry output switching device A2-CRO and A2-scan output switching device A2-SCO. Thus, an A2-carry pulse (A2-CR_n in FIG. 7) is output via the turned-on A2-carry output switching device A2-CRO, and an A2-scan pulse (A2-SC_n in FIG. 6) is output via the turned-on A2-scan output switching device A2-SCO.

Also, at a falling time TL of the first A2-clock pulse A2-CLK_1, the first A2-clock pulse A2-CLK_1 makes a high to low transition, so that the (n−1)th A2-carry pulse A2-CR_n−1 generated by the first A2-clock pulse A2-CLK_1 makes a high to low transition, thereby causing the first A2-switching device A2-Tr1 of the nth A2-sub-stage A2-Sub to be turned off. As a result, the A2-set node A2-Q of the nth A2-sub-stage A2-Sub floats, and the voltage at the A2-set node A2-Q is thus bootstrapped by a coupling phenomenon at the moment that the second A2-clock pulse A2-CLK_2 is input to the A2-sub-stage A2-Sub. Accordingly, the A2-carry output switching device A2-CRO and the A2-scan output switching device A2-SCO are almost completely turned on, so that the A2-carry pulse A2-CR_n and the A2-scan pulse A2-SC_n are stably output therefrom. At this time, the A2-scan pulse A2-SC_n is also supplied to the gate electrode of the first A2-control switching device A2-CTr1, so as to turn on the first A2-control switching device A2-CTr1. As a result, the A2-reset node A2-QB is discharged to the second discharging voltage VSS2 through the turned-on first A2-control switching device A2-CTr1.

In this manner, in the present invention, the A2-set node A2-Q is bootstrapped using the A2-clock pulse A2-CLK, not a constant voltage, and the floating structure, so that the A2-carry pulse A2-CR and the A2-scan pulse A2-SC can be stably output even using the A2-clock pulse A2-CLK of the relatively low voltage. Further, the stabilization of the output voltage by the bootstrapping makes it possible to prevent the output voltage from being attenuated even if the size of the A2-scan output switching device A2-SCO is made to be relatively small.

The A2-carry pulse A2-CR_n output through the A2-carry output terminal A2-COT is supplied to the (n+1)th A2-sub-stage A2-Sub and the (n−2)th A2-sub-stage A2-Sub. Therefore, the (n+1)th A2-sub-stage A2-Sub is set and the (n−2)th A2-sub-stage A2-Sub is reset.

The A2-scan pulse A2-SC_n output through the second scan output terminal SOT2 is also supplied to an (m+1)th gate line.

At the output time t_o of the nth A2-sub-stage A2-Sub, the B2-scan output switching device B2-SCO is kept off.

3) Reset Time

Thereafter, at a reset time t_r of the nth A2-sub-stage A2-Sub, the A2-carry pulse (A2-CR_n+2 in FIG. 7) from the (n+2)th A2-sub-stage A2-Sub becomes high, thereby causing the second A2-switching device A2-Tr2 of the nth A2-sub-stage A2-Sub, supplied with the A2-carry pulse A2-CR_n+2, to be turned on. As a result, the eighth discharging voltage VSS8 is supplied to the A2-set node A2-Q through the turned-on second A2-switching device A2-Tr2. Accordingly, the A2-set node A2-Q is discharged, and the A2-carry output switching device A2-CRO and A2-scan output switching device A2-SCO, connected to the discharged A2-set node A2-Q through the gate electrodes thereof, are turned off.

Also, because the voltage at the discharged A2-set node A2-Q is low, the A2-inverter A2-INV charges the A2-reset node A2-QB to the first high voltage VH1. As a result, the A2-carry discharge switching device A2-CRD and A2-scan discharge switching device A2-SCD, connected to the charged A2-reset node A2-QB through the gate electrodes thereof, are turned on.

Accordingly, the ninth discharging voltage VSS9 is output to the A2-carry output terminal A2-COT via the turned-on A2-carry discharge switching device A2-CRD, and the first discharging voltage VSS1 is output to the second scan output terminal SOT2 via the turned-on A2-scan discharge switching device A2-SCD. The first discharging voltage VSS1 output through the second scan output terminal SOT2 is supplied to the (m+1)th gate line.

On the other hand, the ninth discharging voltage VSS9 output through the A2-carry output terminal A2-COT is supplied to the (n+1)th A2-sub-stage A2-Sub and the (n−2)th A2-sub-stage A2-Sub.

At the reset time t_r of the nth A2-sub-stage A2-Sub, the first A2-control switching device A2-CTr1 and the B2-scan output switching device B2-SCO are both kept off.

After all A2-sub-stages A2-Sub output A2-carry pulses A2-CR once in the above manner, the second B-clock pulse B-CLK_2 and BA2-clock pulse BA2-CLK of the high state are applied to the nth stage ST_n in the B2-output period T_B2 of this frame period T_F. That is, the second B-clock pulse B-CLK_2 of the high state is applied to the B-carry output switching device B-CRO of the nth B-sub-stage B-Sub. Because the B-carry output switching device B-CRO has already been turned on, the second B-clock pulse B-CLK_2 of the high state applied thereto is output as a B-carry pulse (B-CR_n in FIG. 8) through the B-carry output terminal B-COT.

Here, the high state of each of the B-clock pulses B-CLK_1 and B-CLK_2 may be set to have a voltage higher than that of the high state of the BA2-clock pulse BA2-CLK. In this case, the voltage at the B-carry output terminal B-COT may be boosted, thereby causing the B2-scan output switching device B2-SCO to be almost completely turned on. Therefore, a B2-scan pulse B2-SC_n may be stably output from the B2-scan output switching device B2-SCO.

In this manner, in the present invention, the voltage at the B-carry output terminal B-COT can be boosted using the B-clock pulse B-CLK and the BA2-clock pulse BA2-CLK, which has a voltage lower than that of the B-clock pulse B-CLK, not a constant voltage. That is, the B2-scan pulse B2-SC can be stably output even using the BA2-clock pulse BA2-CLK of the relatively low voltage. Further, because the output voltage is stabilized by the boosting of the voltage at the B-carry output terminal B-COT, it can be prevented from being attenuated even if the size of the B2-scan output switching device B2-SCO is made to be relatively small.

The B-carry pulse B-CR_n of the high state, output through the B-carry output terminal B-COT in the above manner, is applied to the (n+1)th B-sub-stage B-Sub and the (n−1)th B-sub-stage B-Sub, as well as the B2-scan output switching device B2-SCO of the nth stage, as stated previously. Therefore, the (n+1)th B-sub-stage B-Sub is set and the (n−1)th B-sub-stage B-Sub is reset.

The BA2-clock pulse BA2-CLK is applied to the second scan output terminal SOT2 through the turned-on B2-scan output switching device B2-SCO. That is, the BA2-clock pulse BA2-CLK applied to the second scan output terminal SOT2 is the very B2-scan pulse (B2-SC_n in FIG. 6).

The B2-scan pulse B2-SC_n output through the second scan output terminal SOT2 is applied to the (m+1)th gate line.

Thereafter, at a reset time of the nth B-sub-stage B-Sub, the B-carry pulse B-CR_n+1 from the (n+1)th B-sub-stage B-Sub becomes. The operation of the nth B-sub-stage B-Sub at this reset time is performed in the same manner as the above.

The A2-scan output switching device A2-SCO, B2-scan output switching device B2-SCO, A2-scan discharge switching device A2-SCD and first A2-control switching device A2-CTr1 in FIG. 21 are the same as those in FIG. 10, stated previously, respectively.

Second Embodiment of Stage

Figure 22:
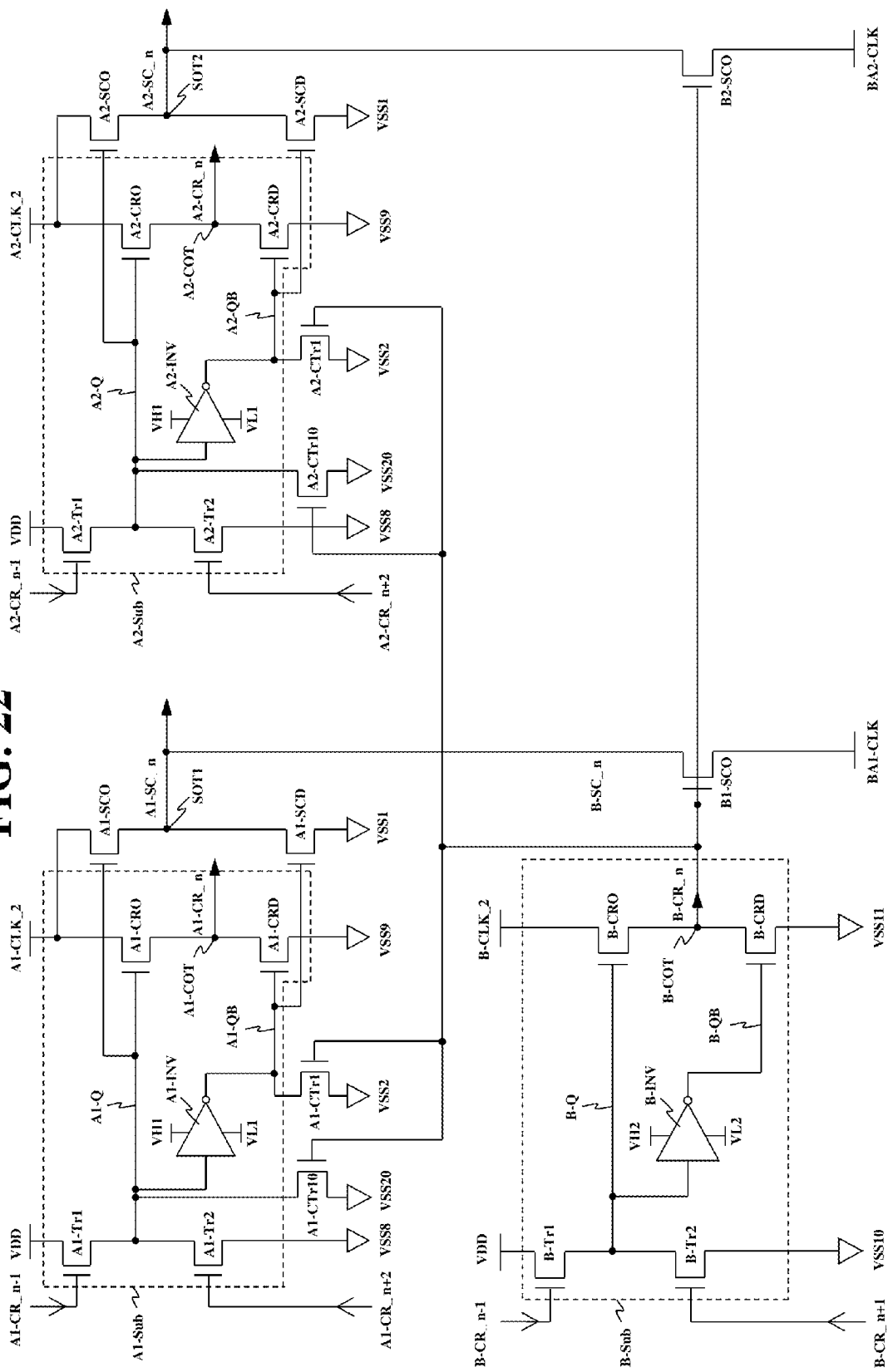
FIG. 22 is a circuit diagram of a second embodiment of the circuit configuration of the A1-sub-stage, A2-sub-stage, B-sub-stage and scan output controller provided in the nth stage.

FIG. 22 is a circuit diagram of a second embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the second embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 22 are the same as those in FIG. 9, stated previously, respectively.

A tenth A1-control switching device A1-CTr10 in FIG. 22 is controlled by the B-carry pulse B-CR_n from the B-sub-stage B-Sub and is connected between the A1-set node A1-Q and a twenties discharging voltage line which transfers a twenties discharging voltage VSS20. That is, the tenth A1-control switching device A1-CTr10 is turned on or off in response to the B-carry pulse B-CR_n, and interconnects the A1-set node A1-Q and the twenties discharging voltage line when turned on.

A tenth A2-control switching device A2-CTr10 in FIG. 22 is controlled by the B-carry pulse B-CR_n from the B-sub-stage B-Sub and is connected between the A2-set node A2-Q and the twenties discharging voltage line. That is, the tenth A2-control switching device A2-CTr10 is turned on or off in response to the B-carry pulse B-CR_n, and interconnects the A2-set node A2-Q and the twenties discharging voltage line when turned on.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Third Embodiment of Stage

Figure 23:
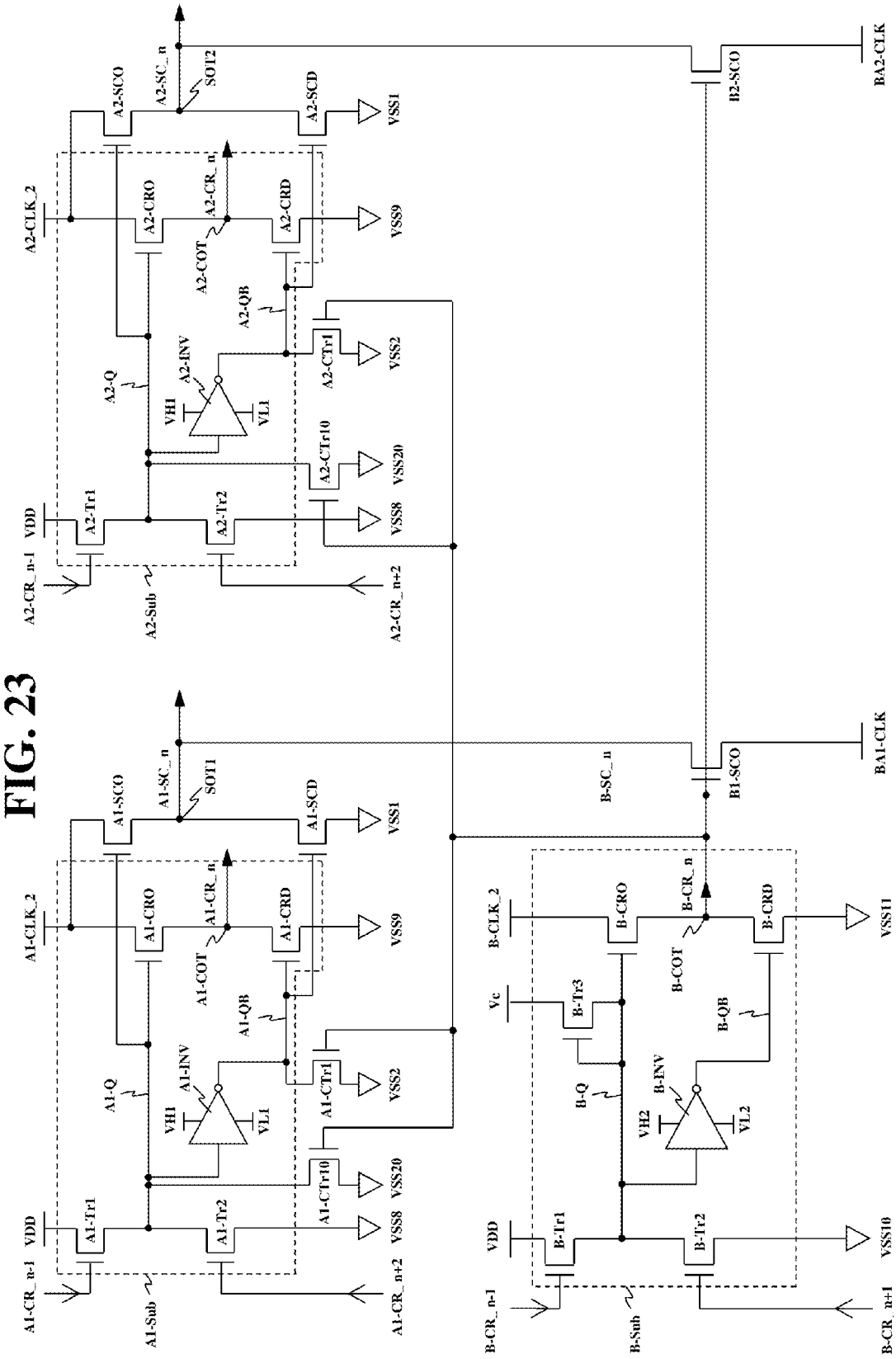
FIG. 23 is a circuit diagram of a third embodiment of the circuit configuration of the A1-sub-stage, A2-sub-stage, B-sub-stage and scan output controller provided in the nth stage.

FIG. 23 is a circuit diagram of a third embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the third embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 23 are the same as those in FIG. 9, stated previously, respectively.

A tenth A1-control switching device A1-CTr10 and a tenth A2-control switching device A2-CTr10 in FIG. 23 are the same as those in FIG. 22, stated previously, respectively.

Exceptionally, the B-sub-stage B-Sub further includes a third B-switching device B-Tr3.

The third B-switching device B-Tr3 is controlled by the voltage at the B-set node B-Q and is connected between a control transfer line which transfers an external switching control signal Vc and the B-set node B-Q. That is, the third B-switching device B-Tr3 is turned on or off in response to the voltage at the B-set node B-Q, and interconnects the control transfer line and the B-set node B-Q when turned on.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Fourth Embodiment of Stage

Figure 24:
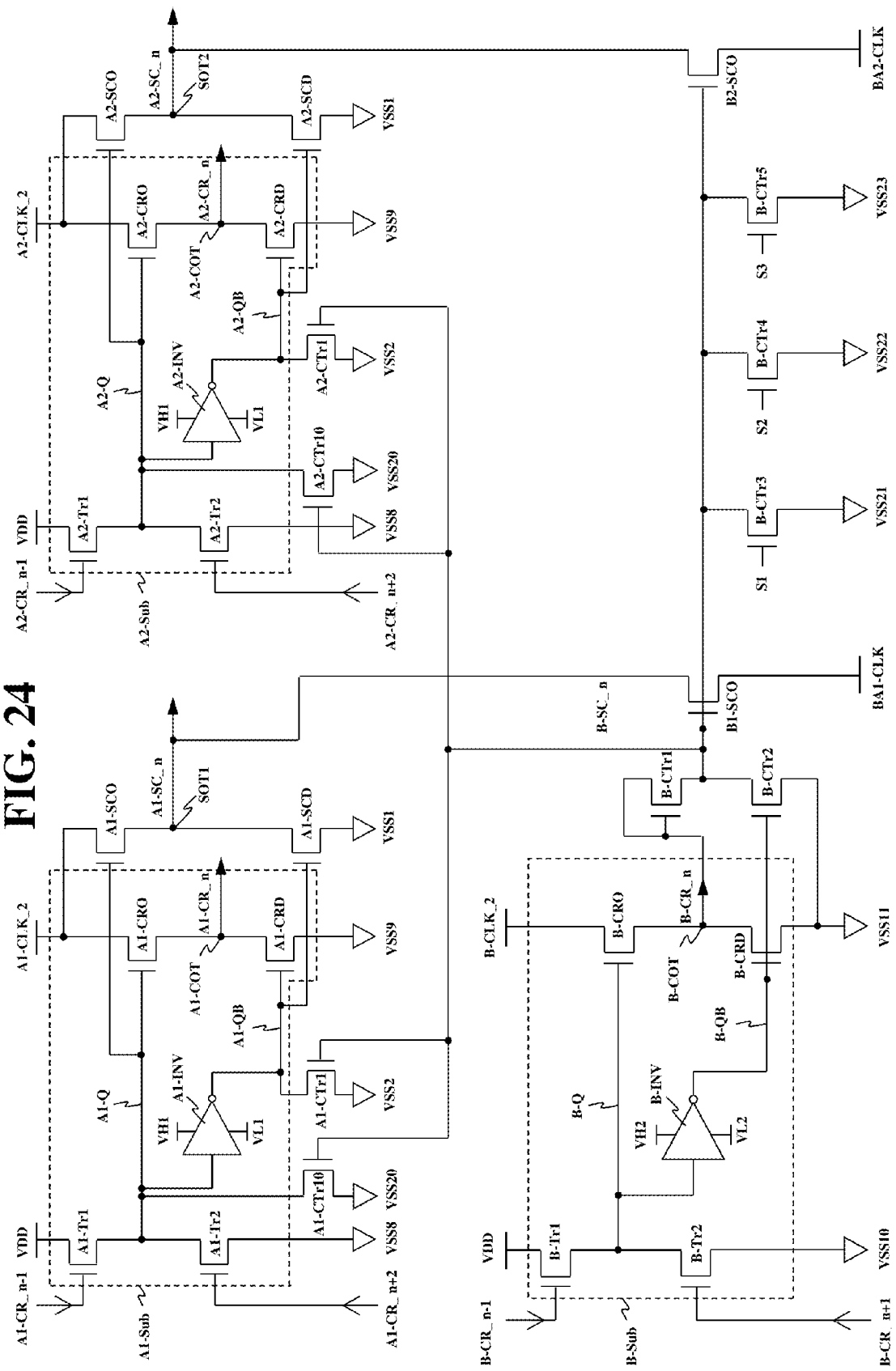
FIG. 24 is a circuit diagram of a fourth embodiment of the circuit configuration of the A1-sub-stage, A2-sub-stage, B-sub-stage and scan output controller provided in the nth stage.

FIG. 24 is a circuit diagram of a fourth embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the fourth embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 24 are the same as those in FIG. 19, stated previously, respectively.

A tenth A1-control switching device A1-CTr10 in FIG. 24 is controlled by the voltage applied to the gate electrode of the B1-scan output switching device B1-SCO and is connected between the A1-set node A1-Q and a twenties discharging voltage line which transfers a twenties discharging voltage VSS20. That is, the tenth A1-control switching device A1-CTr10 is turned on or off in response to the voltage applied to the gate electrode of the B1-scan output switching device B1-SCO, and interconnects the A1-set node A1-Q and the twenties discharging voltage line when turned on.

A tenth A2-control switching device A2-CTr10 in FIG. 24 is controlled by the voltage applied to the gate electrode of the B1-scan output switching device B1-SCO and is connected between the A2-set node A2-Q and the twenties discharging voltage line. That is, the tenth A2-control switching device A2-CTr10 is turned on or off in response to the voltage applied to the gate electrode of the B1-scan output switching device B1-SCO, and interconnects the A2-set node A2-Q and the twenties discharging voltage line when turned on.

A first B-control switching device B-CTr1 in FIG. 24 is controlled by the B-carry pulse B-CR_n and is connected between the B-carry output terminal B-COT and the gate electrode of the B1-scan output switching device B1-SCO.

A second B-control switching device B-CTr2 in FIG. 24 is controlled by the voltage at the B-reset node B-QB and is connected between the gate electrode of the B1-scan output switching device B 1-SCO and the eleventh discharging voltage line which transfers the eleventh discharging voltage VSS11.

A third B-control switching device B-CTr3 in FIG. 24 is controlled by an external first signal S1 and is connected between the gate electrode of the B1-scan output switching device B1-SCO and a twenty-first discharging voltage line which transfers a twenty-first discharging voltage VSS21.

A fourth B-control switching device B-CTr4 in FIG. 24 is controlled by an external second signal S2 and is connected between the gate electrode of the B1-scan output switching device B 1-SCO and a twenty-second discharging voltage line which transfers a twenty-second discharging voltage VSS22.

A fifth B-control switching device B-CTr5 in FIG. 24 is controlled by an external third signal S3 and is connected between the gate electrode of the B1-scan output switching device B1-SCO and a twenty-third discharging voltage line which transfers a twenty-third discharging voltage VSS23.

Here, the first signal S1 is any one of the A1-carry pulse and the voltage at the A1-set node A1-Q, the second signal S2 is any one of the A2-carry pulse and the voltage at the A2-set node A2-Q, and the third signal S3 is any one of the A1-start pulse A1-Vst and A2-start pulse A2-Vst.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Alternatively, the gate electrode of the first A1-control switching device A1-CTr1, the gate electrode of the first A2-control switching device A2-CTr1, the gate electrode of the tenth A1-control switching device A1-CTr10 and the gate electrode of the tenth A2-control switching device A2-CTr10 may be connected to the B-carry output terminal B-COT.

Fifth Embodiment of Stage

Figure 25:
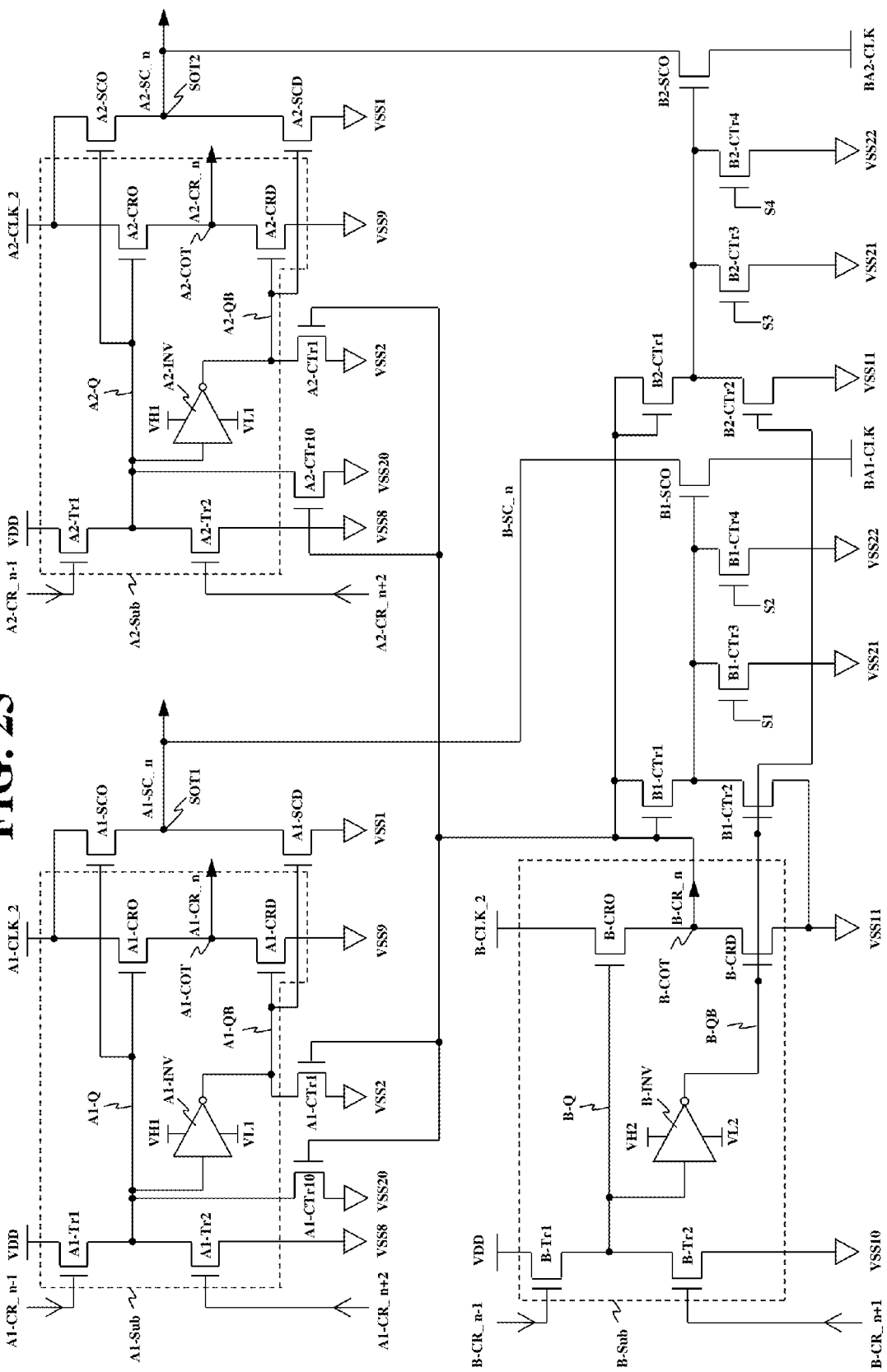
FIG. 25 is a circuit diagram of a fifth embodiment of the circuit configuration of the A1-sub-stage, A2-sub-stage, B-sub-stage and scan output controller provided in the nth stage.

FIG. 25 is a circuit diagram of a fifth embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the fifth embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 25 are the same as those in FIG. 9, stated previously, respectively.

A tenth A1-control switching device A1-CTr10 and a tenth A2-control switching device A2-CTr10 in FIG. 25 are the same as those in FIG. 22, stated previously, respectively.

A first B1-control switching device B1-CTr1 in FIG. 25 is controlled by the B-carry pulse B-CR_n and is connected between the B-carry output terminal B-COT and the gate electrode of the B1-scan output switching device B1-SCO.

A second B1-control switching device B1-CTr2 in FIG. 25 is controlled by the voltage at the B-reset node B-QB and is connected between the gate electrode of the B1-scan output switching device B1-SCO and the eleventh discharging voltage line which transfers the eleventh discharging voltage VSS11.

A third B1-control switching device B1-CTr3 in FIG. 25 is controlled by an external first signal S1 and is connected between the gate electrode of the B1-scan output switching device B1-SCO and a twenty-first discharging voltage line which transfers a twenty-first discharging voltage VSS21.

A fourth B1-control switching device B1-CTr4 in FIG. 25 is controlled by an external second signal S2 and is connected between the gate electrode of the B1-scan output switching device B1-SCO and a twenty-second discharging voltage line which transfers a twenty-second discharging voltage VSS22.

A first B2-control switching device B2-CTr1 in FIG. 25 is controlled by the B-carry pulse B-CR_n and is connected between the B-carry output terminal B-COT and the gate electrode of the B2-scan output switching device B2-SCO.

A second B2-control switching device B2-CTr2 in FIG. 25 is controlled by the voltage at the B-reset node B-QB and is connected between the gate electrode of the B2-scan output switching device B2-SCO and the eleventh discharging voltage line.

A third B2-control switching device B2-CTr3 in FIG. 25 is controlled by an external third signal S3 and is connected between the gate electrode of the B2-scan output switching device B2-SCO and the twenty-first discharging voltage line.

A fourth B2-control switching device B2-CTr4 in FIG. 25 is controlled by an external fourth signal S4 and is connected between the gate electrode of the B2-scan output switching device B2-SCO and the twenty-second discharging voltage line.

Here, the first signal S1 is any one of the A1-carry pulse and the voltage at the A1-set node A1-Q, the second signal S2 is the A1-start pulse A1-Vst, the third signal S3 is any one of the A2-carry pulse and the voltage at the A2-set node A2-Q, and the fourth signal S4 is the A2-start pulse A2-Vst.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Alternatively, the gate electrode of the first A1-control switching device A1-CTr1 and the gate electrode of the tenth A1-control switching device A1-CTr10 may be connected to the gate electrode of the B1-scan output switching device B1-SCO.

Also, the gate electrode of the first A2-control switching device A2-CTr1 and the gate electrode of the tenth A2-control switching device A2-CTr10 may be connected to the gate electrode of the B2-scan output switching device B2-SCO.

On the other hand, the A1-start pulse A1-Vst and the A2-start pulse A2-Vst may be the same.

Sixth Embodiment of Stage

Figure 26:
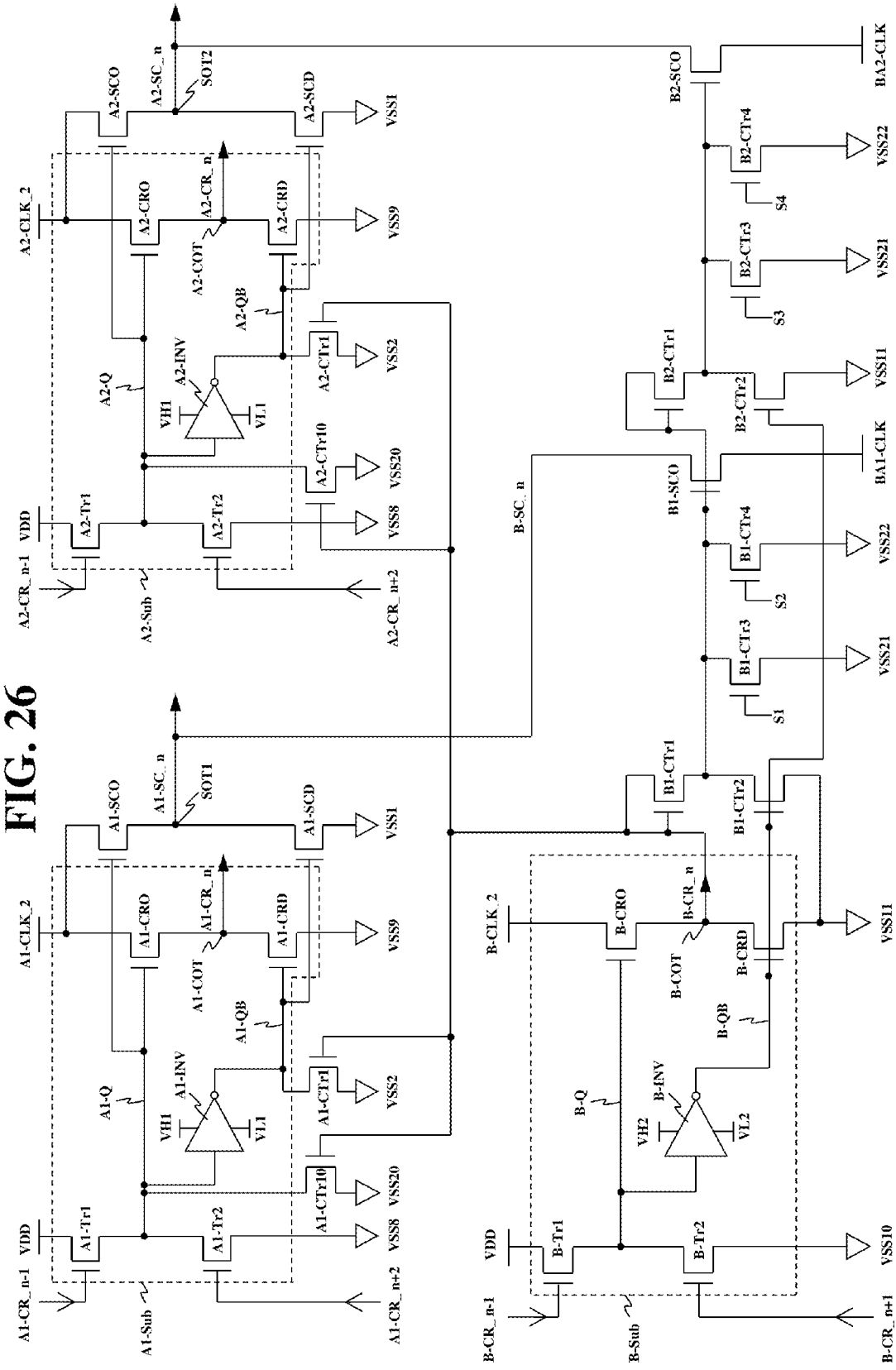
FIG. 26 is a circuit diagram of a sixth embodiment of the circuit configuration of the A1-sub-stage, A2-sub-stage, B-sub-stage and scan output controller provided in the nth stage.

FIG. 26 is a circuit diagram of a sixth embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the sixth embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 26 are the same as those in FIG. 9, stated previously, respectively.

A tenth A1-control switching device A1-CTr10 and a tenth A2-control switching device A2-CTr10 in FIG. 26 are the same as those in FIG. 22, stated previously, respectively.

A first B1-control switching device B1-CTr1 in FIG. 26 is controlled by the B-carry pulse B-CR_n and is connected between the B-carry output terminal B-COT and the gate electrode of the B1-scan output switching device B1-SCO.

A second B1-control switching device B1-CTr2 in FIG. 26 is controlled by the voltage at the B-reset node B-QB and is connected between the gate electrode of the B1-scan output switching device B1-SCO and the eleventh discharging voltage line which transfers the eleventh discharging voltage VSS11.

A third B1-control switching device B1-CTr3 in FIG. 26 is controlled by an external first signal S1 and is connected between the gate electrode of the B1-scan output switching device B1-SCO and a twenty-first discharging voltage line which transfers a twenty-first discharging voltage VSS21.

A fourth B1-control switching device B1-CTr4 in FIG. 26 is controlled by an external second signal S2 and is connected between the gate electrode of the B1-scan output switching device B1-SCO and a twenty-second discharging voltage line which transfers a twenty-second discharging voltage VSS22.

A first B2-control switching device B2-CTr1 in FIG. 26 is controlled by a voltage applied to the gate electrode of the B1-scan output switching device B1-SCO and is connected between the gate electrode of the B1-scan output switching device B1-SCO and the gate electrode of the B2-scan output switching device B2-SCO.

A second B2-control switching device B2-CTr2 in FIG. 26 is controlled by the voltage at the B-reset node B-QB and is connected between the gate electrode of the B2-scan output switching device B2-SCO and the eleventh discharging voltage line.

A third B2-control switching device B2-CTr3 in FIG. 26 is controlled by an external third signal S3 and is connected between the gate electrode of the B2-scan output switching device B2-SCO and the twenty-first discharging voltage line.

A fourth B2-control switching device B2-CTr4 in FIG. 26 is controlled by an external fourth signal S4 and is connected between the gate electrode of the B2-scan output switching device B2-SCO and the twenty-second discharging voltage line.

Here, the first signal S1 is any one of the A1-carry pulse and the voltage at the A1-set node A1-Q, the second signal S2 is any one of the A1-start pulse A1-Vst and A2-start pulse A2-Vst, the third signal S3 is any one of the A2-carry pulse and A2-set control signal, and the fourth signal S4 is any one of the A1-start pulse A1-Vst and A2-start pulse A2-Vst.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Alternatively, the gate electrode of the first A1-control switching device A1-CTr1 and the gate electrode of the tenth A1-control switching device A1-CTr10 may be connected to the gate electrode of the B1-scan output switching device B1-SCO.

Also, the gate electrode of the first A2-control switching device A2-CTr1 and the gate electrode of the tenth A2-control switching device A2-CTr10 may be connected to the gate electrode of the B2-scan output switching device B2-SCO.

On the other hand, the A1-start pulse A1-Vst and the A2-start pulse A2-Vst may be the same.

Seventh Embodiment of Stage

Figure 27:
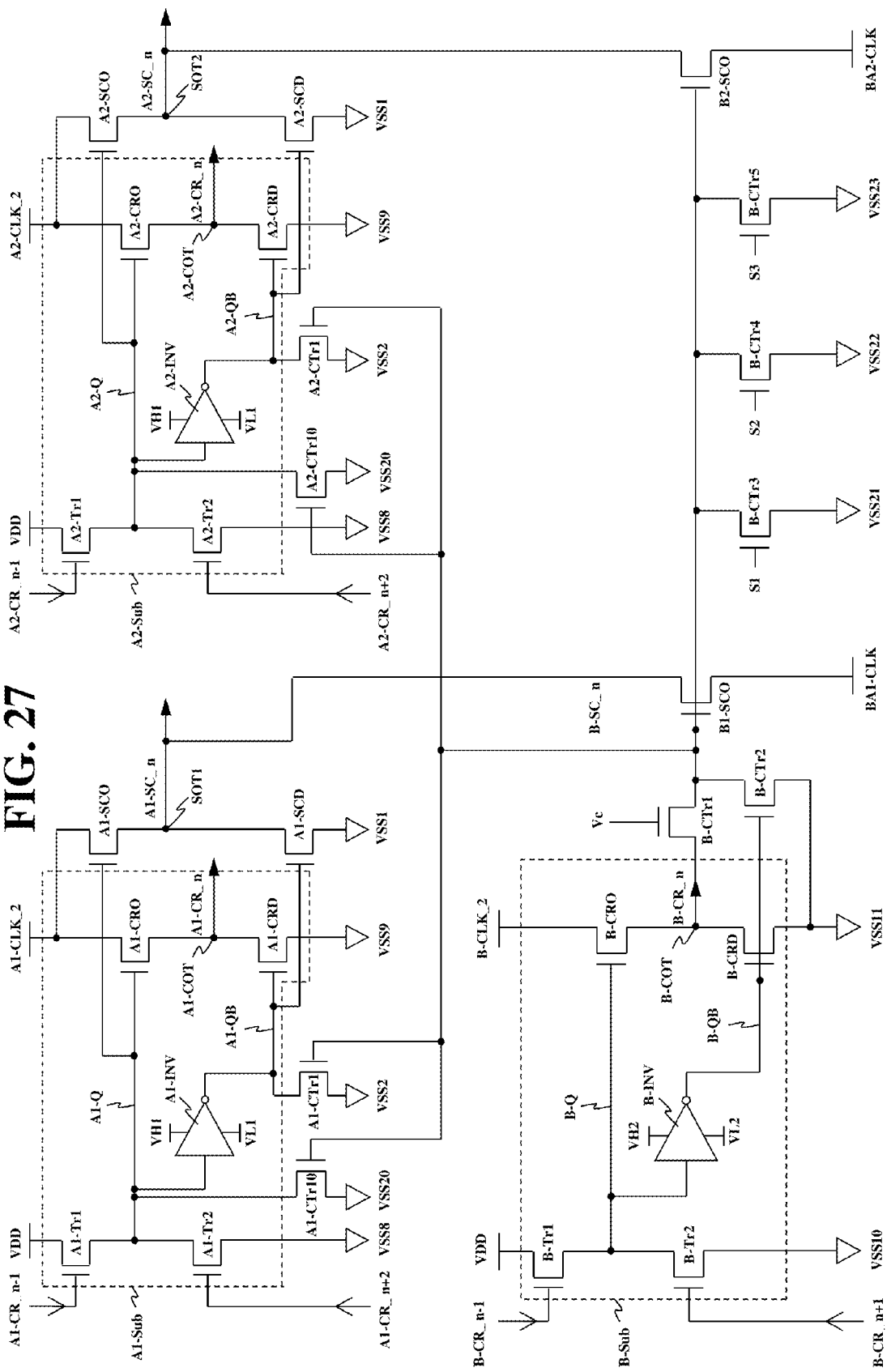
FIG. 27 is a circuit diagram of a seventh embodiment of the circuit configuration of the A1-sub-stage, A2-sub-stage, B-sub-stage and scan output controller provided in the nth stage.

FIG. 27 is a circuit diagram of a seventh embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the seventh embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 27 are the same as those in FIG. 19, stated previously, respectively.

A tenth A1-control switching device A1-CTr10 and a tenth A2-control switching device A2-CTr10 in FIG. 27 are the same as those in FIG. 24, stated previously, respectively.

A first B-control switching device B-CTr1 in FIG. 27 is controlled by an external switching control signal Vc and is connected between the B-carry output terminal B-COT and the gate electrode of the B1-scan output switching device B1-SCO.

A second B-control switching device B-CTr2 in FIG. 27 is controlled by the voltage at the B-reset node B-QB and is connected between the gate electrode of the B1-scan output switching device B1-SCO and the eleventh discharging voltage line which transfers the eleventh discharging voltage VSS11.

A third B-control switching device B-CTr3 in FIG. 27 is controlled by an external first signal S1 and is connected between the gate electrode of the B1-scan output switching device B1-SCO and a twenty-first discharging voltage line which transfers a twenty-first discharging voltage VSS21.

A fourth B-control switching device B-CTr4 in FIG. 27 is controlled by an external second signal S2 and is connected between the gate electrode of the B1-scan output switching device B1-SCO and a twenty-second discharging voltage line which transfers a twenty-second discharging voltage VSS22.

A fifth B-control switching device B-CTr5 in FIG. 27 is controlled by an external third signal S3 and is connected between the gate electrode of the B1-scan output switching device B1-SCO and a twenty-third discharging voltage line which transfers a twenty-third discharging voltage VSS23.

Here, the first signal S1 is any one of the A1-carry pulse and the voltage at the A1-set node A1-Q, the second signal S2 is any one of the A2-carry pulse and the voltage at the A2-set node A2-Q, and the third signal S3 is any one of the A1-start pulse A1-Vst and A2-start pulse A2-Vst.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Alternatively, the gate electrode of the first A1-control switching device A1-CTr1, the gate electrode of the first A2-control switching device A2-CTr1, the gate electrode of the tenth A1-control switching device A1-CTr10 and the gate electrode of the tenth A2-control switching device A2-CTr10 may be connected to the B-carry output terminal B-COT.

Eighth Embodiment of Stage

Figure 28:
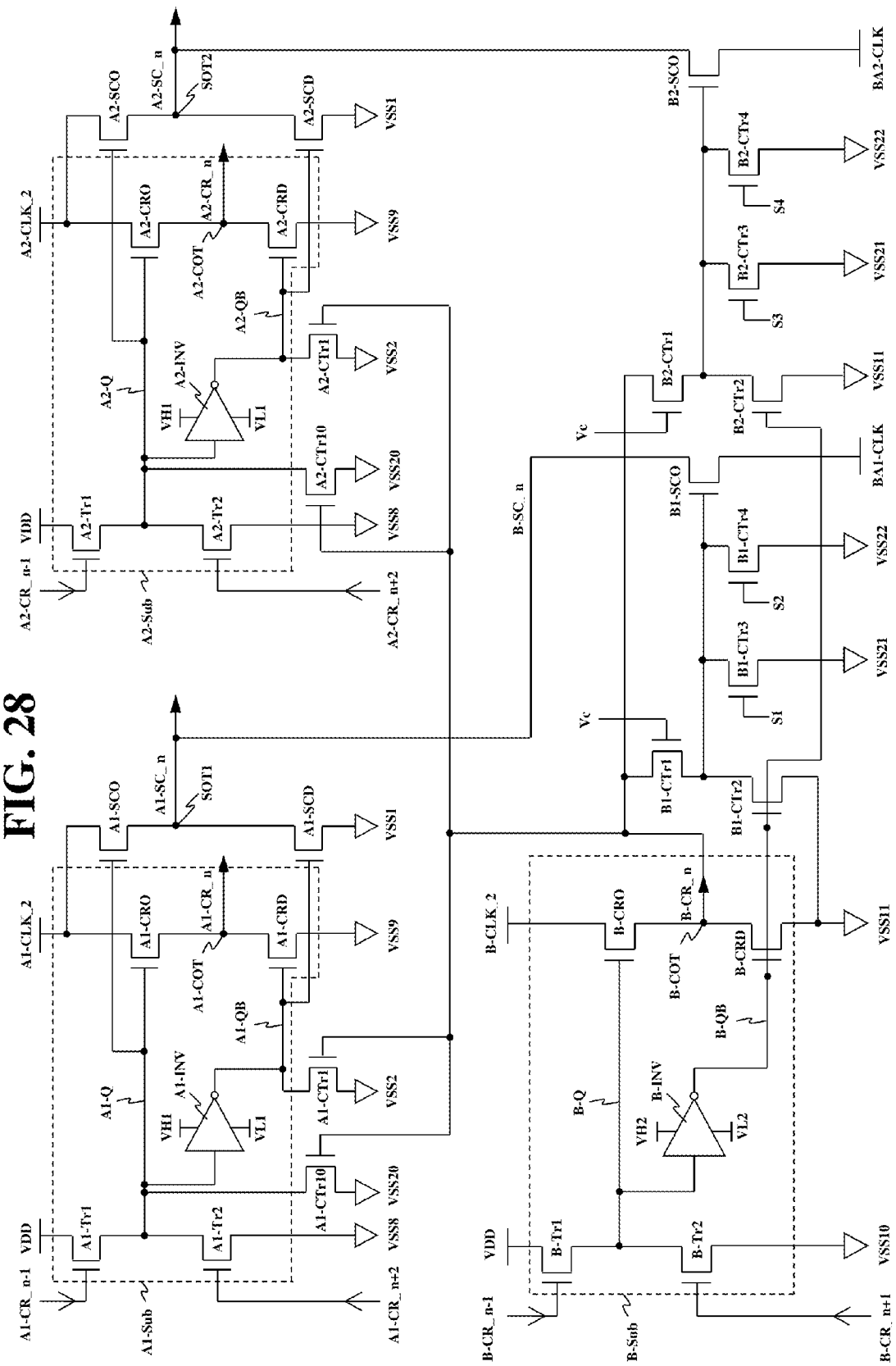
FIG. 28 is a circuit diagram of an eighth embodiment of the circuit configuration of the A1-sub-stage, A2-sub-stage, B-sub-stage and scan output controller provided in the nth stage.

FIG. 28 is a circuit diagram of an eighth embodiment of the circuit configuration of the A1-sub-stage A1-Sub, A2-sub-stage A2-Sub, B-sub-stage B-Sub and scan output controller SOC provided in the nth stage.

The configurations of the A1-sub-stage A1-Sub, A2-sub-stage A2-Sub and B-sub-stage B-Sub in the eighth embodiment are the same as those in the first embodiment, stated above, respectively, and a description thereof will thus be replaced by the above description of the first embodiment.

An A1-scan output switching device A1-SCO, B1-scan output switching device B1-SCO, A1-scan discharge switching device A1-SCD, first A1-control switching device A1-CTr1, A2-scan output switching device A2-SCO, B2-scan output switching device B2-SCO, A2-scan discharge switching device A2-SCD and first A2-control switching device A2-CTr1 in FIG. 28 are the same as those in FIG. 9, stated previously, respectively.

A tenth A1-control switching device A1-CTr10 and a tenth A2-control switching device A2-CTr10 in FIG. 28 are the same as those in FIG. 22, stated previously, respectively.

A first B1-control switching device B1-CTr1 in FIG. 28 is controlled by an external switching control signal Vc and is connected between the B-carry output terminal B-COT and the gate electrode of the B1-scan output switching device B1-SCO.

A second B1-control switching device B1-CTr2 in FIG. 28 is controlled by the voltage at the B-reset node B-QB and is connected between the gate electrode of the B1-scan output switching device B1-SCO and the eleventh discharging voltage line which transfers the eleventh discharging voltage VSS11.

A third B1-control switching device B1-CTr3 in FIG. 28 is controlled by an external first signal S1 and is connected between the gate electrode of the B1-scan output switching device B1-SCO and a twenty-first discharging voltage line which transfers a twenty-first discharging voltage VSS21.

A fourth B1-control switching device B1-CTr4 in FIG. 28 is controlled by an external second signal S2 and is connected between the gate electrode of the B1-scan output switching device B1-SCO and a twenty-second discharging voltage line which transfers a twenty-second discharging voltage VSS22.

A first B2-control switching device B2-CTr1 in FIG. 28 is controlled by the switching control signal Vc and is connected between the B-carry output terminal B-COT and the gate electrode of the B2-scan output switching device B2-SCO.

A second B2-control switching device B2-CTr2 in FIG. 28 is controlled by the voltage at the B-reset node B-QB and is connected between the gate electrode of the B2-scan output switching device B2-SCO and the eleventh discharging voltage line.

A third B2-control switching device B2-CTr3 in FIG. 28 is controlled by an external third signal S3 and is connected between the gate electrode of the B2-scan output switching device B2-SCO and the twenty-first discharging voltage line.

A fourth B2-control switching device B2-CTr4 in FIG. 28 is controlled by an external fourth signal S4 and is connected between the gate electrode of the B2-scan output switching device B2-SCO and the twenty-second discharging voltage line.

Here, the first signal S1 is any one of the A1-carry pulse and the voltage at the A1-set node A1-Q, the second signal S2 is the A1-start pulse A1-Vst, the third signal S3 is any one of the A2-carry pulse and the voltage at the A2-set node A2-Q, and the fourth signal S4 is the A2-start pulse A2-Vst.

On the other hand, the gate electrode of the first A1-control switching device A1-CTr1 may be connected to the first scan output terminal SOT1.

Also, the gate electrode of the first A2-control switching device A2-CTr1 may be connected to the second scan output terminal SOT2.

Alternatively, the gate electrode of the first A1-control switching device A1-CTr1 and the gate electrode of the tenth A1-control switching device A1-CTr10 may be connected to the gate electrode of the B1-scan output switching device B1-SCO.

Also, the gate electrode of the first A2-control switching device A2-CTr1 and the gate electrode of the tenth A2-control switching device A2-CTr10 may be connected to the gate electrode of the B2-scan output switching device B2-SCO.

On the other hand, the A1-start pulse A1-Vst and the A2-start pulse A2-Vst may be the same.

First Embodiment of A1-Inverter A1-INV

Figure 29:
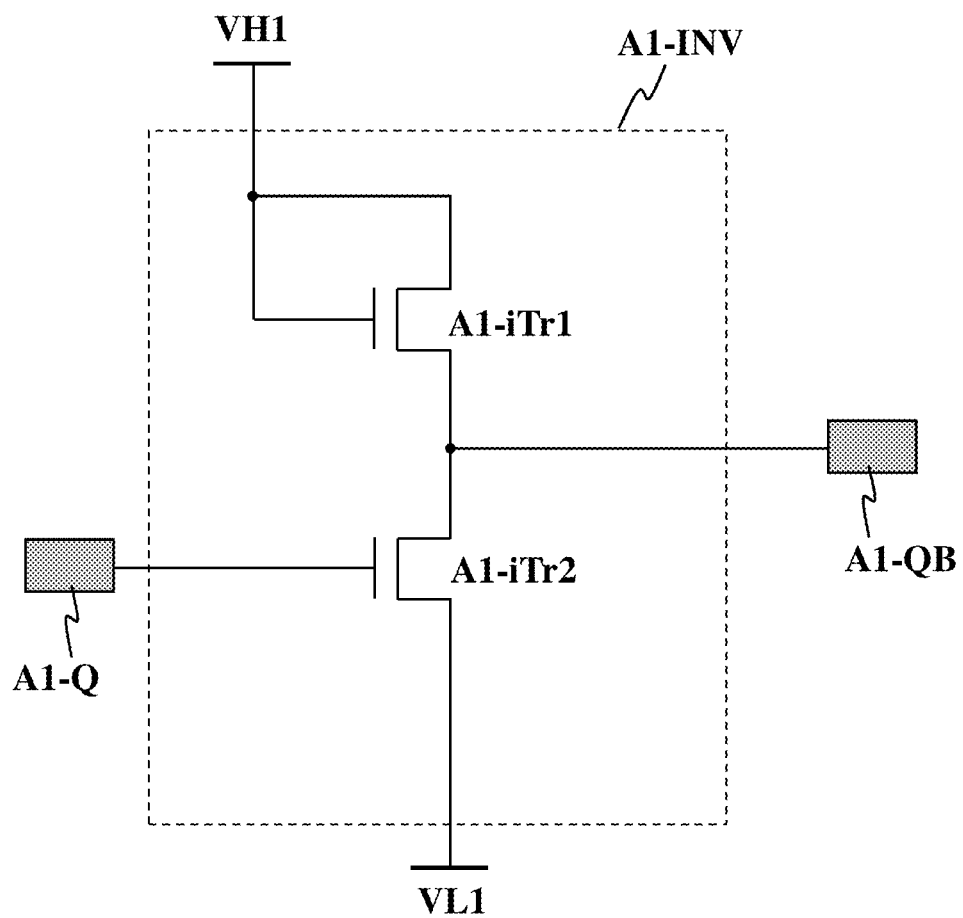
FIG. 29 is a detailed circuit diagram of a first embodiment of an A1-inverter.

FIG. 29 is a detailed circuit diagram of a first embodiment of the A1-inverter A1-INV.

The A1-inverter A1-INV of the nth A1-sub-stage A1-Sub includes a first A1-inverting switching device A1-iTr1 and a second A1-inverting switching device A1-iTr2, as shown in FIG. 29.

The first A1-inverting switching device A1-iTr1 of the nth A1-sub-stage A1-Sub is controlled by the first high voltage VH1 from a high voltage line and is connected between the high voltage line and the A1-reset node A1-QB. That is, the first A1-inverting switching device A1-iTr1 is turned on or off in response to the first high voltage VH1, and interconnects the high voltage line and the A1-reset node A1-QB when turned on.

The second A1-inverting switching device A1-iTr2 of the nth A1-sub-stage A1-Sub is controlled by the voltage at the A1-set node A1-Q and is connected between the A1-reset node A1-QB and a low voltage line. That is, the second A1-inverting switching device A1-iTr2 is turned on or off in response to the voltage at the A1-set node A1-Q, and interconnects the A1-reset node A1-QB and the low voltage line when turned on. The low voltage line is supplied with the first low voltage VL1.

Here, the second A1-inverting switching device A1-iTr2 is larger in size (for example, channel width) than the first A1-inverting switching device A1-iTr1 such that the A1-reset node A1-QB is kept discharged when the first A1-inverting switching device A1-iTr1 and the second A1-inverting switching device A1-iTr2 are both kept on.

Second Embodiment of A1-Inverter A1-INV

Figure 30:
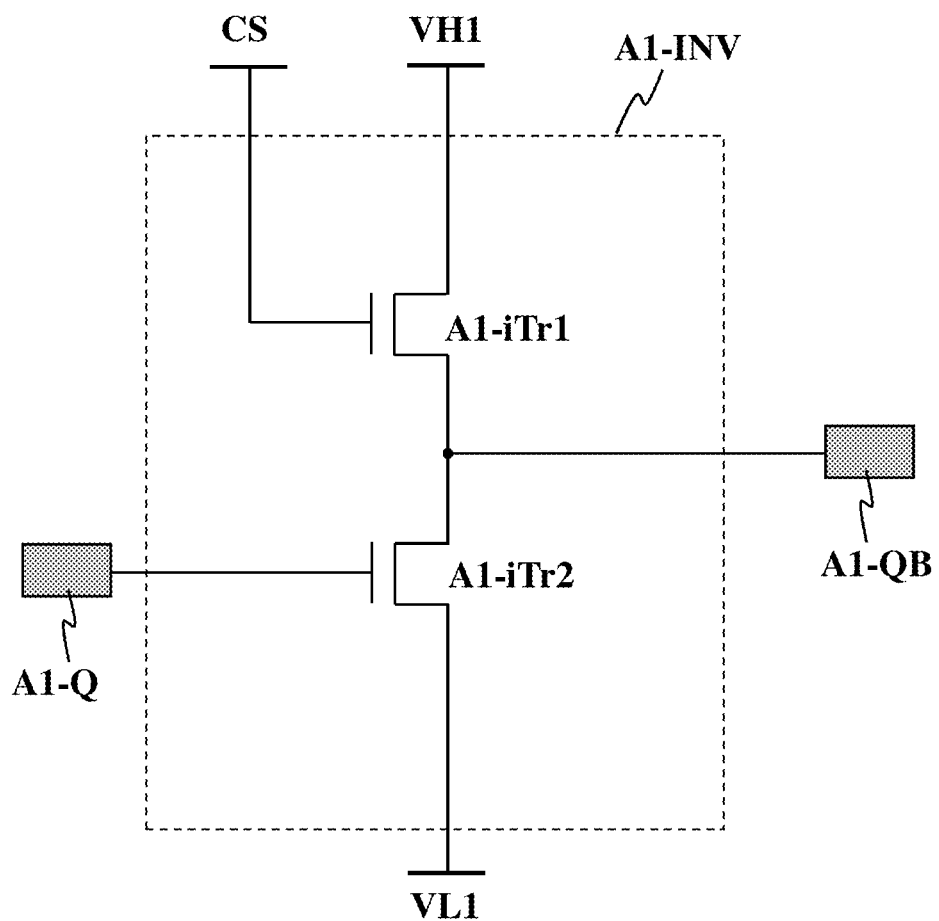
FIG. 30 is a detailed circuit diagram of a second embodiment of the A1-inverter.

FIG. 30 is a detailed circuit diagram of a second embodiment of the A1-inverter A1-INV.

The A1-inverter A1-INV of the nth A1-sub-stage A1-Sub includes a first A1-inverting switching device A1-iTr1 and a second A1-inverting switching device A1-iTr2, as shown in FIG. 30.

The first A1-inverting switching device A1-iTr1 of the nth A1-sub-stage A1-Sub is controlled by an external control signal CS and is connected between a high voltage line and the A1-reset node A1-QB. That is, the first A1-inverting switching device A1-iTr1 is turned on or off in response to the control signal CS, and interconnects the high voltage line and the A1-reset node A1-QB when turned on. The high voltage line is supplied with the first high voltage VH1.

The second A1-inverting switching device A1-iTr2 of the nth A1-sub-stage A1-Sub is controlled by the voltage at the A1-set node A1-Q and is connected between the A1-reset node A1-QB and a low voltage line. That is, the second A1-inverting switching device A1-iTr2 is turned on or off in response to the voltage at the A1-set node A1-Q, and interconnects the A1-reset node A1-QB and the low voltage line when turned on. The low voltage line is supplied with the first low voltage VL1.

Here, the control signal CS is kept at a low voltage when the A1-set node A1-Q is kept charged (i.e., high), and at a high voltage when the A1-set node A1-Q is kept discharged (i.e., low). When the control signal CS has the high voltage, the first A1-inverting switching device A1-iTr1, supplied with the control signal CS, is turned on. In contrast, when the control signal CS has the low voltage, the first A1-inverting switching device A1-iTr1, supplied with the control signal CS, is turned off.

Also, the second A1-inverting switching device A1-iTr2 is larger in size (for example, channel width) than the first A1-inverting switching device A1-iTr1 such that the A1-reset node A1-QB is kept discharged when the first A1-inverting switching device A1-iTr1 and the second A1-inverting switching device A1-iTr2 are both kept on.

Third Embodiment of A1-Inverter A1-INV

Figure 31:
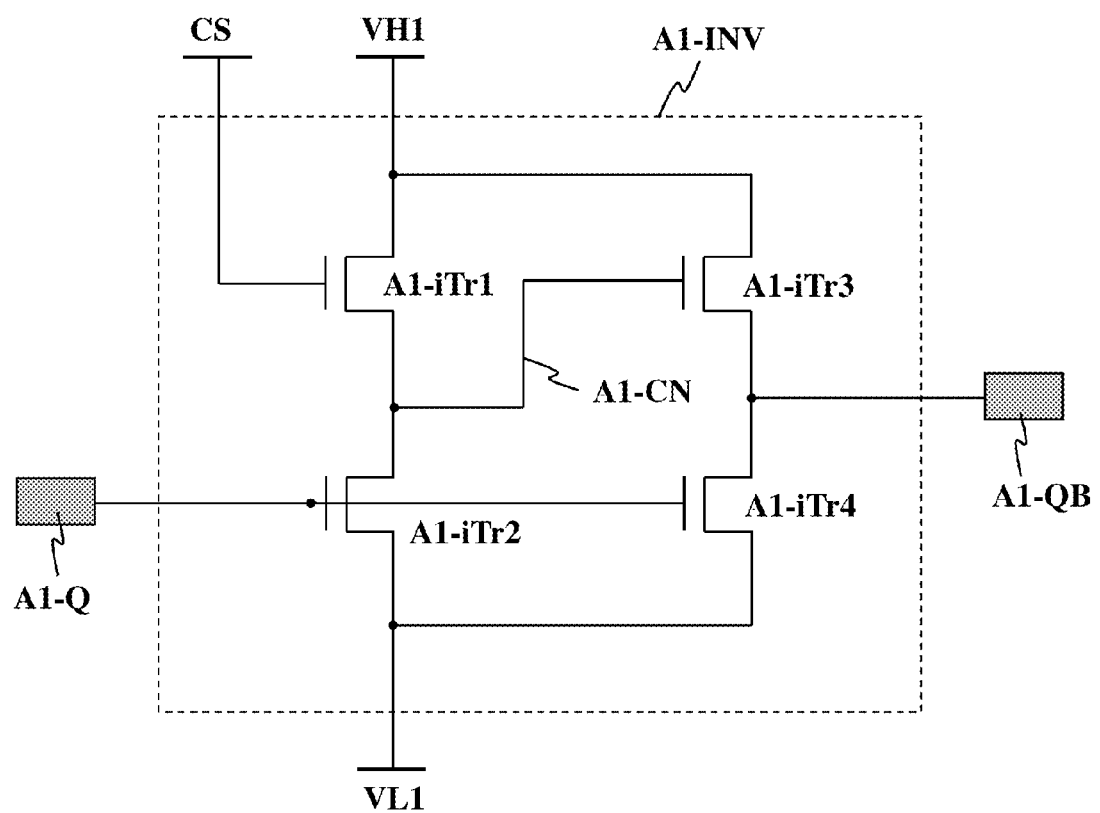
FIG. 31 is a detailed circuit diagram of a third embodiment of the A1-inverter.

FIG. 31 is a detailed circuit diagram of a third embodiment of the A1-inverter A1-INV.

The A1-inverter A1-INV of the nth A1-sub-stage A1-Sub includes first to fourth A1-inverting switching devices A1-iTr1 to A1-iTr4, as shown in FIG. 31.

The first A1-inverting switching device A1-iTr1 of the nth A1-sub-stage A1-Sub is controlled by an external control signal CS and is connected between a high voltage line and an A1-common node A1-CN. That is, the first A1-inverting switching device A1-iTr1 is turned on or off in response to the control signal CS, and interconnects the high voltage line and the A1-common node A1-CN when turned on. The high voltage line is supplied with the first high voltage VH1.

The second A1-inverting switching device A1-iTr2 of the nth A1-sub-stage A1-Sub is controlled by the voltage at the A1-set node A1-Q and is connected between the A1-common node A1-CN and a low voltage line. That is, the second A1-inverting switching device A1-iTr2 is turned on or off in response to the voltage at the A1-set node A1-Q, and interconnects the A1-common node A1-CN and the low voltage line when turned on. The low voltage line is supplied with the first low voltage VL1.

The third A1-inverting switching device A1-iTr3 of the nth A1-sub-stage A1-Sub is controlled by a voltage at the A1-common node A1-CN and is connected between the high voltage line and the A1-reset node A1-QB. That is, the third A1-inverting switching device A1-iTr3 is turned on or off in response to the voltage at the A1-common node A1-CN, and interconnects the high voltage line and the A1-reset node A1-QB when turned on.

The fourth A1-inverting switching device A1-iTr4 of the nth A1-sub-stage A1-Sub is controlled by the voltage at the A1-set node A1-Q and is connected between the A1-reset node A1-QB and the low voltage line. That is, the fourth A1-inverting switching device A1-iTr4 is turned on or off in response to the voltage at the A1-set node A1-Q, and interconnects the A1-reset node A1-QB and the low voltage line when turned on. The low voltage line is supplied with the first low voltage VL1, as stated above.

Here, the control signal CS is kept at a low voltage when the A1-set node A1-Q is kept charged (i.e., high), and at a high voltage when the A1-set node A1-Q is kept discharged (i.e., low). When the control signal CS has the high voltage, the first A1-inverting switching device A1-iTr1, supplied with the control signal CS, is turned on. In contrast, when the control signal CS has the low voltage, the first A1-inverting switching device A1-iTr1, supplied with the control signal CS, is turned off.

Also, the second A1-inverting switching device A1-iTr2 is larger in size (for example, channel width) than the first A1-inverting switching device A1-iTr1 such that the A1-reset node A1-QB is kept discharged when the first A1-inverting switching device A1-iTr1 and the second A1-inverting switching device A1-iTr2 are both kept on.

Fourth Embodiment of A1-Inverter A1-INV

Figure 32:
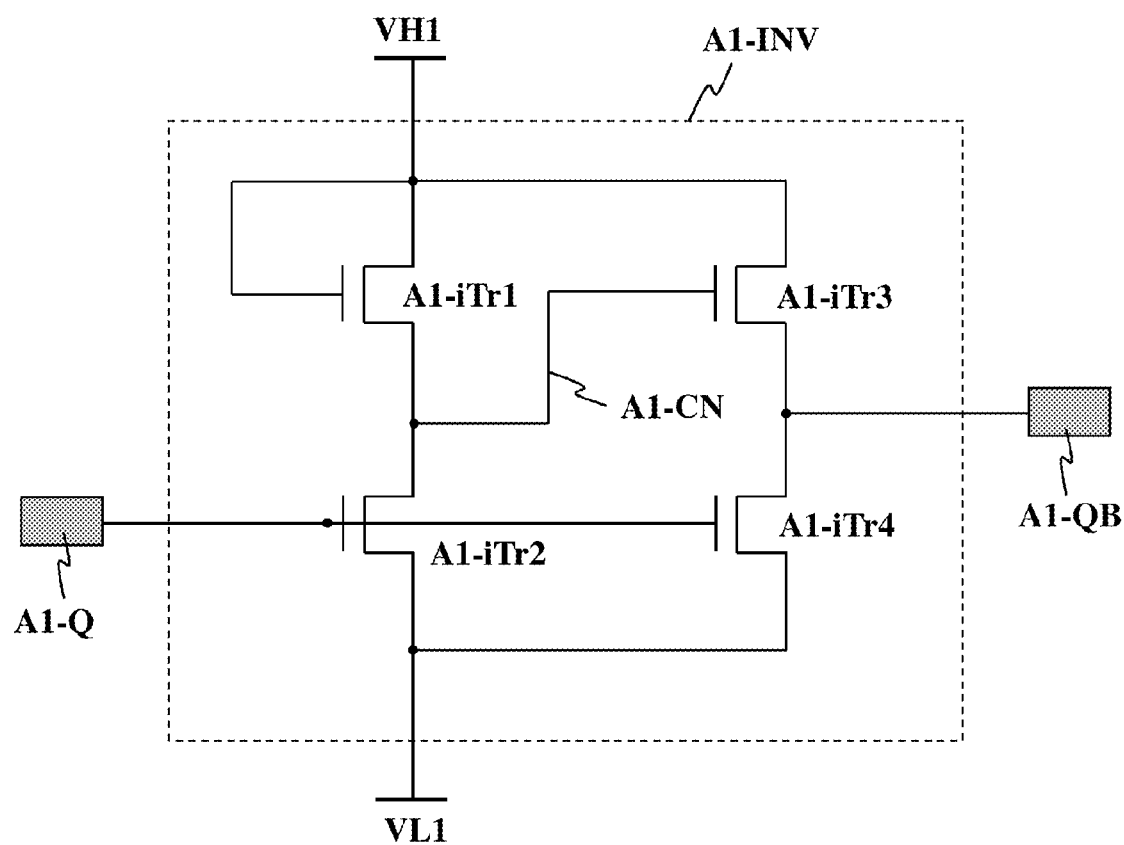
FIG. 32 is a detailed circuit diagram of a fourth embodiment of the A1-inverter.

FIG. 32 is a detailed circuit diagram of a fourth embodiment of the A1-inverter A1-INV.

The A1-inverter A1-INV of the nth A1-sub-stage A1-Sub includes first to fourth A1-inverting switching devices A1-iTr1 to A1-iTr4, as shown in FIG. 32.

The first A1-inverting switching device A1-iTr1 of the nth A1-sub-stage A1-Sub is controlled by the first high voltage VH1 from a high voltage line and is connected between the high voltage line and an A1-common node A1-CN. That is, the first A1-inverting switching device A1-iTr1 is turned on or off in response to the first high voltage VH1, and interconnects the high voltage line and the A1-common node A1-CN when turned on.

The second A1-inverting switching device A1-iTr2 of the nth A1-sub-stage A1-Sub is controlled by the voltage at the A1-set node A1-Q and is connected between the A1-common node A1-CN and a low voltage line. That is, the second A1-inverting switching device A1-iTr2 is turned on or off in response to the voltage at the A1-set node A1-Q, and interconnects the A1-common node A1-CN and the low voltage line when turned on. The low voltage line is supplied with the first low voltage VL1.

The third A1-inverting switching device A1-iTr3 of the nth A1-sub-stage A1-Sub is controlled by a voltage at the A1-common node A1-CN and is connected between the high voltage line and the A1-reset node A1-QB. That is, the third A1-inverting switching device A1-iTr3 is turned on or off in response to the voltage at the A1-common node A1-CN, and interconnects the high voltage line and the A1-reset node A1-QB when turned on.

The fourth A1-inverting switching device A1-iTr4 of the nth A1-sub-stage A1-Sub is controlled by the voltage at the A1-set node A1-Q and is connected between the A1-reset node A1-QB and the low voltage line. That is, the fourth A1-inverting switching device A1-iTr4 is turned on or off in response to the voltage at the A1-set node A1-Q, and interconnects the A1-reset node A1-QB and the low voltage line when turned on. The low voltage line is supplied with the first low voltage VL1, as stated above.

Here, the second A1-inverting switching device A1-iTr2 is larger in size (for example, channel width) than the first A1-inverting switching device A1-iTr1 such that the A1-reset node A1-QB is kept discharged when the first A1-inverting switching device A1-iTr1 and the second A1-inverting switching device A1-iTr2 are both kept on.

Fifth Embodiment of A1-Inverter A1-INV

Figure 33:
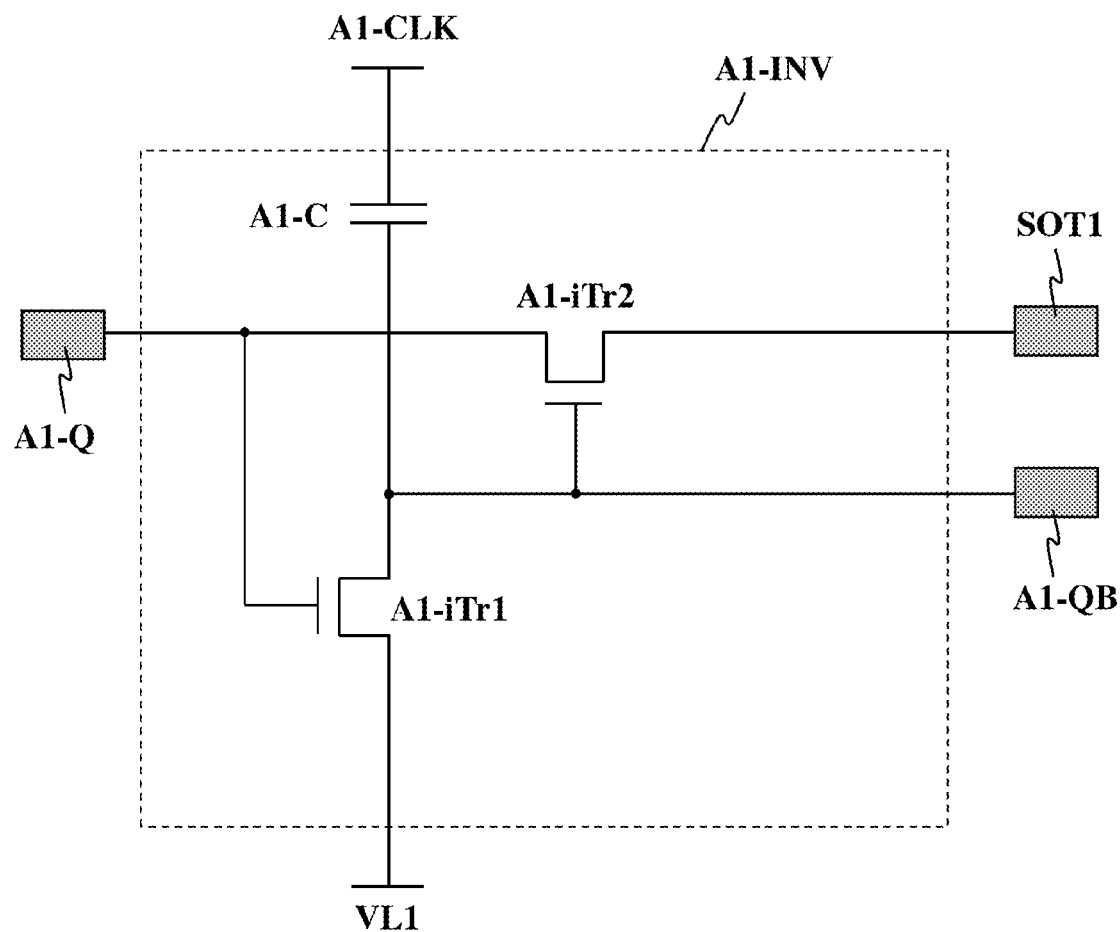
FIG. 33 is a detailed circuit diagram of a fifth embodiment of the A1-inverter.

FIG. 33 is a detailed circuit diagram of a fifth embodiment of the A1-inverter A1-INV.

The A1-inverter A1-INV of the nth A1-sub-stage A1-Sub includes a first A1-inverting switching device A1-iTr1, a second A1-inverting switching device A1-iTr2, and a capacitor C, as shown in FIG. 33.

The first A1-inverting switching device A1-iTr1 of the nth A1-sub-stage A1-Sub is controlled by the voltage at the A1-set node A1-Q and is connected between the A1-reset node A1-QB and a low voltage line. That is, the first A1-inverting switching device A1-iTr1 is turned on or off in response to the voltage at the A1-set node A1-Q, and interconnects the A1-reset node A1-QB and the low voltage line when turned on. The low voltage line is supplied with the first low voltage VL1.

The second A1-inverting switching device A1-iTr2 of the nth A1-sub-stage A1-Sub is controlled by the voltage at the A1-reset node A1-QB and is connected between the A1-set node A1-Q and the first scan output terminal SOT1. That is, the second A1-inverting switching device A1-iTr2 is turned on or off in response to the voltage at the A1-reset node A1-QB, and interconnects the A1-set node A1-Q and the first scan output terminal SOT1 when turned on.

The capacitor C of the nth A1-sub-stage A1-Sub is connected between any one A1-clock transfer line and the A1-reset node A1-QB. Here, the A1-clock transfer line is supplied with an A1-clock pulse A1-CLK.

Figure 34:
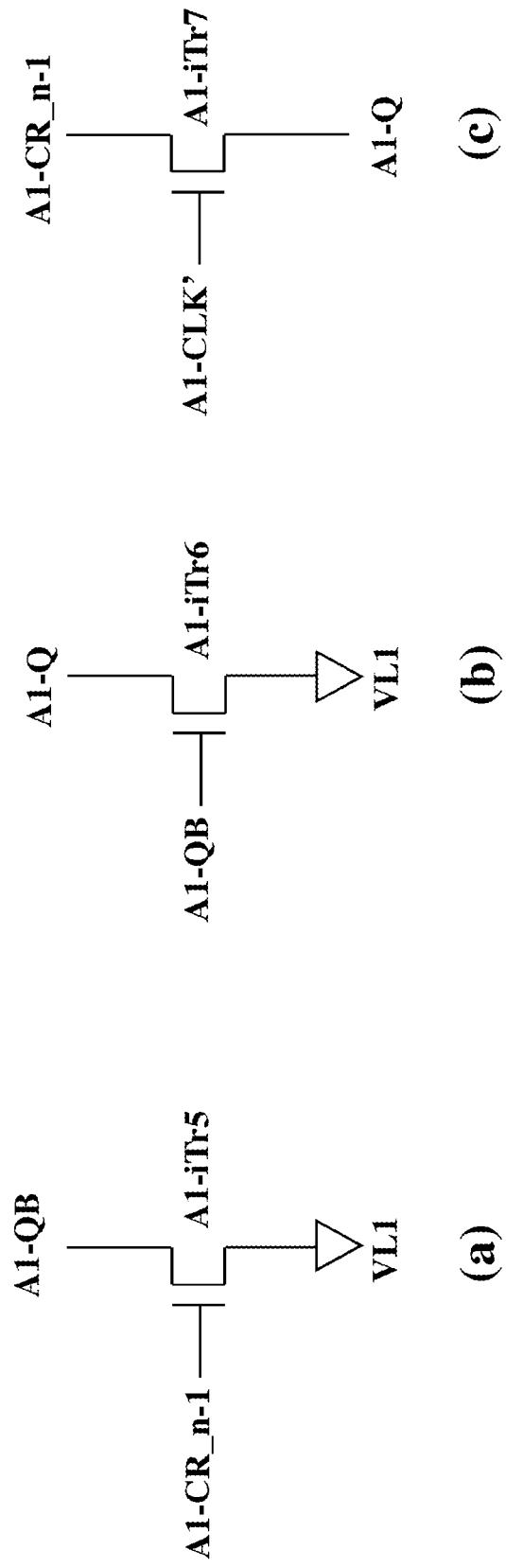
FIG. 34 is a view illustrating inverting switching devices which may be additionally provided in the A1-inverter.

FIG. 34 illustrates inverting switching devices which may be additionally provided in the A1-inverter A1-INV. The A1-inverter A1-INV according to each of the first to fifth embodiments shown in FIGS. 29 to 33 may further include at least one of three inverting switching devices A1-iTr5 to A1-iTr7 shown in FIG. 34.

Each of the three inverting switching devices A1-iTr5 to A1-iTr7 will hereinafter be described in detail.

As shown in FIG. 34(a), the fifth A1-inverting switching device A1-iTr5 of the nth A1-sub-stage A1-Sub is controlled by the A1-set control signal (i.e., the A1-carry pulse A1-CR_n−1 from the (n−1)th A1-sub-stage A1-Sub) and is connected between the A1-reset node A1-QB of the nth A1-sub-stage A1-Sub and the low voltage line. That is, the fifth A1-inverting switching device A1-iTr5 is turned on or off in response to the A1-carry pulse A1-CR_n−1 from the upstream A1-sub-stage A1-Sub, and interconnects the A1-reset node A1-QB and the low voltage line when turned on.

As shown in FIG. 34(b), the sixth A1-inverting switching device A1-iTr6 of the nth A1-sub-stage A1-Sub is controlled by the voltage at the A1-reset node A1-QB and is connected between the A1-set node A1-Q and the low voltage line. That is, the sixth A1-inverting switching device A1-iTr6 is turned on or off in response to the voltage at the A1-reset node A1-QB, and interconnects the A1-set node A1-Q and the low voltage line when turned on.

As shown in FIG. 34(c), the seventh A1-inverting switching device A1-iTr7 of the nth A1-sub-stage A1-Sub is controlled by an A1-clock pulse A1-CLK from any one A1-clock transfer line and is connected between an output terminal (i.e., an A1-carry output terminal A1-COT of the (n−1)th A1-sub-stage A1-Sub) which outputs the A1-set control signal (i.e., the A1-carry pulse A1-CR_n−1 from the (n−1)th A1-sub-stage A1-Sub) and the A1-set node A1-Q of the nth A1-sub-stage A1-Sub. That is, the seventh A1-inverting switching device A1-iTr7 is turned on or off in response to the A1-clock pulse A1-CLK, and interconnects the A1-carry output terminal A1-COT of the (n−1)th A1-sub-stage A1-Sub) and the A1-set node A1-Q of the nth A1-sub-stage A1-Sub when turned on.

The A1-inverter A1-INV according to the first embodiment shown in FIG. 29 may further include one or more of the fifth to seventh A1-inverting switching devices A1-iTr5 to A1-iTr7 shown in FIG. 34.

Similarly, the A1-inverter A1-INV according to the second embodiment shown in FIG. 30 may further include one or more of the fifth to seventh A1-inverting switching devices A1-iTr5 to A1-iTr7 shown in FIG. 34.

Similarly, the A1-inverter A1-INV according to the third embodiment shown in FIG. 31 may further include one or more of the fifth to seventh A1-inverting switching devices A1-iTr5 to A1-iTr7 shown in FIG. 34.

Similarly, the A1-inverter A1-INV according to the fourth embodiment shown in FIG. 32 may further include one or more of the fifth to seventh A1-inverting switching devices A1-iTr5 to A1-iTr7 shown in FIG. 34.

Similarly, the A1-inverter A1-INV according to the fifth embodiment shown in FIG. 33 may further include one or more of the fifth to seventh A1-inverting switching devices A1-iTr5 to A1-iTr7 shown in FIG. 34.

Figure 35:
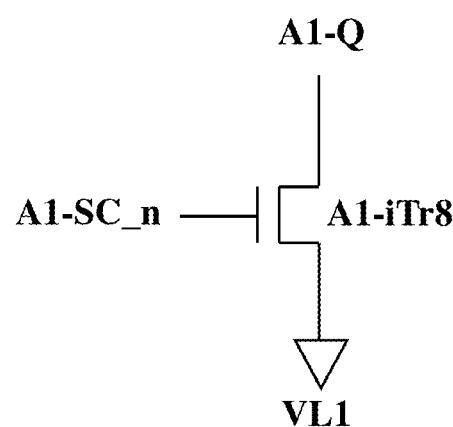
FIG. 35 is a view illustrating another inverting switching device which may be additionally provided in the third and fourth embodiments of the A1-inverter.

FIG. 35 illustrates another inverting switching device which may be additionally provided in the third and fourth embodiments of the A1-inverter A1-INV. The A1-inverter A1-INV according to each of the third and fourth embodiments shown in FIGS. 31 and 32 may further include an inverting switching device A1-iTr8 shown in FIG. 35.

This inverting switching device A1-iTr8 will hereinafter be described in detail.

As shown in FIG. 35, the eighth A1-inverting switching device A1-iTr8 of the nth A1-sub-stage A1-Sub is controlled by the voltage applied to the gate electrode GE of the B1-scan output switching device B1-SCO and is connected between the A1-common node A1-CN and the low voltage line. That is, the eighth A1-inverting switching device A1-iTr8 is turned on or off in response to the voltage applied to the gate electrode GE of the B1-scan output switching device B1-SCO, and interconnects the A1-common node A1-CN and the low voltage line when turned on.

Here, the B-carry output terminal B-COT, instead of the gate electrode GE of the B1-scan output switching device B1-SCO, may be directly connected to the gate electrode of the eighth A1-inverting switching device A1-iTr8.

On the other hand, the A2-inverter A2-INV may also have the configurations as shown in FIGS. 29 to 35. As an example, the A2-inverter A2-INV may have a configuration as shown in FIG. 36.

Figure 36:
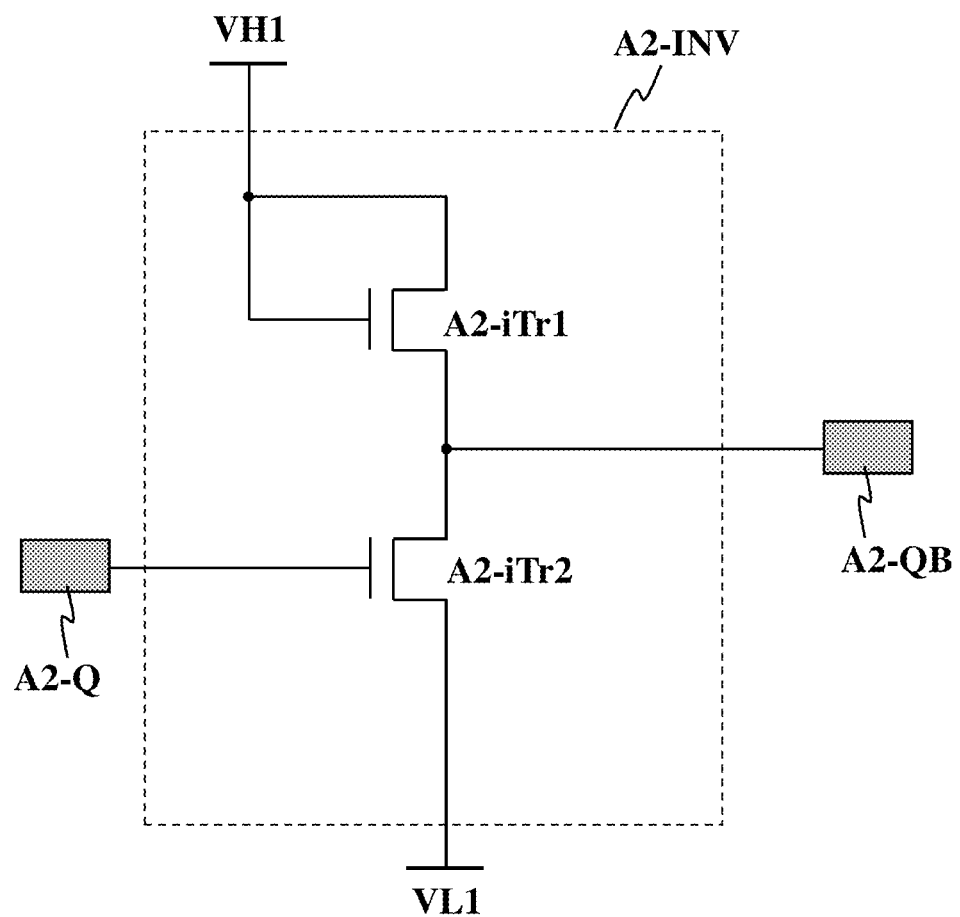
FIG. 36 is a detailed circuit diagram of an A2-inverter.

FIG. 36 is a detailed circuit diagram of the A2-inverter A2-INV.

The A2-inverter A2-INV of the nth A2-sub-stage A2-Sub includes a first A2-inverting switching device A2-iTr1 and a second A2-inverting switching device A2-iTr2, as shown in FIG. 36.

The first A2-inverting switching device A2-iTr1 of the nth A2-sub-stage A2-Sub is controlled by the first high voltage VH1 from a high voltage line and is connected between the high voltage line and the A2-reset node A2-QB. That is, the first A2-inverting switching device A2-iTr1 is turned on or off in response to the first high voltage VH1, and interconnects the high voltage line and the A2-reset node A2-QB when turned on.

The second A2-inverting switching device A2-iTr2 of the nth A2-sub-stage A2-Sub is controlled by the voltage at the A2-set node A2-Q and is connected between the A2-reset node A2-QB and a low voltage line. That is, the second A2-inverting switching device A2-iTr2 is turned on or off in response to the voltage at the A2-set node A2-Q, and interconnects the A2-reset node A2-QB and the low voltage line when turned on. The low voltage line is supplied with the first low voltage VL1.

Here, the second A2-inverting switching device A2-iTr2 is larger in size (for example, channel width) than the first A2-inverting switching device A2-iTr1 such that the A2-reset node A2-QB is kept discharged when the first A2-inverting switching device A2-iTr1 and the second A2-inverting switching device A2-iTr2 are both kept on.

Similarly, the B-inverter B-INV may also have the configurations as shown in FIGS. 29 to 35. For example, the B-inverter B-INV may have a configuration as shown in FIG. 37.

Figure 37:
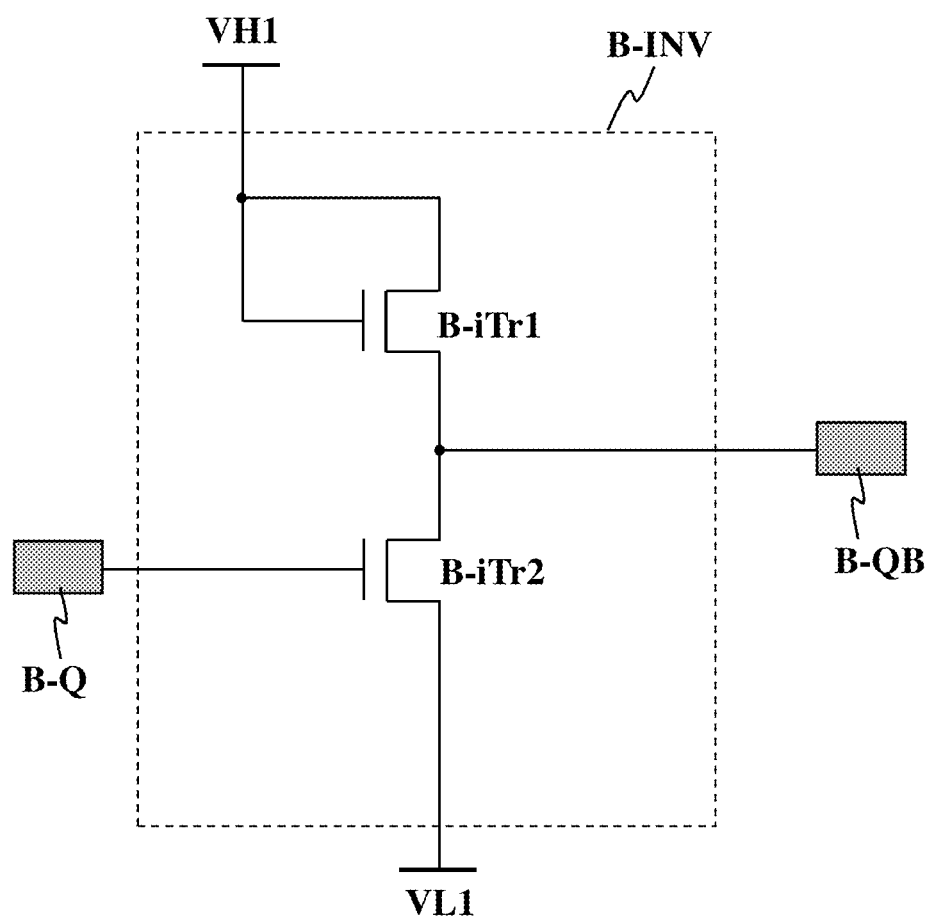
FIG. 37 is a detailed circuit diagram of a B-inverter.

FIG. 37 is a detailed circuit diagram of the B-inverter B-INV.

The B-inverter B-INV of the nth B-sub-stage B-Sub includes a first B-inverting switching device B-iTr1 and a second B-inverting switching device B-iTr2, as shown in FIG. 37.

The first B-inverting switching device B-iTr1 of the nth B-sub-stage B-Sub is controlled by the second high voltage VH2 from a high voltage line and is connected between the high voltage line and the B-reset node B-QB. That is, the first B-inverting switching device B-iTr1 is turned on or off in response to the second high voltage VH2, and interconnects the high voltage line and the B-reset node B-QB when turned on.

The second B-inverting switching device B-iTr2 of the nth B-sub-stage B-Sub is controlled by the voltage at the B-set node B-Q and is connected between the B-reset node B-QB and a low voltage line. That is, the second B-inverting switching device B-iTr2 is turned on or off in response to the voltage at the B-set node B-Q, and interconnects the B-reset node B-QB and the low voltage line when turned on. The low voltage line is supplied with the second low voltage VL2.

Here, the second B-inverting switching device B-iTr2 is larger in size (for example, channel width) than the first B-inverting switching device B-iTr1 such that the B-reset node B-QB is kept discharged when the first B-inverting switching device B-iTr1 and the second B-inverting switching device B-iTr2 are both kept on.

On the other hand, each of the A1-sub-stage A1-Sub, A2-sub-stage A2-Sub and B-sub-stage B-Sub according to the present invention may have a circuit configuration having two or more reset nodes. Hereinafter, a description will be given of circuit configurations of the A1-sub-stage A1-Sub, A2-sub-stage A2-Sub and B-sub-stage B-Sub each having two reset nodes, as one example.

Figure 38:
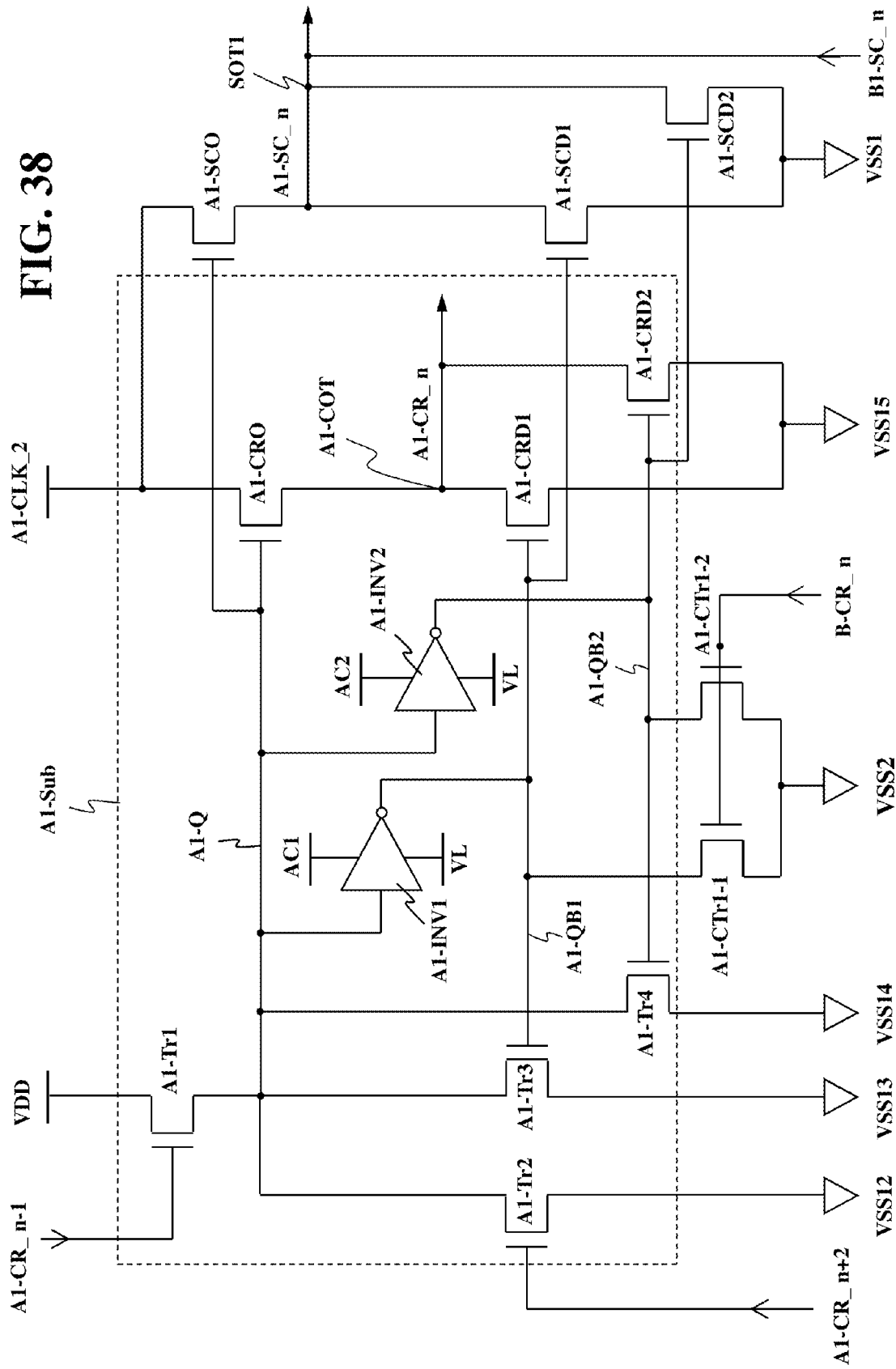
FIG. 38 is a circuit diagram of another embodiment of the A1-sub-stage in the nth stage.

FIG. 38 is a circuit diagram of another embodiment of the A1-sub-stage A1-Sub in the nth stage.

The A1-sub-stage A1-Sub of the nth stage (referred to hereinafter as an nth A1-sub-stage A1-Sub) includes first to fourth A1-switching devices A1-Tr1 to A1-Tr4, a first A1-inverter A1-INV1, a second A1-inverter A1-INV2, an A1-carry output switching device A1-CRO, a first A1-carry discharge switching device A1-CRD1, and a second A1-carry discharge switching device A1-CRD2, as shown in FIG. 38.

The first A1-switching device A1-Tr1 of the nth A1-sub-stage A1-Sub is controlled by an A1-set control signal (for example, an A1-carry pulse A1-CR_n−1 from an (n−1)th A1-sub-stage A1-Sub) and is connected between a charging voltage line and an A1-set node A1-Q. That is, the first A1-switching device A1-Tr1 is turned on or off in response to the A1-carry pulse A1-CR_n−1 from the (n−1)th A1-sub-stage A1-Sub, and interconnects the charging voltage line and the A1-set node A1-Q when turned on. Here, the charging voltage line is supplied with a charging voltage VDD. This charging voltage VDD is a DC voltage having a value capable of turning on corresponding switching devices.

Exceptionally, because there is no stage upstream of the first stage which operates earliest among all stages in one frame period T_F, the A1-sub-stage A1-Sub of the first stage (referred to hereinafter as a first A1-sub-stage A1-Sub) is supplied with an A1-start pulse A1-Vst from a timing controller (not shown). As a result, the first A1-switching device A1-Tr1 of the first A1-sub-stage A1-Sub is supplied with the A1-start pulse A1-Vst instead of an upstream A1-carry pulse.

The second A1-switching device A1-Tr2 of the nth A1-sub-stage A1-Sub is controlled by an A1-reset control signal (for example, an A1-carry pulse A1-CR_n+2 from an (n+2)th A1-sub-stage A1-Sub) and is connected between the A1-set node A1-Q and a twelfth discharging voltage line. That is, the second A1-switching device A1-Tr2 is turned on or off in response to the A1-carry pulse A1-CR_n+2 from the (n+2)th A1-sub-stage A1-Sub, and interconnects the A1-set node A1-Q and the twelfth discharging voltage line when turned on. Here, the twelfth discharging voltage line is supplied with a twelfth discharging voltage VSS12.

The third A1-switching device A1-Tr3 of the nth A1-sub-stage A1-Sub is controlled by a voltage at a first A1-reset node A1-QB1 and is connected between the A1-set node A1-Q and a thirteenth discharging voltage line. That is, the third A1-switching device A1-Tr3 is turned on or off in response to the voltage at the first A1-reset node A1-QB1, and interconnects the A1-set node A1-Q and the thirteenth discharging voltage line when turned on. Here, the thirteenth discharging voltage line is supplied with a thirteenth discharging voltage VSS13.

The fourth A1-switching device A1-Tr4 of the nth A1-sub-stage A1-Sub is controlled by a voltage at a second A1-reset node A1-QB2 and is connected between the A1-set node A1-Q and a fourteenth discharging voltage line. That is, the fourth A1-switching device A1-Tr4 is turned on or off in response to the voltage at the second A1-reset node A1-QB2, and interconnects the A1-set node A1-Q and the fourteenth discharging voltage line when turned on. Here, the fourteenth discharging voltage line is supplied with a fourteenth discharging voltage VSS14.

The first A1-inverter A1-INV1 of the nth A1-sub-stage A1-Sub controls the voltage at the first A1-reset node A1-QB1 based on a voltage at the A1-set node A1-Q such that the voltage at the A1-set node A1-Q and the voltage at the first A1-reset node A1-QB1 have opposite logics. In detail, when the voltage at the A1-set node A1-Q is logic high, the first A1-inverter A1-INV1 applies a low voltage VL to the first A1-reset node A1-QB1 to discharge the first A1-reset node A1-QB1. In contrast, when the voltage at the A1-set node A1-Q is logic low, the first A1-inverter A1-INV1 applies a first AC voltage AC1 to the first A1-reset node A1-QB1.

The second A1-inverter A1-INV2 of the nth A1-sub-stage A1-Sub controls the voltage at the second A1-reset node A1-QB2 based on the voltage at the A1-set node A1-Q such that the voltage at the A1-set node A1-Q and the voltage at the second A1-reset node A1-QB2 have opposite logics. In detail, when the voltage at the A1-set node A1-Q is logic high, the second A1-inverter A1-INV2 applies the low voltage VL to the second A1-reset node A1-QB2 to discharge the second A1-reset node A1-QB2. In contrast, when the voltage at the A1-set node A1-Q is logic low, the second A1-inverter A1-INV2 applies a second AC voltage AC2 to the second A1-reset node A1-QB2.

Here, each of the first AC voltage AC 1 and second AC voltage AC2 is an AC signal which alternately has a high voltage VH and the low voltage VL at intervals of f frames (where f is a natural number). The first AC voltage AC1 is 180° phase-inverted with respect to the second AC voltage AC2. In this regard, provided that the first AC voltage AC1 is kept at the high voltage VH for a specific frame period, the second AC voltage AC2 will be kept at the low voltage VL for the same period.

The A1-carry output switching device A1-CRO of the nth A1-sub-stage A1-Sub is controlled by the voltage at the A1-set node A1-Q and is connected between any one A1-clock transfer line and an A1-carry output terminal A1-COT of the nth A1-sub-stage A1-Sub. That is, the A1-carry output switching device A1-CRO is turned on or off in response to the voltage at the A1-set node A1-Q, and interconnects the A1-clock transfer line and the A1-carry output terminal A1-COT when turned on.

The first A1-carry discharge switching device A1-CRD1 of the nth A1-sub-stage A1-Sub is controlled by the voltage at the first A1-reset node A1-QB1 and is connected between the A1-carry output terminal A1-COT and a fifteenth discharging voltage line. That is, the first A1-carry discharge switching device A1-CRD1 is turned on or off in response to the voltage at the first A1-reset node A1-QB1, and interconnects the A1-carry output terminal A1-COT and the fifteenth discharging voltage line when turned on. Here, the fifteenth discharging voltage line is supplied with a fifteenth discharging voltage VSS15.

The second A1-carry discharge switching device A1-CRD2 of the nth A1-sub-stage A1-Sub is controlled by the voltage at the second A1-reset node A1-QB2 and is connected between the A1-carry output terminal A1-COT and the fifteenth discharging voltage line. That is, the second A1-carry discharge switching device A1-CRD2 is turned on or off in response to the voltage at the second A1-reset node A1-QB2, and interconnects the A1-carry output terminal A1-COT and the fifteenth discharging voltage line when turned on.

Figure 39:
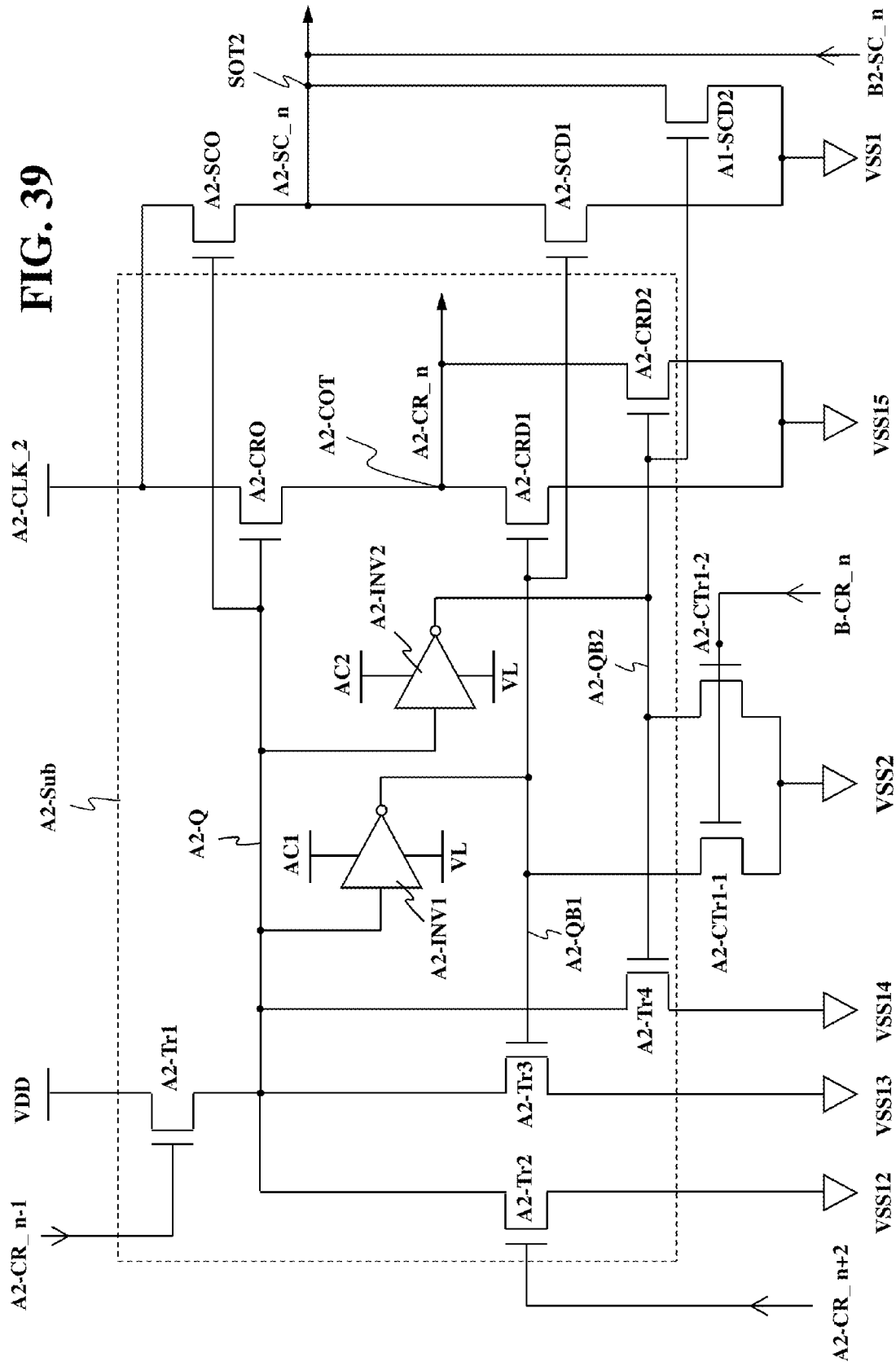
FIG. 39 is a circuit diagram of another embodiment of the A2-sub-stage in the nth stage.

FIG. 39 is a circuit diagram of another embodiment of the A2-sub-stage A2-Sub in the nth stage.

The A2-sub-stage A2-Sub of the nth stage (referred to hereinafter as an nth A2-sub-stage A2-Sub) includes first to fourth A2-switching devices A2-Tr1 to A2-Tr4, a first A2-inverter A2-INV1, a second A2-inverter A2-INV2, an A2-carry output switching device A2-CRO, a first A2-carry discharge switching device A2-CRD1, and a second A2-carry discharge switching device A2-CRD2, as shown in FIG. 39.

The first A2-switching device A2-Tr1 of the nth A2-sub-stage A2-Sub is controlled by an A2-set control signal (for example, an A2-carry pulse A2-CR_n−1 from an (n−1)th A2-sub-stage A2-Sub) and is connected between a charging voltage line and an A2-set node A2-Q. That is, the first A2-switching device A2-Tr1 is turned on or off in response to the A2-carry pulse A2-CR_n−1 from the (n−1)th A2-sub-stage A2-Sub, and interconnects the charging voltage line and the A2-set node A2-Q when turned on. Here, the charging voltage line is supplied with a charging voltage VDD. This charging voltage VDD is a DC voltage having a value capable of turning on corresponding switching devices.

Exceptionally, because there is no stage upstream of the first stage which operates earliest among all stages in one frame period T_F, the A2-sub-stage A2-Sub of the first stage (referred to hereinafter as a first A2-sub-stage A2-Sub) is supplied with an A2-start pulse A2-Vst from a timing controller (not shown). As a result, the first A2-switching device A2-Tr1 of the first A2-sub-stage A2-Sub is supplied with the A2-start pulse A2-Vst instead of an upstream A2-carry pulse.

The second A2-switching device A2-Tr2 of the nth A2-sub-stage A2-Sub is controlled by an A2-reset control signal (for example, an A2-carry pulse A2-CR_n+2 from an (n+2)th A2-sub-stage A2-Sub) and is connected between the A2-set node A2-Q and a twelfth discharging voltage line. That is, the second A2-switching device A2-Tr2 is turned on or off in response to the A2-carry pulse A2-CR_n+2 from the (n+2)th A2-sub-stage A2-Sub, and interconnects the A2-set node A2-Q and the twelfth discharging voltage line when turned on. Here, the twelfth discharging voltage line is supplied with a twelfth discharging voltage VSS12.

The third A2-switching device A2-Tr3 of the nth A2-sub-stage A2-Sub is controlled by a voltage at a first A2-reset node A2-QB1 and is connected between the A2-set node A2-Q and a thirteenth discharging voltage line. That is, the third A2-switching device A2-Tr3 is turned on or off in response to the voltage at the first A2-reset node A2-QB1, and interconnects the A2-set node A2-Q and the thirteenth discharging voltage line when turned on. Here, the thirteenth discharging voltage line is supplied with a thirteenth discharging voltage VSS13.

The fourth A2-switching device A2-Tr4 of the nth A2-sub-stage A2-Sub is controlled by a voltage at a second A2-reset node A2-QB2 and is connected between the A2-set node A2-Q and a fourteenth discharging voltage line. That is, the fourth A2-switching device A2-Tr4 is turned on or off in response to the voltage at the second A2-reset node A2-QB2, and interconnects the A2-set node A2-Q and the fourteenth discharging voltage line when turned on. Here, the fourteenth discharging voltage line is supplied with a fourteenth discharging voltage VSS14.

The first A2-inverter A2-INV1 of the nth A2-sub-stage A2-Sub controls the voltage at the first A2-reset node A2-QB 1 based on a voltage at the A2-set node A2-Q such that the voltage at the A2-set node A2-Q and the voltage at the first A2-reset node A2-QB1 have opposite logics. In detail, when the voltage at the A2-set node A2-Q is logic high, the first A2-inverter A2-INV1 applies a low voltage VL to the first A2-reset node A2-QB1 to discharge the first A2-reset node A2-QB1. In contrast, when the voltage at the A2-set node A2-Q is logic low, the first A2-inverter A2-INV1 applies a first AC voltage AC 1 to the first A2-reset node A2-QB1.

The second A2-inverter A2-INV2 of the nth A2-sub-stage A2-Sub controls the voltage at the second A2-reset node A2-QB2 based on the voltage at the A2-set node A2-Q such that the voltage at the A2-set node A2-Q and the voltage at the second A2-reset node A2-QB2 have opposite logics. In detail, when the voltage at the A2-set node A2-Q is logic high, the second A2-inverter A2-INV2 applies the low voltage VL to the second A2-reset node A2-QB2 to discharge the second A2-reset node A2-QB2. In contrast, when the voltage at the A2-set node A2-Q is logic low, the second A2-inverter A2-INV2 applies a second AC voltage AC2 to the second A2-reset node A2-QB2.

Here, the first AC voltage AC1 and the second AC voltage AC2 are the same as the above.

The A2-carry output switching device A2-CRO of the nth A2-sub-stage A2-Sub is controlled by the voltage at the A2-set node A2-Q and is connected between any one A2-clock transfer line and an A2-carry output terminal A2-COT of the nth A2-sub-stage A2-Sub. That is, the A2-carry output switching device A2-CRO is turned on or off in response to the voltage at the A2-set node A2-Q, and interconnects the A2-clock transfer line and the A2-carry output terminal A2-COT when turned on.

The first A2-carry discharge switching device A2-CRD 1 of the nth A2-sub-stage A2-Sub is controlled by the voltage at the first A2-reset node A2-QB 1 and is connected between the A2-carry output terminal A2-COT and a fifteenth discharging voltage line. That is, the first A2-carry discharge switching device A2-CRD1 is turned on or off in response to the voltage at the first A2-reset node A2-QB1, and interconnects the A2-carry output terminal A2-COT and the fifteenth discharging voltage line when turned on. Here, the fifteenth discharging voltage line is supplied with a fifteenth discharging voltage VSS15.

The second A2-carry discharge switching device A2-CRD2 of the nth A2-sub-stage A2-Sub is controlled by the voltage at the second A2-reset node A2-QB2 and is connected between the A2-carry output terminal A2-COT and the fifteenth discharging voltage line. That is, the second A2-carry discharge switching device A2-CRD2 is turned on or off in response to the voltage at the second A2-reset node A2-QB2, and interconnects the A2-carry output terminal A2-COT and the fifteenth discharging voltage line when turned on.

Figure 40:
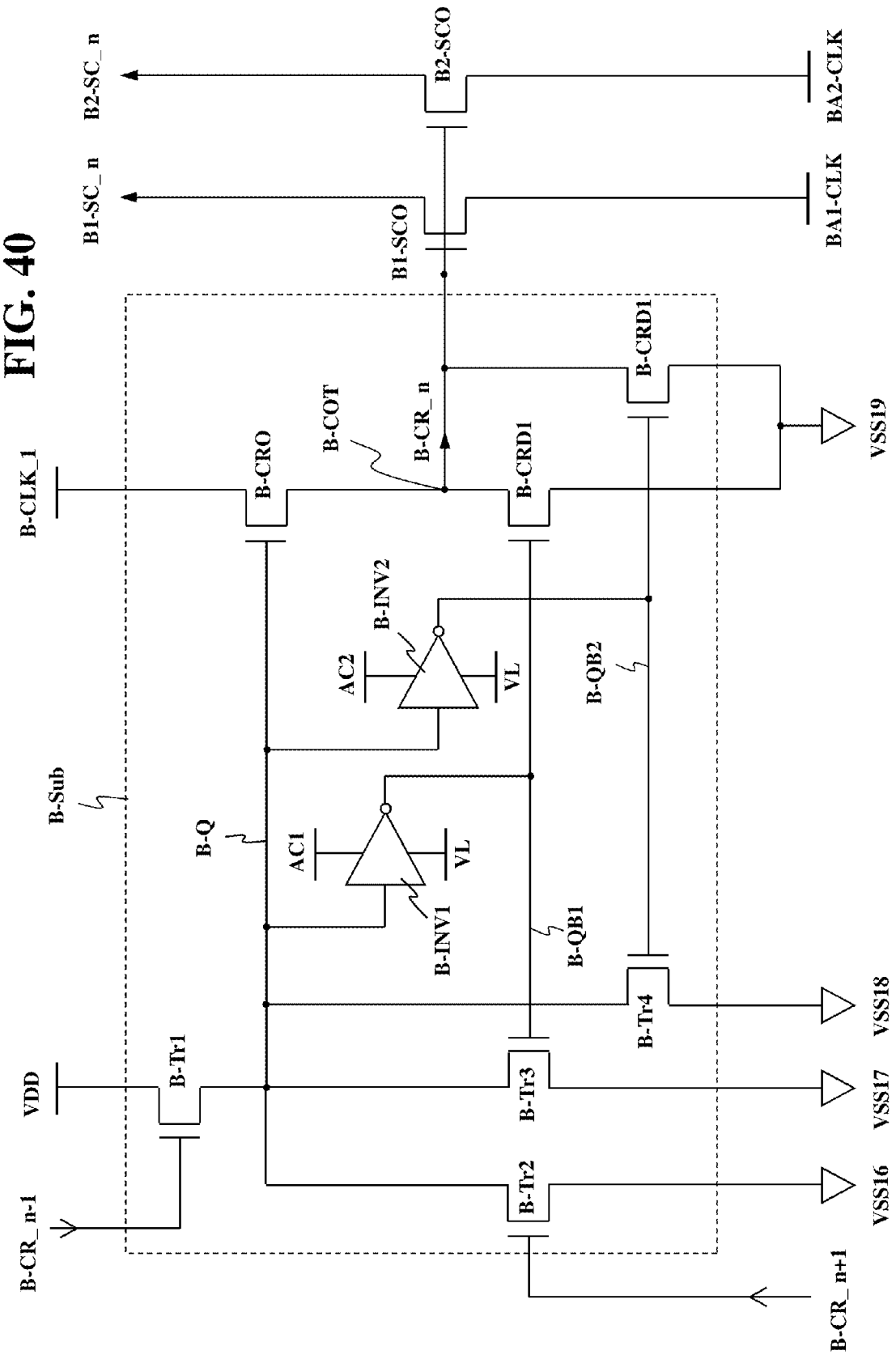
FIG. 40 is a circuit diagram of another embodiment of the B-sub-stage in the nth stage.

FIG. 40 is a circuit diagram of another embodiment of the B-sub-stage in the nth stage.

The B-sub-stage B-Sub of the nth stage (referred to hereinafter as an nth B-sub-stage B-Sub) includes first to fourth B-switching devices B-Tr1 to B-Tr4, a first B-inverter B-INV1, a second B-inverter B-INV2, a B-carry output switching device B-CRO, a first B-carry discharge switching device B-CRD1, and a second B-carry discharge switching device B-CRD2, as shown in FIG. 40.

The first B-switching device B-Tr1 of the nth B-sub-stage B-Sub is controlled by a B-set control signal (for example, a B-carry pulse B-CR_n−1 from an (n−1)th B-sub-stage B-Sub) and is connected between a charging voltage line and a B-set node B-Q. That is, the first B-switching device B-Tr1 is turned on or off in response to the B-carry pulse B-CR_n−1 from the (n−1)th B-sub-stage B-Sub, and interconnects the charging voltage line and the B-set node B-Q when turned on.

Exceptionally, because there is no stage upstream of the first stage (not shown) which operates earliest among all stages in one frame period T_F, the B-sub-stage B-Sub of the first stage (referred to hereinafter as a first B-sub-stage B-Sub) is supplied with a B-start pulse B-Vst from a timing controller (not shown). As a result, the first B-switching device B-Tr1 of the first B-sub-stage B-Sub is supplied with the B-start pulse B-Vst instead of an upstream B-carry pulse B-CR.

The second B-switching device B-Tr2 of the nth B-sub-stage B-Sub is controlled by a B-reset control signal (for example, a B-carry pulse B-CR_n+1 from an (n+1)th B-sub-stage B-Sub) and is connected between the B-set node B-Q and a sixteenth discharging voltage line. That is, the second B-switching device B-Tr2 is turned on or off in response to the B-carry pulse B-CR_n+1 from the (n+1)th B-sub-stage B-Sub, and interconnects the B-set node B-Q and the sixteenth discharging voltage line when turned on. Here, the sixteenth discharging voltage line is supplied with a sixteenth discharging voltage VSS16.

The third B-switching device B-Tr3 of the nth B-sub-stage B-Sub is controlled by a voltage at a first B-reset node B-QB1 and is connected between the B-set node B-Q and a seventeenth discharging voltage line. That is, the third B-switching device B-Tr3 is turned on or off in response to the voltage at the first B-reset node B-QB1, and interconnects the B-set node B-Q and the seventeenth discharging voltage line when turned on. Here, the seventeenth discharging voltage line is supplied with a seventeenth discharging voltage VSS17.

The fourth B-switching device B-Tr4 of the nth B-sub-stage B-Sub is controlled by a voltage at a second B-reset node B-QB2 and is connected between the B-set node B-Q and an eighteenth discharging voltage line. That is, the fourth B-switching device B-Tr4 is turned on or off in response to the voltage at the second B-reset node B-QB2, and interconnects the B-set node B-Q and the eighteenth discharging voltage line when turned on. Here, the eighteenth discharging voltage line is supplied with an eighteenth discharging voltage VSS18.

The first B-inverter B-INV1 of the nth B-sub-stage B-Sub controls the voltage at the first B-reset node B-QB1 based on a voltage at the B-set node B-Q such that the voltage at the B-set node B-Q and the voltage at the first B-reset node B-QB1 have opposite logics. In detail, when the voltage at the B-set node B-Q is logic high, the first B-inverter B-INV1 applies a low voltage VL to the first B-reset node B-QB1 to discharge the first B-reset node B-QB1. In contrast, when the voltage at the B-set node B-Q is logic low, the first B-inverter B-INV1 applies a first AC voltage AC 1 to the first B-reset node B-QB 1.

The second B-inverter B-INV2 of the nth B-sub-stage B-Sub controls the voltage at the second B-reset node B-QB2 based on the voltage at the B-set node B-Q such that the voltage at the B-set node B-Q and the voltage at the second B-reset node B-QB2 have opposite logics. In detail, when the voltage at the B-set node B-Q is logic high, the second B-inverter B-INV2 applies the low voltage VL to the second B-reset node B-QB2 to discharge the second B-reset node B-QB2. In contrast, when the voltage at the B-set node B-Q is logic low, the second B-inverter B-INV2 applies a second AC voltage AC2 to the second B-reset node B-QB2.

The B-carry output switching device B-CRO of the nth B-sub-stage B-Sub is controlled by the voltage at the B-set node B-Q and is connected between any one B-clock transfer line and a B-carry output terminal B-COT of the nth B-sub-stage B-Sub. That is, the B-carry output switching device B-CRO is turned on or off in response to the voltage at the B-set node B-Q, and interconnects the B-clock transfer line and the B-carry output terminal B-COT when turned on.

The first B-carry discharge switching device B-CRD1 of the nth B-sub-stage B-Sub is controlled by the voltage at the first B-reset node B-QB1 and is connected between the B-carry output terminal B-COT and a nineteenth discharging voltage line. That is, the first B-carry discharge switching device B-CRD1 is turned on or off in response to the voltage at the first B-reset node B-QB1, and interconnects the B-carry output terminal B-COT and the nineteenth discharging voltage line when turned on. Here, the nineteenth discharging voltage line is supplied with a nineteenth discharging voltage VSS19.

The second B-carry discharge switching device B-CRD2 of the nth B-sub-stage B-Sub is controlled by the voltage at the second B-reset node B-QB2 and is connected between the B-carry output terminal B-COT and the nineteenth discharging voltage line. That is, the second B-carry discharge switching device B-CRD2 is turned on or off in response to the voltage at the second B-reset node B-QB2, and interconnects the B-carry output terminal B-COT and the nineteenth discharging voltage line when turned on.

On the other hand, provided that each of the A1-sub-stage A1-Sub and A2-sub-stage A2-Sub adopts the structure having the two reset nodes in the above manner, the scan output controller SOC will also need a larger number of switching devices.

That is, the scan output controller SOC includes, as shown in FIGS. 38 and 39, an A1-scan output switching device A1-SCO, a first A1-scan discharge switching device A1-SCD1, a second A1-scan discharge switching device A1-SCD2, a (1-1)th A1-control switching device A1-CTr1-1, a (1-2)th A1-control switching device A1-CTr1-2, an A2-scan output switching device A2-SCO, a first A2-scan discharge switching device A2-SCD1, a second A2-scan discharge switching device A2-SCD2, a (1-1)th A2-control switching device A2-CTr1-1, and a (1-2)th A2-control switching device A2-CTr1-2.

The A1-scan output switching device A1-SCO is controlled by the voltage at the A1-set node A1-Q and is connected between the A1-clock transfer line and the first scan output terminal SOT1. That is, the A1-scan output switching device A1-SCO is turned on or off in response to the voltage at the A1-set node A1-Q, and interconnects the A1-clock transfer line and the first scan output terminal SOT1 when turned on. Here, the A1-clock transfer line is supplied with an A1-clock pulse A1-CLK.

The first A1-scan discharge switching device A1-SCD1 is controlled by the voltage at the first A1-reset node A1-QB1 and is connected between the first scan output terminal SOT1 and a first discharging voltage line. That is, the first A1-scan discharge switching device A1-SCD1 is turned on or off in response to the voltage at the first A1-reset node A1-QB1, and interconnects the first scan output terminal SOT1 and the first discharging voltage line when turned on.

The second A1-scan discharge switching device A1-SCD2 is controlled by the voltage at the second A1-reset node A1-QB2 and is connected between the first scan output terminal SOT1 and the first discharging voltage line. That is, the second A1-scan discharge switching device A1-SCD2 is turned on or off in response to the voltage at the second A1-reset node A1-QB2, and interconnects the first scan output terminal SOT1 and the first discharging voltage line when turned on.

The (1-1)th A1-control switching device A1-CTr1-1 is controlled by the B-carry pulse B-CR_n and is connected between the first A1-reset node A1-QB1 and a second discharging voltage line. That is, the (1-1)th A1-control switching device A1-CTr1-1 is turned on or off in response to the B-carry pulse B-CR_n, and interconnects the first A1-reset node A1-QB1 and the second discharging voltage line when turned on. This (1-1)th A1-control switching device A 1-CTr1-1 acts to make the first A1-reset node A1-QB1 discharged (i.e., low) irrespective of the output of the first A1-inverter A1-INV1.

The (1-2)th A1-control switching device A1-CTr1-2 is controlled by the B-carry pulse B-CR_n and is connected between the second A1-reset node A1-QB2 and the second discharging voltage line. That is, the (1-2)th A1-control switching device A1-CTr1-2 is turned on or off in response to the B-carry pulse B-CR_n, and interconnects the second A1-reset node A1-QB2 and the second discharging voltage line when turned on. This (1-2)th A1-control switching device A1-CTr1-2 acts to make the second A1-reset node A1-QB2 discharged (i.e., low) irrespective of the output of the second A1-inverter A1-INV2.

The A2-scan output switching device A2-SCO is controlled by the voltage at the A2-set node A2-Q and is connected between the A2-clock transfer line and the second scan output terminal SOT2. That is, the A2-scan output switching device A2-SCO is turned on or off in response to the voltage at the A2-set node A2-Q, and interconnects the A2-clock transfer line and the second scan output terminal SOT2 when turned on. Here, the A2-clock transfer line is supplied with an A2-clock pulse A2-CLK.

The first A2-scan discharge switching device A2-SCD1 is controlled by the voltage at the first A2-reset node A2-QB1 and is connected between the second scan output terminal SOT2 and the first discharging voltage line. That is, the first A2-scan discharge switching device A2-SCD1 is turned on or off in response to the voltage at the first A2-reset node A2-QB1, and interconnects the second scan output terminal SOT2 and the first discharging voltage line when turned on.

The second A2-scan discharge switching device A2-SCD2 is controlled by the voltage at the second A2-reset node A2-QB2 and is connected between the second scan output terminal SOT2 and the first discharging voltage line. That is, the second A2-scan discharge switching device A2-SCD2 is turned on or off in response to the voltage at the second A2-reset node A2-QB2, and interconnects the second scan output terminal SOT2 and the first discharging voltage line when turned on.

The (1-1)th A2-control switching device A2-CTr1-1 is controlled by the B-carry pulse B-CR_n and is connected between the first A2-reset node A2-QB1 and the second discharging voltage line. That is, the (1-1)th A2-control switching device A2-CTr1-1 is turned on or off in response to the B-carry pulse B-CR_n, and interconnects the first A2-reset node A2-QB1 and the second discharging voltage line when turned on. This (1-1)th A2-control switching device A2-CTr1-1 acts to make the first A2-reset node A2-QB1 discharged (i.e., low) irrespective of the output of the first A2-inverter A2-INV1.

The (1-2)th A2-control switching device A2-CTr1-2 is controlled by the B-carry pulse B-CR_n and is connected between the second A2-reset node A2-QB2 and the second discharging voltage line. That is, the (1-2)th A2-control switching device A2-CTr1-2 is turned on or off in response to the B-carry pulse B-CR_n, and interconnects the second A2-reset node A2-QB2 and the second discharging voltage line when turned on. This (1-2)th A2-control switching device A2-CTr1-2 acts to make the second A2-reset node A2-QB2 discharged (i.e., low) irrespective of the output of the second A2-inverter A2-INV2.

On the other hand, the BA-clock pulse BA-CLK may be of two or more phases. A description will hereinafter be given of an example when the BA-clock pulse BA-CLK may be of two phases.

Figure 41:
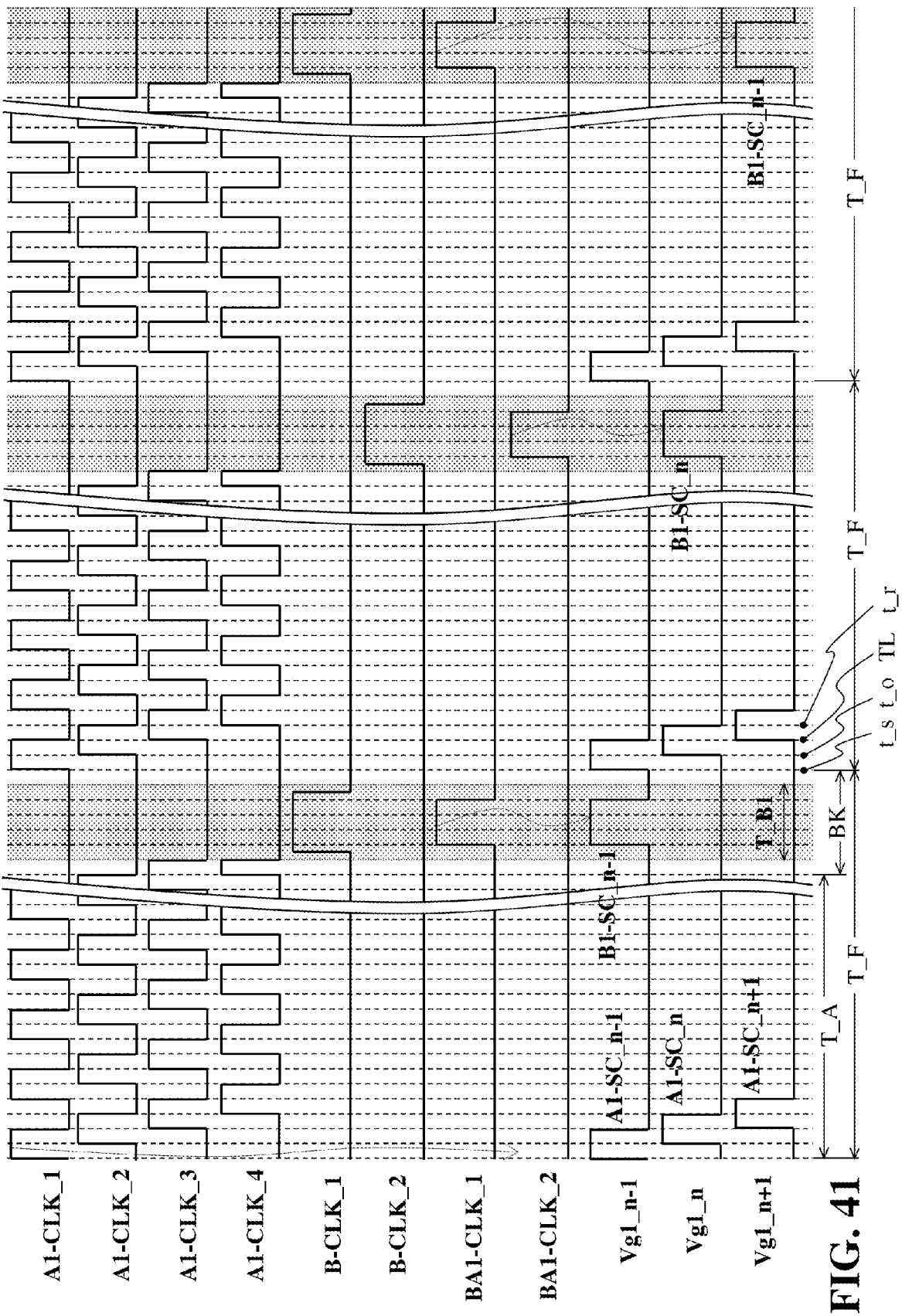
FIG. 41 is a timing diagram when the BA1-clock pulse is of two phases.

FIG. 41 is a timing diagram when the BA1-clock pulse BA1-CLK is of two phases.

As shown in FIG. 41, a first BA1-clock pulse BA1-CLK_1 is selectively output only in an odd-numbered B1-output period T_B1, whereas a second BA1-clock pulse BA1-CLK_2 is selectively output only in an even-numbered B1-output period T_B1.

Hence, the B1-scan pulse B1-SC is generated by the first BA1-clock pulse BA1-CLK_1 in the odd-numbered B1-output period T_B1, and by the second BA1-clock pulse BA1-CLK_2 in the even-numbered B1-output period T_B1.

On the other hand, at least one of the control switching devices provided in the scan output controller SOC may be built in at least one of the A1-sub-stage A1-Sub, A2-sub-stage A2-Sub and B-sub-stage B-Sub of the corresponding stage.

As is apparent from the above description, a shift register according to the present invention has effects as follows.

Firstly, a set node is bootstrapped using clock pulses, not a constant voltage, and a floating structure, so that an A-scan pulse and a B-scan pulse can be stably output even if the clock pulses have relatively low voltages.

Secondly, the stabilization of the output voltages by the bootstrapping makes it possible to prevent the output voltages from being attenuated even if the sizes of scan output switching devices are made to be relatively small. Therefore, the occupied area of a display device is minimized, which is advantageous to reducing the size of the display device.

Thirdly, a B-sub-stage of one stage is shared by a plurality of A-sub-stages of the same stage, so that a plurality of composite pulses can be output from the one stage using only a small number of switching devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages, each of the stages outputting k composite pulses (where k is a natural number greater than 1), each of the composite pulses comprising an A-scan pulse and a B-scan pulse, wherein at least one of the stages comprises:

k A-sub-stages, each of the A-sub-stages controlling a voltage at an A-set node and a voltage at least one A-reset node in response to an external A-control signal and generating an A-carry pulse based on the voltage at the A-set node, the voltage at the at least one A-reset node and any one A-clock pulse;

a B-sub-stage for controlling a voltage at a B-set node and a voltage at at least one B-reset node in response to an external B-control signal and generating a B-carry pulse based on the voltage at the B-set node, the voltage at the at least one B-reset node and any one B-clock pulse; and a scan output controller for generating k A-scan pulses based on the voltages at the respective A-set nodes of the A-sub-stages and the A-clock pulses supplied respectively to the A-sub-stages, generating k B-scan pulses based on the B-carry pulse and k BA-clock pulses, and outputting one of the A-scan pulses and one of the B-scan pulses corresponding to each other as a corresponding one of the composite pulses.

2. The shift register according to claim 1, wherein:

k is 2;

the A-sub-stages are divided into an A1-sub-stage and an A2-sub-stage;

the A-set nodes are divided into an A1-set node connected to the A1-sub-stage and an A2-set node connected to the A2-sub-stage;

the A-reset nodes are divided into at least one A1-reset node connected to the A1-sub-stage and at least one A2-reset node connected to the A2-sub-stage;

the A-clock pulses are divided into a plurality of A1-clock pulses having different phases and a plurality of A2-clock pulses having different phases;

any one of the A1-clock pulses is supplied to the A1-sub-stage and the scan output controller;

any one of the A2-clock pulses is supplied to the A2-sub-stage and the scan output controller;

the BA-clock pulses are divided into a BA1-clock pulse and a BA2-clock pulse;

the A-scan pulses are divided into an A1-scan pulse and an A2-scan pulse;

the B-scan pulses are divided into a B1-scan pulse and a B2-scan pulse;

the A-carry pulses are divided into an A1-carry pulse output through an A1-carry output terminal of the A1-sub-stage and an A2-carry pulse output through an A2-carry output terminal of the A2-sub-stage;

the B-sub-stage outputs the B-carry pulse through a B-carry output terminal;

the scan output controller generates the A1-scan pulse based on a voltage at the A1-set node and the A1-clock pulse, generates the B1-scan pulse based on the B-carry pulse and the BA1-clock pulse, and outputs the A1-scan pulse and the B1-scan pulse as a first one of the composite pulses;

the scan output controller generates the A2-scan pulse based on a voltage at the A2-set node and the A2-clock pulse, generates the B2-scan pulse based on the B-carry pulse and the BA2-clock pulse, and outputs the A2-scan pulse and the B2-scan pulse as a second one of the composite pulses; and the at least one stage outputs the first composite pulse from the scan output controller through a first scan output terminal and outputs the second composite pulse from the scan output controller through a second scan output terminal.

3. The shift register according to claim 2, wherein the scan output controller comprises:

an A1-scan output switching device controlled by the voltage at the A1-set node and connected between an A1-clock transfer line, the A1-clock transfer line transferring the A1-clock pulse, and the first scan output terminal;

a B1-scan output switching device controlled by the B-carry pulse and connected between the first scan output terminal and a BA1-clock transfer line, the BA1-clock transfer line transferring the BA1-clock pulse;

an A2-scan output switching device controlled by the voltage at the A2-set node and connected between an A2-clock transfer line, the A2-clock transfer line transferring the A2-clock pulse, and the second scan output terminal; and a B2-scan output switching device controlled by the B-carry pulse and connected between the second scan output terminal and a BA2-clock transfer line, the BA2-clock transfer line transferring the BA2-clock pulse.

4. The shift register according to claim 3, wherein the scan output controller further comprises:

an A1-scan discharge switching device controlled by a voltage at the A1-reset node and connected between the first scan output terminal and a first discharging voltage line, the first discharging voltage line transferring a first discharging voltage;

a first A1-control switching device controlled by the B-carry pulse and connected between the A1-reset node and a second discharging voltage line, the second discharging voltage line transferring a second discharging voltage;

an A2-scan discharge switching device controlled by a voltage at the A2-reset node and connected between the second scan output terminal and the first discharging voltage line; and a first A2-control switching device controlled by the B-carry pulse and connected between the A2-reset node and the second discharging voltage line.

5. The shift register according to claim 3, wherein the scan output controller further comprises:

an A1-scan discharge switching device controlled by a voltage at the A1-reset node and connected between the first scan output terminal and a first discharging voltage line, the first discharging voltage line transferring a first discharging voltage;

a first A1-control switching device controlled by a voltage at the first scan output terminal and connected between the A1-reset node and a second discharging voltage line, the second discharging voltage line transferring a second discharging voltage;

an A2-scan discharge switching device controlled by a voltage at the A2-reset node and connected between the second scan output terminal and the first discharging voltage line; and a first A2-control switching device controlled by a voltage at the second scan output terminal and connected between the A2-reset node and the second discharging voltage line.

6. The shift register according to claim 3, wherein the scan output controller further comprises a second control switching device controlled by the B-carry pulse output through the B-carry output terminal and connected between the B-carry output terminal and a gate electrode of the B1-scan output switching device.

7. The shift register according to claim 3, wherein the scan output controller further comprises:

a second A1-control switching device controlled by the B-carry pulse and connected between the B-carry output terminal and a gate electrode of the B1-scan output switching device; and a second A2-control switching device controlled by the B-carry pulse and connected between the B-carry output terminal and a gate electrode of the B2-scan output switching device.

8. The shift register according to claim 3, wherein the scan output controller further comprises a third control switching device controlled by an external switching control signal and connected between the B-carry output terminal and a gate electrode of the B1-scan output switching device.

9. The shift register according to claim 8, wherein the switching control signal is any one of a direct current (DC) voltage and an alternating current (AC) voltage.

10. The shift register according to claim 9, wherein the AC voltage is output synchronously with the B-clock pulse and has a pulse width equal to or different from that of the B-clock pulse.

11. The shift register according to claim 3, wherein the scan output controller further comprises:

a third A1-control switching device controlled by an external switching control signal and connected between the B-carry output terminal and a gate electrode of the B1-scan output switching device; and a third A2-control switching device controlled by the switching control signal and connected between the B-carry output terminal and a gate electrode of the B2-scan output switching device.

12. The shift register according to claim 11, wherein the scan output controller further comprises at least one of:

a fourth A1-control switching device controlled by the A1-carry pulse from the A1-sub-stage and connected between the gate electrode of the B1-scan output switching device and a third discharging voltage line, the third discharging voltage line transferring a third discharging voltage;

a fifth A1-control switching device controlled by the voltage at the A1-set node and connected between the gate electrode of the B1-scan output switching device and a fourth discharging voltage line, the fourth discharging voltage line transferring a fourth discharging voltage;

a sixth A1-control switching device controlled by an A1-start pulse and connected between the gate electrode of the B1-scan output switching device and a fifth discharging voltage line, the fifth discharging voltage line transferring a fifth discharging voltage;

a fourth A2-control switching device controlled by the A2-carry pulse from the A2-sub-stage and connected between the gate electrode of the B2-scan output switching device and the third discharging voltage line;

a fifth A2-control switching device controlled by the voltage at the A2-set node and connected between the gate electrode of the B2-scan output switching device and the fourth discharging voltage line;

a sixth A2-control switching device controlled by an A2-start pulse and connected between the gate electrode of the B2-scan output switching device and the fifth discharging voltage line;

a seventh A1-control switching device controlled by the voltage at the B-reset node and connected between the gate electrode of the B1-scan output switching device and a sixth discharging voltage line, the sixth discharging voltage line transferring a sixth discharging voltage; and a seventh A2-control switching device controlled by the voltage at the B-reset node and connected between the gate electrode of the B2-scan output switching device and the sixth discharging voltage line.

13. The shift register according to claim 3, wherein the scan output controller further comprises:

an A1-scan discharge switching device controlled by a voltage at the A1-reset node and connected between the first scan output terminal and a first discharging voltage line, the first discharging voltage line transferring a first discharging voltage;

a first A1-control switching device controlled by the B-carry pulse and connected between the A1-reset node and a second discharging voltage line, the second discharging voltage line transferring a second discharging voltage;

a second A1-control switching device controlled by the B-carry pulse and connected between the B-carry output terminal and a gate electrode of the B1-scan output switching device;

a seventh A1-control switching device controlled by the voltage at the B-reset node and connected between the gate electrode of the B1-scan output switching device and a sixth discharging voltage line, the sixth discharging voltage line transferring a sixth discharging voltage;

an A2-scan discharge switching device controlled by a voltage at the A2-reset node and connected between the second scan output terminal and the first discharging voltage line;

a first A2-control switching device controlled by the B-carry pulse and connected between the A2-reset node and the second discharging voltage line;

a second A2-control switching device controlled by the B-carry pulse and connected between the B-carry output terminal and a gate electrode of the B2-scan output switching device; and a seventh A2-control switching device controlled by the voltage at the B-reset node and connected between the gate electrode of the B2-scan output switching device and the sixth discharging voltage line.

14. The shift register according to claim 3, wherein the scan output controller further comprises:

an A1-scan discharge switching device controlled by a voltage at the A1-reset node and connected between the first scan output terminal and a first discharging voltage line, the first discharging voltage line transferring a first discharging voltage;

a first A1-control switching device controlled by a voltage applied to a gate electrode of the B1-scan output switching device and connected between the A1-reset node and a second discharging voltage line, the second discharging voltage line transferring a second discharging voltage;

a third A1-control switching device controlled by an external switching control signal and connected between the B-carry output terminal and the gate electrode of the B1-scan output switching device;

a seventh A1-control switching device controlled by the voltage at the B-reset node and connected between the gate electrode of the B1-scan output switching device and a sixth discharging voltage line, the sixth discharging voltage line transferring a sixth discharging voltage;

an A2-scan discharge switching device controlled by a voltage at the A2-reset node and connected between the second scan output terminal and the first discharging voltage line;

a first A2-control switching device controlled by the voltage applied to the gate electrode of the B1-scan output switching device and connected between the A2-reset node and the second discharging voltage line;

a third A2-control switching device controlled by the switching control signal and connected between the gate electrode of the B1-scan output switching device and a gate electrode of the B2-scan output switching device; and a seventh A2-control switching device controlled by the voltage at the B-reset node and connected between the gate electrode of the B2-scan output switching device and the sixth discharging voltage line.

15. The shift register according to claim 3, wherein the scan output controller further comprises at least one of:

an eighth A1-control switching device controlled by the B-carry pulse and connected between the A1-set node and a seventh discharging voltage line, the seventh discharging voltage line transferring a seventh discharging voltage;

an eighth A2-control switching device controlled by the B-carry pulse and connected between the A2-set node and the seventh discharging voltage line; and a ninth control switching device controlled by any one of the A1-carry pulse and the A2-carry pulse and connected between the B-carry output terminal of the B-sub-stage and the seventh discharging voltage line.

16. The shift register according to claim 2, wherein:
the A1-clock pulse is of two or more phases;
the A2-clock pulse is of two or more phases;
the B-clock pulse is of two or more phases;
the BA1-clock pulse is of one or more phases; and
the BA2-clock pulse is of one or more phases,
wherein the B-clock pulse has a period longer than that of each of the A1-clock pulse and A2-clock pulse,
wherein the A1-clock pulse, the A2-clock pulse, the B-clock pulse, the BA1-clock pulse and the BA2-clock pulse have the same pulse widths or at least two of the A1-clock pulse, the A2-clock pulse, the B-clock pulse, the BA1-clock pulse and the BA2-clock pulse have different pulse widths.

17. The shift register according to claim 16, wherein the A1-clock pulse and the A2-clock pulse are kept low while the B-clock pulse is kept high.

18. The shift register according to claim 2, wherein the A-control signal comprises an A1-set control signal, an A1-reset control signal, an A2-set control signal and an A2-reset control signal,
wherein the A1-sub-stage of the at least one stage comprises:
a first A1-switching device controlled by the A1-set control signal and connected between a charging voltage line, the charging voltage line transferring a charging voltage, and the A1-set node;
a second A1-switching device controlled by the A1-reset control signal and connected between the A1-set node and an eighth discharging voltage line, the eighth discharging voltage line transferring an eighth discharging voltage;
an A1-inverter for controlling a voltage at the A1-reset node based on the voltage at the A1-set node such that the voltage at the A1-set node and the voltage at the A1-reset node have opposite logics;
an A1-carry output switching device controlled by the voltage at the A1-set node and connected between an A1-clock transfer line, the A1-clock transfer line transferring the A1-clock pulse, and the A1-carry output terminal; and
an A1-carry discharge switching device controlled by the voltage at the A1-reset node and connected between the A1-carry output terminal and a ninth discharging voltage line, the ninth discharging voltage line transferring a ninth discharging voltage.

19. The shift register according to claim 18, wherein the A1-inverter comprises:
a first A1-inverting switching device controlled by a high voltage from a high voltage line and connected between the high voltage line and the A1-reset node; and
a second A1-inverting switching device controlled by the voltage at the A1-set node and connected between the A1-reset node and a low voltage line, the low voltage line transferring a low voltage.

20. The shift register according to claim 18, wherein the A1-inverter comprises:
a first A1-inverting switching device controlled by an external control signal and connected between a high voltage line, the high voltage line transferring a high voltage, and the A1-reset node; and
a second A1-inverting switching device controlled by the voltage at the A1-set node and connected between the A1-reset node and a low voltage line, the low voltage line transferring a low voltage.

21. The shift register according to claim 18, wherein the A1-inverter comprises:
a first A1-inverting switching device controlled by an external control signal and connected between a high voltage line, the high voltage line transferring a high voltage, and an A1-common node;
a second A1-inverting switching device controlled by the voltage at the A1-set node and connected between the A1-common node and a low voltage line, the low voltage line transferring a low voltage;
a third A1-inverting switching device controlled by a voltage at the A1-common node and connected between the high voltage line and the A1-reset node; and
a fourth A1-inverting switching device controlled by the voltage at the A1-set node and connected between the A1-reset node and the low voltage line.

22. The shift register according to claim 18, wherein the A1-inverter comprises:
a first A1-inverting switching device controlled by a high voltage from a high voltage line and connected between the high voltage line and an A1-common node;
a second A1-inverting switching device controlled by the voltage at the A1-set node and connected between the A1-common node and a low voltage line, the low voltage line transferring a low voltage;
a third A1-inverting switching device controlled by a voltage at the A1-common node and connected between the high voltage line and the A1-reset node; and
a fourth A1-inverting switching device controlled by the voltage at the A1-set node and connected between the A1-reset node and the low voltage line.

23. The shift register according to claim 18, wherein the A1-inverter comprises:
a first A1-inverting switching device controlled by the voltage at the A1-set node and connected between the A1-reset node and a low voltage line, the low voltage line transferring a low voltage;
a second A1-inverting switching device controlled by the voltage at the A1-reset node and connected between the A1-set node and the first scan output terminal or between the A1-set node and the A1-carry output terminal; and
an A1-capacitor connected between the A1-clock transfer line and the A1-reset node.

24. The shift register according to claim 23, wherein the A1-inverter further comprises at least one of:
a fifth A1-inverting switching device controlled by the A1-set control signal and connected between the A1-reset node and the low voltage line;
a sixth A1-inverting switching device controlled by the voltage at the A1-reset node and connected between the A1-set node and the low voltage line; and
a seventh A1-inverting switching device controlled by the A1-clock pulse from the A1-clock transfer line and connected between an output terminal, the output terminal outputting the A1-set control signal, and the A1-set node.

25. The shift register according to claim 21, wherein the A1-inverter further comprises an eighth A1-inverting switching device controlled by the B-carry pulse or a voltage applied to a gate electrode of a B1-scan output switching device of the scan output controller and connected between the A1-common node and the low voltage line.

26. The shift register according to claim 18, wherein:
the A1-set control signal is an A1-start pulse, or an A1-carry pulse output from any one of stages operating earlier than the at least one stage, among the plurality of stages; and
the A1-reset control signal is an A1-carry pulse output from any one of stages operating later than the at least one stage, among the plurality of stages.

27. The shift register according to claim 2, wherein the A-control signal comprises an A1-set control signal, an A1-reset control signal, an A2-set control signal and an A2-reset control signal,
wherein the A2-sub-stage of the at least one stage comprises:
a first A2-switching device controlled by the A2-set control signal and connected between a charging voltage line, the charging voltage line transferring a charging voltage, and the A2-set node;
a second A2-switching device controlled by the A2-reset control signal and connected between the A2-set node and an eighth discharging voltage line, the eighth discharging voltage line transferring an eighth discharging voltage;
an A2-inverter for controlling a voltage at the A2-reset node based on the voltage at the A2-set node such that the voltage at the A2-set node and the voltage at the A2-reset node have opposite logics;
an A2-carry output switching device controlled by the voltage at the A2-set node and connected between an A2-clock transfer line, the A2-clock transfer line transferring the A2-clock pulse, and the A2-carry output terminal; and
an A2-carry discharge switching device controlled by the voltage at the A2-reset node and connected between the A2-carry output terminal and a ninth discharging voltage line, the ninth discharging voltage line transferring a ninth discharging voltage.

28. The shift register according to claim 27, wherein:
the A2-set control signal is an A2-start pulse, or an A2-carry pulse output from any one of stages operating earlier than the at least one stage, among the plurality of stages; and
the A2-reset control signal is an A2-carry pulse output from any one of stages operating later than the at least one stage, among the plurality of stages.

29. The shift register according to claim 2, wherein the B-control signal comprises a B-set control signal and a B-reset control signal,
wherein the B-sub-stage of the at least one stage comprises:
a first B-switching device controlled by the B-set control signal and connected between a charging voltage line, the charging voltage line transferring a charging voltage, and the B-set node;
a second B-switching device controlled by the B-reset control signal and connected between the B-set node and a tenth discharging voltage line, the tenth discharging voltage line transferring a tenth discharging voltage;
a B-inverter for controlling the voltage at the B-reset node based on the voltage at the B-set node such that the voltage at the B-set node and the voltage at the B-reset node have opposite logics;
a B-carry output switching device controlled by the voltage at the B-set node and connected between a B-clock transfer line, the B-clock transfer line transferring the B-clock pulse, and the B-carry output terminal; and
a B-carry discharge switching device controlled by the voltage at the B-reset node and connected between the B-carry output terminal and an eleventh discharging voltage line, the eleventh discharging voltage line transferring an eleventh discharging voltage.

30. The shift register according to claim 29, wherein the B-sub-stage further comprises a third B-switching device controlled by the voltage at the B-set node and connected between a control transfer line, the control transfer line transferring an external switching control signal, and the B-set node.

31. The shift register according to claim 29, wherein:
the B-set control signal is a B-start pulse, or a B-carry pulse output from any one of stages operating earlier than the at least one stage, among the plurality of stages; and
the B-reset control signal is a B-carry pulse output from any one of stages operating later than the at least one stage, among the plurality of stages.

32. The shift register according to claim 2, wherein:
the at least one A1-reset node comprises a first A1-reset node and a second A1-reset node; and
the A-control signal comprises an A1-set control signal, an A1-reset control signal, an A2-set control signal and an A2-reset control signal,
wherein the A1-sub-stage of the at least one stage comprises:
a first A1-switching device controlled by the A1-set control signal and connected between a charging voltage line, the charging voltage line transferring a charging voltage, and the A1-set node;
a second A1-switching device controlled by the A1-reset control signal and connected between the A1-set node and a twelfth discharging voltage line, the twelfth discharging voltage line transferring a twelfth discharging voltage;
a third A1-switching device controlled by a voltage at the first A1-reset node and connected between the A1-set node and a thirteenth discharging voltage line, the thirteenth discharging voltage line transferring a thirteenth discharging voltage;
a fourth A1-switching device controlled by a voltage at the second A1-reset node and connected between the A1-set node and a fourteenth discharging voltage line, the fourteenth discharging voltage line transferring a fourteenth discharging voltage;
a first A1-inverter for controlling the voltage at the first A1-reset node based on the voltage at the A1-set node such that the voltage at the A1-set node and the voltage at the first A1-reset node have opposite logics;
a second A1-inverter for controlling the voltage at the second A1-reset node based on the voltage at the A1-set node such that the voltage at the A1-set node and the voltage at the second A1-reset node have opposite logics;
an A1-carry output switching device controlled by the voltage at the A1-set node and connected between an A1-clock transfer line, the A1-clock transfer line transferring the A1-clock pulse, and the A1-carry output terminal;
a first A1-carry discharge switching device controlled by the voltage at the first A1-reset node and connected between the A1-carry output terminal and a fifteenth discharging voltage line, the fifteenth discharging voltage line transferring a fifteenth discharging voltage; and
a second A1-carry discharge switching device controlled by the voltage at the second A1-reset node and connected between the A1-carry output terminal and the fifteenth sixteenth discharging voltage line.

33. The shift register according to claim 2, wherein:
the at least one A2-reset node comprises a first A2-reset node and a second A2-reset node; and
the A-control signal comprises an A1-set control signal, an A1-reset control signal, an A2-set control signal and an A2-reset control signal,
wherein the A2-sub-stage of the at least one stage comprises:
a first A2-switching device controlled by the A2-set control signal and connected between a charging voltage line, the charging voltage line transferring a charging voltage, and the A2-set node;
a second A2-switching device controlled by the A2-reset control signal and connected between the A2-set node and a twelfth discharging voltage line, the twelfth discharging voltage line transferring a twelfth discharging voltage;
a third A2-switching device controlled by a voltage at the first A2-reset node and connected between the A2-set node and a thirteenth discharging voltage line, the thirteenth discharging voltage line transferring a thirteenth discharging voltage;
a fourth A2-switching device controlled by a voltage at the second A2-reset node and connected between the A2-set node and a fourteenth discharging voltage line, the fourteenth discharging voltage line transferring a fourteenth discharging voltage;
a first A2-inverter for controlling the voltage at the first A2-reset node based on the voltage at the A2-set node such that the voltage at the A2-set node and the voltage at the first A2-reset node have opposite logics;
a second A2-inverter for controlling the voltage at the second A2-reset node based on the voltage at the A2-set node such that the voltage at the A2-set node and the voltage at the second A2-reset node have opposite logics;
an A2-carry output switching device controlled by the voltage at the A2-set node and connected between an A2-clock transfer line, the A2-clock transfer line transferring the A2-clock pulse, and the A2-carry output terminal;
a first A2-carry discharge switching device controlled by the voltage at the first A2-reset node and connected between the A2-carry output terminal and a fifteenth discharging voltage line, the fifteenth discharging voltage line transferring a fifteenth discharging voltage; and
a second A2-carry discharge switching device controlled by the voltage at the second A2-reset node and connected between the A2-carry output terminal and the fifteenth sixteenth discharging voltage line.

34. The shift register according to claim 2, wherein:
the at least one B-reset node comprises a first B-reset node and a second B-reset node; and
the B-control signal comprises a B-set control signal and a B-reset control signal,
wherein the B-sub-stage of the at least one stage comprises:
a first B-switching device controlled by the B-set control signal and connected between a charging voltage line, the charging voltage line transferring a charging voltage, and the B-set node;
a second B-switching device controlled by the B-reset control signal and connected between the B-set node and a sixteenth discharging voltage line, the sixteenth discharging voltage line transferring a sixteenth discharging voltage;
a third B-switching device controlled by a voltage at the first B-reset node and connected between the B-set node and a seventeenth discharging voltage line, the seventeenth discharging voltage line transferring a seventeenth discharging voltage;
a fourth B-switching device controlled by a voltage at the second B-reset node and connected between the B-set node and an eighteenth discharging voltage line, the eighteenth discharging voltage line transferring an eighteenth discharging voltage;
a first B-inverter for controlling the voltage at the first B-reset node based on the voltage at the B-set node such that the voltage at the B-set node and the voltage at the first B-reset node have opposite logics;
a second B-inverter for controlling the voltage at the second B-reset node based on the voltage at the B-set node such that the voltage at the B-set node and the voltage at the second B-reset node have opposite logics;
a B-carry output switching device controlled by the voltage at the B-set node and connected between a B-clock transfer line, the B-clock transfer line transferring the B-clock pulse, and the B-carry output terminal;
a first B-carry discharge switching device controlled by the voltage at the first B-reset node and connected between the B-carry output terminal and a nineteenth discharging voltage line, the nineteenth discharging voltage line transferring a nineteenth discharging voltage; and
a second B-carry discharge switching device controlled by the voltage at the second B-reset node and connected between the B-carry output terminal and the nineteenth discharging voltage.

35. The shift register according to claim 3, wherein the scan output controller further comprises:
a tenth A1-control switching device controlled by the B-carry pulse and connected between the A1-set node and a twenties discharging voltage line, the twenties discharging voltage line transferring a twenties discharging voltage; and
a tenth A2-control switching device controlled by the B-carry pulse and connected between the A2-set node and the twenties discharging voltage line.

36. The shift register according to claim 3, wherein the scan output controller further comprises:
a first B-control switching device controlled by the B-carry pulse and connected between the B-carry output terminal and a gate electrode of the B1-scan output switching device; and
a second B-control switching device controlled by the voltage at the B-reset node and connected between the gate electrode of the B1-scan output switching device and an eleventh discharging voltage line, the eleventh discharging voltage line transferring an eleventh discharging voltage.

37. The shift register according to claim 36, wherein the scan output controller further comprises at least one of:
a third B-control switching device controlled by an external first signal and connected between the gate electrode of the B1-scan output switching device and a twenty-first discharging voltage line, the twenty-first discharging voltage line transferring a twenty-first discharging voltage;
a fourth B-control switching device controlled by an external second signal and connected between the gate electrode of the B1-scan output switching device and a twenty-second discharging voltage line, the twenty-second discharging voltage line transferring a twenty-second discharging voltage; and
a fifth B-control switching device controlled by an external third signal and connected between the gate electrode of the B1-scan output switching device and a twenty-third discharging voltage line, the twenty-third discharging voltage line transferring a twenty-third discharging voltage.

38. The shift register according to claim 37, wherein:
the first signal is any one of the A1-carry pulse and the voltage at the A1-set node;
the second signal is any one of the A2-carry pulse and the voltage at the A2-set node; and
the third signal is any one of an A1-start pulse and an A2-start pulse.

39. The shift register according to claim 3, wherein the scan output controller further comprises:
a first B 1-control switching device controlled by the B-carry pulse and connected between the B-carry output terminal and a gate electrode of the B1-scan output switching device;
a second B1-control switching device controlled by the voltage at the B-reset node and connected between the gate electrode of the B1-scan output switching device and an eleventh discharging voltage line, the eleventh discharging voltage line transferring an eleventh discharging voltage;
a first B2-control switching device controlled by the B-carry pulse and connected between the B-carry output terminal and a gate electrode of the B2-scan output switching device; and
a second B2-control switching device controlled by the voltage at the B-reset node and connected between the gate electrode of the B2-scan output switching device and the eleventh discharging voltage line.

40. The shift register according to claim 39, wherein the scan output controller further comprises at least one of:
a third B1-control switching device controlled by an external first signal and connected between the gate electrode of the B1-scan output switching device and a twenty-first discharging voltage line, the twenty-first discharging voltage line transferring a twenty-first discharging voltage; and
a fourth B1-control switching device controlled by an external second signal and connected between the gate electrode of the B1-scan output switching device and a twenty-second discharging voltage line, the twenty-second discharging voltage line transferring a twenty-second discharging voltage.

41. The shift register according to claim 40, wherein:
the first signal is any one of the A1-carry pulse and the voltage at the A1-set node; and
the second signal is an A1-start pulse.

42. The shift register according to claim 40, wherein the scan output controller further comprises at least one of:
a third B2-control switching device controlled by an external third signal and connected between the gate electrode of the B2-scan output switching device and the twenty-first discharging voltage line; and
a fourth B2-control switching device controlled by an external fourth signal and connected between the gate electrode of the B2-scan output switching device and the twenty-second discharging voltage line.

43. The shift register according to claim 42, wherein:
the third signal is any one of the A2-carry pulse and the voltage at the A2-set node; and
the fourth signal is an A2-start pulse.

44. The shift register according to claim 3, wherein the scan output controller further comprises:
a first B 1-control switching device controlled by the B-carry pulse and connected between the B-carry output terminal and a gate electrode of the B1-scan output switching device;
a second B1-control switching device controlled by the voltage at the B-reset node and connected between the gate electrode of the B1-scan output switching device and an eleventh discharging voltage line, the eleventh discharging voltage line transferring an eleventh discharging voltage;
a first B2-control switching device controlled by a voltage applied to the gate electrode of the B1-scan output switching device and connected between the gate electrode of the B1-scan output switching device and a gate electrode of the B2-scan output switching device; and
a second B2-control switching device controlled by the voltage at the B-reset node and connected between the gate electrode of the B2-scan output switching device and the eleventh discharging voltage line.

45. The shift register according to claim 44, wherein the scan output controller further comprises at least one of:
a third B1-control switching device controlled by an external first signal and connected between the gate electrode of the B1-scan output switching device and a twenty-first discharging voltage line, the twenty-first discharging voltage line transferring a twenty-first discharging voltage; and
a fourth B1-control switching device controlled by an external second signal and connected between the gate electrode of the B1-scan output switching device and a twenty-second discharging voltage line, the twenty-second discharging voltage line transferring a twenty-second discharging voltage.

46. The shift register according to claim 40, wherein:
the first signal is any one of the A1-carry pulse and the voltage at the A1-set node; and
the second signal is any one of an A1-start pulse and an A2-start pulse.

47. The shift register according to claim 45, wherein the scan output controller further comprises at least one of:
a third B2-control switching device controlled by an external third signal and connected between the gate electrode of the B2-scan output switching device and the twenty-first discharging voltage line; and
a fourth B2-control switching device controlled by an external fourth signal and connected between the gate electrode of the B2-scan output switching device and the twenty-second discharging voltage line.

48. The shift register according to claim 42, wherein:
the third signal is any one of the A2-carry pulse and an A2-set control signal; and
the fourth signal is any one of an A1-start pulse and an A2-start pulse.

49. The shift register according to claim 3, wherein the scan output controller further comprises:
a first B-control switching device controlled by an external switching control signal and connected between the B-carry output terminal and a gate electrode of the B1-scan output switching device; and
a second B-control switching device controlled by the voltage at the B-reset node and connected between the gate electrode of the B1-scan output switching device and an eleventh discharging voltage line, the eleventh discharging voltage line transferring an eleventh discharging voltage.

50. The shift register according to claim 49, wherein the scan output controller further comprises at least one of:
a third B-control switching device controlled by an external first signal and connected between the gate electrode of the B1-scan output switching device and a twenty-first discharging voltage line, the twenty-first discharging voltage line transferring a twenty-first discharging voltage;
a fourth B-control switching device controlled by an external second signal and connected between the gate electrode of the B1-scan output switching device and a twenty-second discharging voltage line, the twenty-second discharging voltage line transferring a twenty-second discharging voltage; and
a fifth B-control switching device controlled by an external third signal and connected between the gate electrode of the B1-scan output switching device and a twenty-third discharging voltage line, the twenty-third discharging voltage line transferring a twenty-third discharging voltage.

51. The shift register according to claim 50, wherein:
the first signal is any one of the A1-carry pulse and the voltage at the A1-set node;
the second signal is any one of the A2-carry pulse and the voltage at the A2-set node; and
the third signal is any one of an A1-start pulse and an A2-start pulse.

52. The shift register according to claim 3, wherein the scan output controller further comprises:
a first B1-control switching device controlled by an external switching control signal and connected between the B-carry output terminal and a gate electrode of the B1-scan output switching device;
a second B1-control switching device controlled by the voltage at the B-reset node and connected between the gate electrode of the B1-scan output switching device and an eleventh discharging voltage line, the eleventh discharging voltage line transferring an eleventh discharging voltage;
a first B2-control switching device controlled by the switching control signal and connected between the B-carry output terminal and a gate electrode of the B2-scan output switching device; and
a second B2-control switching device controlled by the voltage at the B-reset node and connected between the gate electrode of the B2-scan output switching device and the eleventh discharging voltage line.

53. The shift register according to claim 52, wherein the scan output controller further comprises at least one of:
a third B1-control switching device controlled by an external first signal and connected between the gate electrode of the B1-scan output switching device and a twenty-first discharging voltage line, the twenty-first discharging voltage line transferring a twenty-first discharging voltage; and
a fourth B1-control switching device controlled by an external second signal and connected between the gate electrode of the B1-scan output switching device and a twenty-second discharging voltage line, the twenty-second discharging voltage line transferring a twenty-second discharging voltage.

54. The shift register according to claim 53, wherein:
the first signal is any one of the A1-carry pulse and the voltage at the A1-set node; and
the second signal is any one of an A1-start pulse and an A2-start pulse.

55. The shift register according to claim 53, wherein the scan output controller further comprises at least one of:
a third B2-control switching device controlled by an external third signal and connected between the gate electrode of the B2-scan output switching device and the twenty-first discharging voltage line; and
a fourth B2-control switching device controlled by an external fourth signal and connected between the gate electrode of the B2-scan output switching device and the twenty-second discharging voltage line.

56. The shift register according to claim 55, wherein:
the third signal is any one of the A2-carry pulse and an A2-set control signal; and
the fourth signal is any one of an A1-start pulse and an A2-start pulse.

57. The shift register according to claim 26, wherein:
the A2-set control signal is an A2-start pulse, or an A2-carry pulse output from any one of stages operating earlier than the at least one stage, among the plurality of stages;
the A2-reset control signal is an A2-carry pulse output from any one of stages operating later than the at least one stage, among the plurality of stages; and
the A1-start pulse and the A2-start pulse are the same.

* * * * *